United States Patent
Wang et al.

(10) Patent No.: US 12,322,355 B1
(45) Date of Patent: Jun. 3, 2025

(54) DISPLAY PANEL, DISPLAY PANEL DRIVING METHOD AND DISPLAY DEVICE

(71) Applicant: Xiamen Tianma Microelectronics Co., Ltd., Xiamen (CN)

(72) Inventors: Zhijie Wang, Xiamen (CN); Yahui Xie, Xiamen (CN)

(73) Assignee: XIAMEN TIANMA MICROELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 18/888,194

(22) Filed: Sep. 18, 2024

(30) Foreign Application Priority Data

Jun. 27, 2024 (CN) .......................... 202410851393.0

(51) Int. Cl.
  *G09G 3/36* (2006.01)
  *G06F 3/01* (2006.01)
  *G09G 3/32* (2016.01)
  *G11C 19/28* (2006.01)
  *G09G 3/20* (2006.01)

(52) U.S. Cl.
  CPC .......... *G09G 3/3677* (2013.01); *G06F 3/017* (2013.01); *G09G 3/32* (2013.01); *G11C 19/287* (2013.01); *G09G 3/2007* (2013.01); *G09G 2300/0842* (2013.01); *G09G 2310/0267* (2013.01); *G09G 2310/0286* (2013.01); *G09G 2310/08* (2013.01); *G09G 2330/021* (2013.01); *G09G 2340/0435* (2013.01); *G09G 2354/00* (2013.01)

(58) Field of Classification Search
  CPC ...... G09G 3/3677; G09G 3/32; G09G 3/2007; G09G 2300/0842; G09G 2310/0267; G09G 2310/0286; G09G 2310/08; G09G 2330/021; G09G 2340/0435; G09G 2354/00; G06F 3/017; G11C 19/287
  See application file for complete search history.

(56) References Cited

U.S. PATENT DOCUMENTS

| | | |
|---|---|---|
| 12,205,540 B2 * | 1/2025 | Lu .......... G09G 3/3266 |
| 12,272,291 B1 * | 4/2025 | Zhang .......... G09G 3/2092 |
| 2022/0189359 A1 * | 6/2022 | Cai .......... G11C 19/28 |

FOREIGN PATENT DOCUMENTS

| CN | 116363981 A | 6/2023 |
|---|---|---|
| CN | 116597780 A | 8/2023 |

* cited by examiner

*Primary Examiner* — Pegeman Karimi
(74) *Attorney, Agent, or Firm* — East IP P.C.

(57) ABSTRACT

The present application discloses a display panel, a display panel driving method and a display device, where the display panel includes: a driving circuit; the driving circuit includes a plurality of shift register units; the shift register unit includes a driving control module, a stage transmission module and a scanning module; the driving control module includes a starting input end, a scanning control end, a first node and a second node; the stage transmission module includes a first input end, a second input end, a first level end, a stage transmission clock end and a stage transmission output end; the first input end is electrically connected to the first node, and the second input end is electrically connected to the second node.

33 Claims, 29 Drawing Sheets

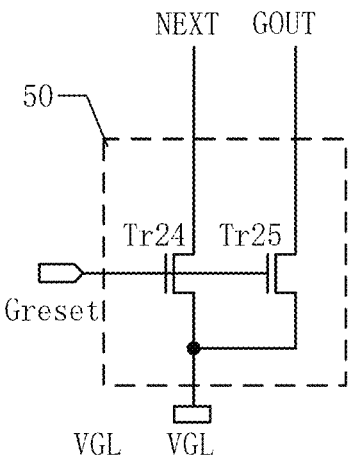

FIG. 26

| in a refresh phase, the stage transmission output ends and the scanning output ends of part of the shift register units are controlled to output valid pulses | ~ S1001 |

| in a holding phase, the stage transmission output ends of part of the shift register units are controlled to output valid pulses, and the scanning output ends of the part of the shift register units are controlled to output inactive levels | ~ S1002 |

FIG. 27

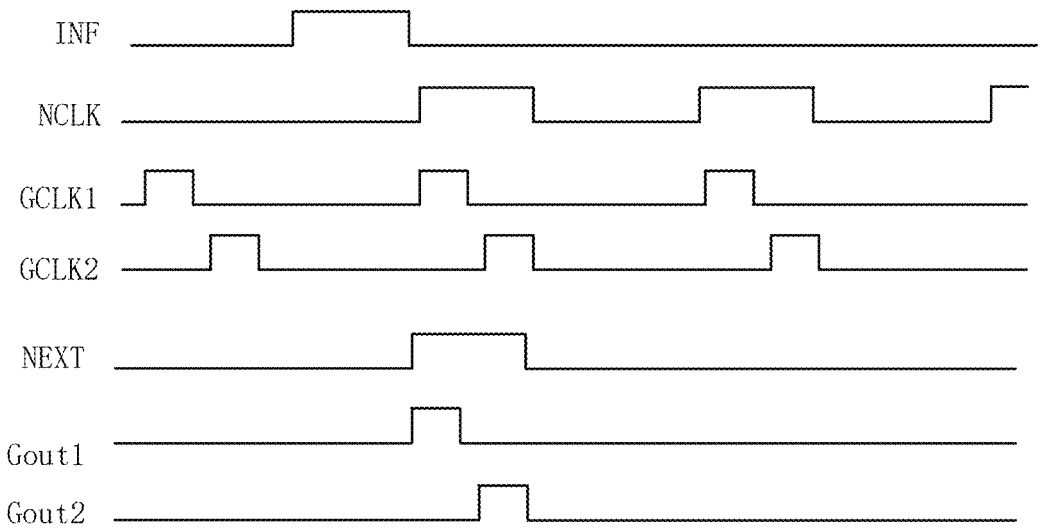

FIG. 33

```
┌─────────────────────────────────────────────────┐
│ in the refresh phase, the stage transmission output ends │
│ and the scanning output ends of part of the shift register │ ~ S4001
│ units are controlled to output valid pulses      │
└─────────────────────────────────────────────────┘
                        ↓
┌─────────────────────────────────────────────────┐
│ in the holding phase, the stage transmission output ends │
│ of part of the shift register units are controlled to output │
│ valid pulses, and the scanning output ends of part of the │ ~ S4002
│ shift register units are controlled to be at inactive levels │
└─────────────────────────────────────────────────┘
                        ↓
┌─────────────────────────────────────────────────┐
│ in a phase between the refresh phase and the holding │
│ phase, the second global control signals are controlled to │ ~ S4003
│ jump to active levels                            │
└─────────────────────────────────────────────────┘
```

FIG. 34

DISPLAY PANEL, DISPLAY PANEL DRIVING METHOD AND DISPLAY DEVICE

CROSS-REFERENCE TO RELATED APPLICATIONS

This application claims priority to Chinese Patent Application No. 202410851393.0, titled "DISPLAY PANEL, DISPLAY PANEL DRIVING METHOD AND DISPLAY DEVICE" and filed on Jun. 27, 2024, which is hereby incorporated by reference in its entirety.

TECHNICAL FIELD

The present application relates to the field of display technology, and in particular to a display panel, a display panel driving method, and a display device.

BACKGROUND

With the development of display technology, the application scenarios of display panels are increasing, and users' display requirements for display panels are becoming more and more diverse.

Some display areas of the display panel need to be displayed at a high frequency to ensure the smoothness of the image, such as the short video display area in the short video application. Some display areas can meet the display requirements by using a low frequency display, such as the static comment area, menu area or black border. Some display areas are expected to use the low frequency display to reduce power consumption.

At present, the refresh frequencies of all display areas in the display panel are the same, which cannot meet the display requirements of different frequencies in different areas with refreshment of display panel.

SUMMARY

The present application provides a display panel, a display panel driving method and a display device, so that the display panel has a display function of different frequencies in different areas with refreshment, which can reduce power consumption.

According to one aspect of the present application, there is provided a display panel, including: a driving circuit; the driving circuit comprises a plurality of cascaded shift register units;

the shift register unit comprises a driving control module, at least one stage transmission module and at least one scanning module;

the driving control module comprises at least a starting input end, a scanning control end, a first node and a second node;

the stage transmission module comprises a first input end, a second input end, a first level end, a stage transmission clock end and a stage transmission output end; the first input end is electrically connected to the first node, the second input end is electrically connected to the second node; the first level end is electrically connected to the first fixed potential end; where the stage transmission output end of the shift register unit at an i-th stage is electrically connected to the starting input end of the shift register unit at a j-th stage, i≠j, and i and j are both positive integers;

the scanning module comprises a third input end, a fourth input end, a second level end, a scanning clock end and a scanning output end; the third input end is electrically connected to the first node; the second level end is electrically connected to the first fixed potential end.

According to another aspect of the present application, there is provided a method for driving a display panel, which is used to drive the display panel described above;

the display panel includes a multi-frequency driving mode; at least a part of display frames of the multi-frequency driving mode are a first display frame; the first display frame includes a refresh phase and a holding phase;

The driving method includes:

in the refresh phase, controlling the stage transmission output ends and the scanning output ends of part of the shift register units to output valid pulses;

in the holding phase, controlling the stage transmission output ends of part of the shift register units to output valid pulses, and the scanning output ends to be at inactive levels.

According to another aspect of the present application, there is provided a display device, including the display panel described above.

In the technical solution of the present application, by disposing a scanning module in the shift register unit, so that the shift register unit can output a scanning signal for controlling pixel refresh. In continuous display frames, when the data signals to be written to the pixels in some areas are continuously the same or similar, the scanning modules of part of the shift register units can also stop outputting the valid pulses of the scanning signals, reducing the refresh frequencies of the pixels in some areas, thereby reducing the power consumption of the display panel; in addition, by disposing a stage transmission module in the shift register unit, the shift register unit can output a stage transmission signal for shifting the starting input signal. When the scanning modules of part of the shift register units stops outputting the valid pulses of the scanning signals, it can ensure that the starting input signals of the part of the shift register units can continue to be shifted, so that the shift register units at the subsequent stages can still be driven to output the valid pulses of the scanning signals, and other areas can still be refreshed at a higher frequency. While reducing the refresh frequencies of the pixels in some areas, it can also meet the higher requirements of the refresh frequencies for smooth display in some areas, thereby reducing the power consumption of the display panel under the premise of ensuring display quality.

It should be understood that the contents described in this section are not intended to identify the key or important features of the embodiments of the present application, nor are they intended to limit the scope of the present application. Other features of the present application will become readily understood through the following description.

BRIEF DESCRIPTION OF THE DRAWINGS

In order to more clearly illustrate the technical solutions in the embodiments of the present application, the drawings need to be used in the description of the embodiments will be introduced briefly below, apparently, the drawings described below are only some embodiments of the present application. For those skilled in the art, other drawings can be obtained based on these drawings without creative work.

FIG. 26 is a schematic structural diagram of a global reset unit provided in an embodiment of the present application;

FIG. 27 is a flowchart of a method for driving a display panel provided in an embodiment of the present application;

FIG. 33 is a timing sequence diagram of a shift register unit in a refresh phase provided in an embodiment of the present application;

FIG. 34 is a flowchart of another method for driving the display panel provided in an embodiment of the present application.

DETAILED DESCRIPTION

Figure 1:
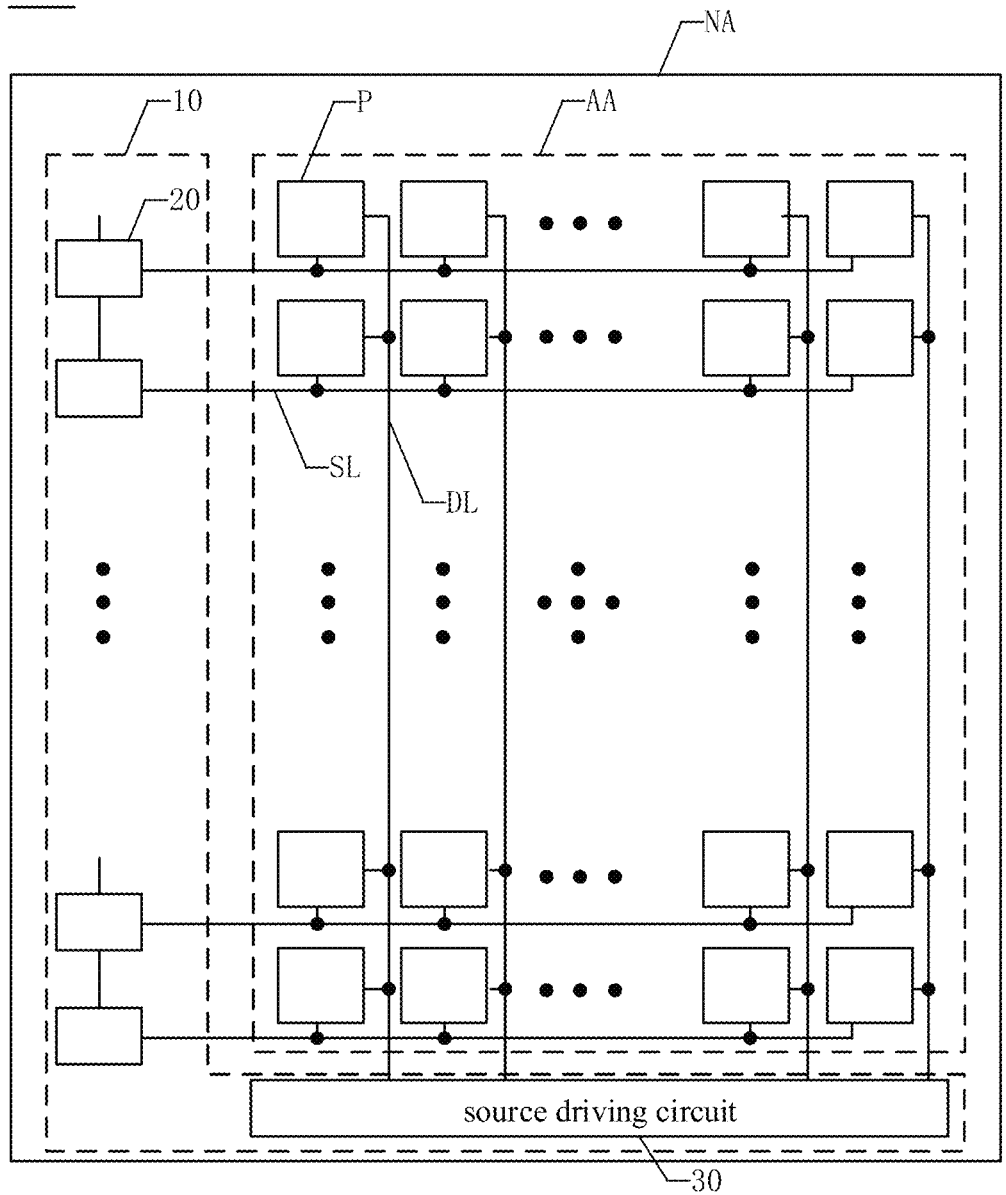
FIG. 1 is a schematic structural diagram of a top view of a display panel provided in an embodiment of the present application.

In order to enable those skilled in the art to better understand the scheme of the present application, the technical scheme in the embodiments of the present application will be described clearly and completely in conjunction with the drawings in the embodiments of the present application. Apparently, the described embodiments are only part of embodiments in the present application, rather than all embodiments. Based on the embodiments in the present application, all other embodiments obtained by those skilled in the art without creative work should fall within the scope of protection of the present application.

It should be noted that the terms "first", "second", etc. in the specification and claims and the above drawings of the present application are used to distinguish similar objects, and are not necessarily used to describe a specific order or sequence. It should be understood that the data used in this way are interchangeable where appropriate, so that the embodiments of the present application described here can be implemented in an order other than those illustrated or described here. In addition, the terms "including" and "having" and any variations thereof are intended to cover non-exclusive inclusions. For example, a process, method, system, product or device that includes a series of steps or units is not necessarily limited to those steps or units explicitly listed, but may include other steps or units that are not explicitly listed or inherent to these processes, methods, products or devices.

As described in the background art, the driving circuit of the display panel can control all pixels to refresh or stop refreshing. During the refresh time of a frame image, the refresh frequencies of all areas of the display panel are consistent. If the refresh frequency of the display panel is reduced, although the power consumption is reduced, it cannot meet the requirement of smooth video display. If in order to meet the requirement of smooth video display, it is necessary to increase the refresh frequencies of all areas of the display panel, which is not conducive to the low power consumption of the display panel.

To solve the above-mentioned technical problems, an embodiment of the present application provides a display panel, comprising: a driving circuit; the driving circuit comprises a plurality of cascaded shift register units; the shift register unit comprises a driving control module, at least one stage transmission module and at least one scanning module; the driving control module comprises at least a starting input end, a scanning control end, a first node and a second node; the stage transmission module comprises a first input end, a second input end, a first level end, a stage transmission clock end and a stage transmission output end; the first input end is electrically connected to the first node, the second input end is electrically connected to the second node; the first level end is electrically connected to the first fixed potential end; where the stage transmission output end of the shift register unit at an i-th stage is electrically connected to the starting input end of the shift register unit at a j-th stage, i≠j, and i and j are both positive integers; the scanning module comprises a third input end, a fourth input end, a second level end, a scanning clock end and a scanning output end; the third input end is electrically connected to the first node; the second level end is electrically connected to the first fixed potential end.

The above-mentioned technical solution is adopted, by disposing a scanning module in the shift register unit, so that the shift register unit can output a scanning signal for controlling pixel refresh. In continuous display frames, when the data signals to be written to the pixels in some areas are continuously the same or similar, the scanning modules of part of the shift register units can also stop outputting the valid pulses of the scanning signals, reducing the refresh frequencies of the pixels in some areas, thereby reducing the power consumption of the display panel; in addition, by disposing a stage transmission module in the shift register unit, the shift register unit can output a stage transmission signal for shifting the starting input signal. When the scanning modules of part of the shift register units stops outputting the valid pulses of the scanning signals, it can ensure that the starting input signals of the part of the shift register units can continue to be shifted, so that the shift register units at the subsequent stages can still be driven to output the valid pulses of the scanning signals, and other areas can still be refreshed at a higher frequency. While reducing the refresh frequencies of the pixels in some areas, it can also meet the higher requirements of the refresh frequencies for smooth display in some areas, thereby reducing the power consumption of the display panel under the premise of ensuring display quality.

The above is the core idea of the present application. Based on the embodiments of the present application, all other embodiments obtained by those skilled in the art without creative work are within the scope of protection of the present application. The technical solutions in the embodiments of the present application will be clearly and completely described below in conjunction with the drawings in the embodiments of the present application.

FIG. 1 is a schematic structural diagram of a top view of a display panel provided by an embodiment of the present application. Referring to FIG. 1, the display panel 001 includes a driving circuit 10, a plurality of scanning lines SL, a plurality of data lines DL, and a plurality of pixels P located in a display area AA. At least part of the pixels P located in the same row may be electrically connected to the same scanning line SL, and at least part of the pixels P located in the same column may be electrically connected to the same data line DL.

The driving circuit 10 includes a plurality of cascaded shift register units 20. The shift register unit 20 at a first stage can receive a first starting signal as a starting input signal. Starting from a second stage, the starting input signal of the shift register unit 20 at each of the stages comes from the shift register unit 20 at one stage in front, but is not limited to the shift register unit 20 at one stage in front. The scanning signals output by the shift register units 20 at the respective stages may be shifted in sequence. The shift register unit 20 is electrically connected to at least one scanning line SL to provide a scanning signal for the scanning line SL. Exemplarily, when the scanning signal transmitted on the scanning line SL is at an active level, the switch devices in a row of pixels P electrically connected to the scanning line SL can be controlled to be turned on, so that the row of pixels P electrically connected to the scanning line SL can receive the data signal transmitted on the data line DL and display the corresponding grayscale according to the data signal, so as to achieve the refresh of the pixels P electrically connected to the scanning line SL.

In an optional embodiment, the driving circuit 10 also includes a source driving circuit 30, and the source driving circuit 30 in the driving circuit 10 is electrically connected to the plurality of data lines DL to provide data signals to the data lines DL. Exemplarily, at the pixel refresh time of a row of pixels P, the source driving circuit 30 can provide a plurality of data signals to the plurality of data lines DL, so that the row of pixels P can display the corresponding grayscale according to the data signals provided by the source driving circuit 30. At the pixel refresh time of the next row of pixels P, the source driving circuit 30 can re-provide a plurality of data signals to the plurality of data lines DL, so that the next row of pixels P can display the corresponding grayscale according to the data signals re-provided by the source driving circuit 30.

It should be noted that FIG. 1 only exemplarily shows that the driving circuit 10 is located in the non-display area NA outside the display area AA. In other feasible embodiments, the driving circuit 10 may also be located in the display area AA. In addition, the figure only exemplarily shows that the shift register unit 20 is located on a left side and a lower side of the display area AA. In other feasible embodiments, the driving circuit 10 may also be located on other sides of the display area AA, or simultaneously on one side, three sides, four sides, etc. of the display area AA. The embodiments of the present application does not limit the position of the driving circuit 10.

Figure 2:
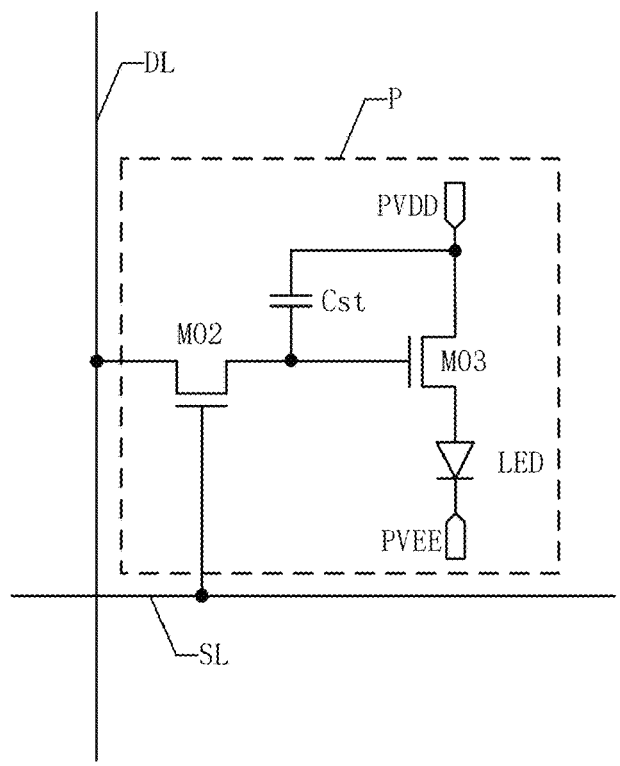
FIG. 2 is a schematic structural diagram of a circuit of a pixel provided in an embodiment of the present application.
Figure 3:
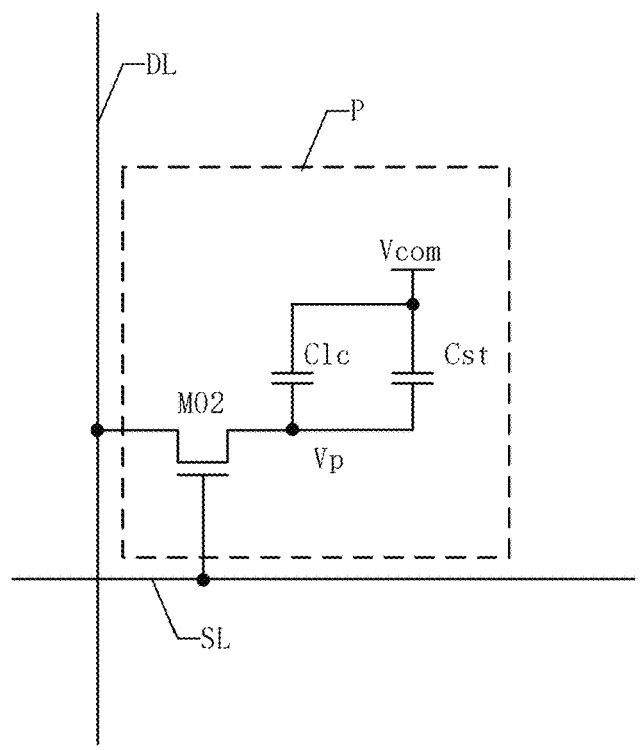
FIG. 3 is a schematic structural diagram of a circuit of another pixel provided in an embodiment of the present application.

FIG. 2 is a schematic structural diagram of a circuit of a pixel provided by an embodiment of the present application, and FIG. 3 is a schematic structural diagram of a circuit of another pixel provided by an embodiment of the present application. If the display panel 001 is an LED display when working, the pixel P may include a writing transistor M02, a driving transistor M03, a storage capacitor Cst and a light-emitting element LED. At this time, the pixel P receive a scanning signal from a scanning line SL, a data signal from a data line DL, a first power signal PVDD and a second power signal PVEE. As shown in FIG. 2, the writing transistor M02 can write the data signal on the data line DL into the gate of the driving transistor M03 under the control of the scanning signal on the scanning line SL. The driving transistor M03 provides a corresponding driving current to the light-emitting element LED according to the data signal, so as to drive the light-emitting element LED to display light, so that the pixel P display a corresponding grayscale; if the display panel 001 is a liquid crystal display when working, the pixel P may include a writing transistor M02, a liquid crystal capacitor Clc, a storage capacitor Cst, a pixel electrode Vp and a common electrode Vcom. At this time, the pixel P receives a scanning signal from the scanning line SL, a data signal from the data line DL and a common electrode signal. As shown in FIG. 3, the writing transistor M02 can write the data signal to the pixel electrode Vp under the control of the scanning signal, and the liquid crystal capacitor Clc can store the data signal on the pixel electrode Vp. An electric field is formed between the pixel electrode Vp and the common electrode Vcom, which can control the rotation of the liquid crystal molecules (not shown in the figure) to adjust the light flux, so that the pixel P displays the corresponding grayscale.

It should be noted that FIG. 2 and FIG. 3 are only schematic structural diagrams of the circuit of the pixel P. In other feasible implementations, the pixel P may also include other devices; the embodiments of the present application does not specifically limit the type of display panel and the specific structure of the pixel P.

Figure 4:
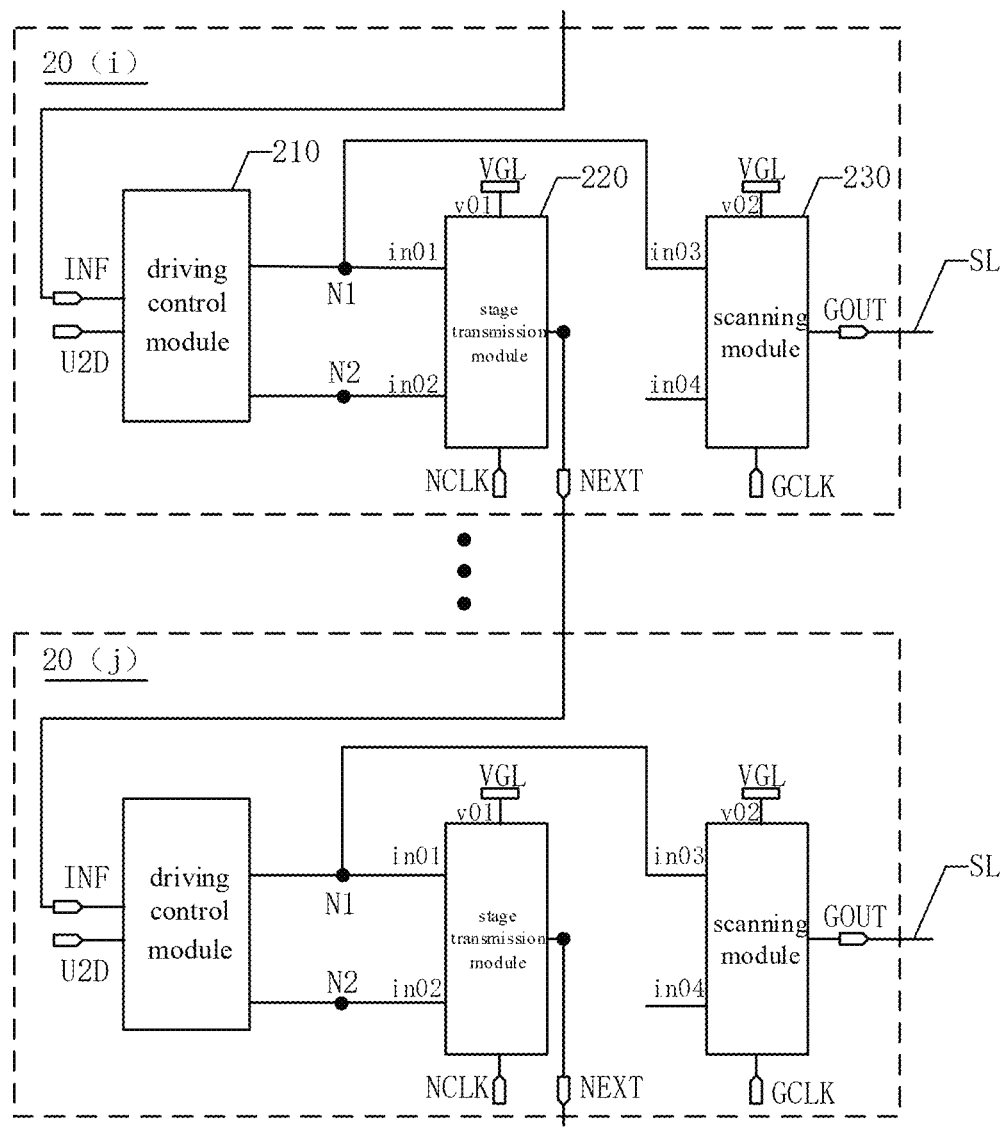
FIG. 4 is a schematic structural diagram of a shift register unit provided in an embodiment of the present application.

FIG. 4 is a schematic structural diagram of a shift register unit provided by an embodiment of the present application. Referring to FIG. 4, the shift register unit includes a driving control module 210, at least one stage transmission module 220 and at least one scanning module 230. The driving control module 210 includes at least a starting input end INF, a scanning control end U2D, a first node N1 and a second node N2. The stage transmission module 220 includes a first input end in01, a second input end in02, a first level end v01, a stage transmission clock end NCLK and a stage transmission output end NEXT. The first input end in01 is electrically connected to the first node N1, the second input end in02 is electrically connected to the second node N2, and the first level end v01 is electrically connected to the first fixed potential end VGL, where the stage transmission output end NEXT of the shift register unit 20 ($i$) at an i-th stage is electrically connected to the starting input end of the shift register unit 20 ($j$) at a j-th stage, i≠j, and i and j are both positive integers. The scanning module 230 includes a third input end in03, a fourth input end in04, a second level end v02, a scanning clock end GCLK and a scanning output end GOUT. The third input end in03 is electrically connected to the first node N1; the second level end v02 is electrically connected to the first fixed potential end VGL.

Specifically, the starting input end INF and the scanning control end U2D of the driving control module 210 can receive the starting input signal and the scanning control signal respectively, and the driving control module 210 can control the signal of the first node N1 and the signal of the second node N2 according to the starting input signal and the scanning control signal. The first input end in01, the second input end in02, the first level end v01, and the stage transmission clock end NCLK of the stage transmission module 220 can receive the signal of the first node N1, the signal of the second node N2, the first fixed potential signal, and the stage transmission clock signal respectively. The stage transmission module 220 can control the stage transmission signal of the stage transmission output end NEXT according to the signal of the first node N1, the signal of the second node N2, the first fixed potential signal, and the stage transmission clock signal. The third input end in03, the second level end v02, and the scanning clock end GCLK of the scanning module 230 receive the signal of the first node N1, the first fixed potential signal, and the scanning clock signal respectively. The scanning module 230 can control the scanning signal of the scanning output end GOUT according to the signal of the first node N1, the signal of the fourth input end in04, the first fixed potential signal, and the scanning clock signal, where the scanning output end GOUT is electrically connected to the scanning line SL.

Exemplarily, the stage transmission module 220 and the scanning module 230 can receive different signals, and/or the stage transmission module 220 and the scanning module 230 can have different structures, so that the stage transmission signal output by the stage transmission output end NEXT of the stage transmission module 220 can be different from the scanning signal output by the scanning output end GOUT of the scanning module 230.

Figure 5:
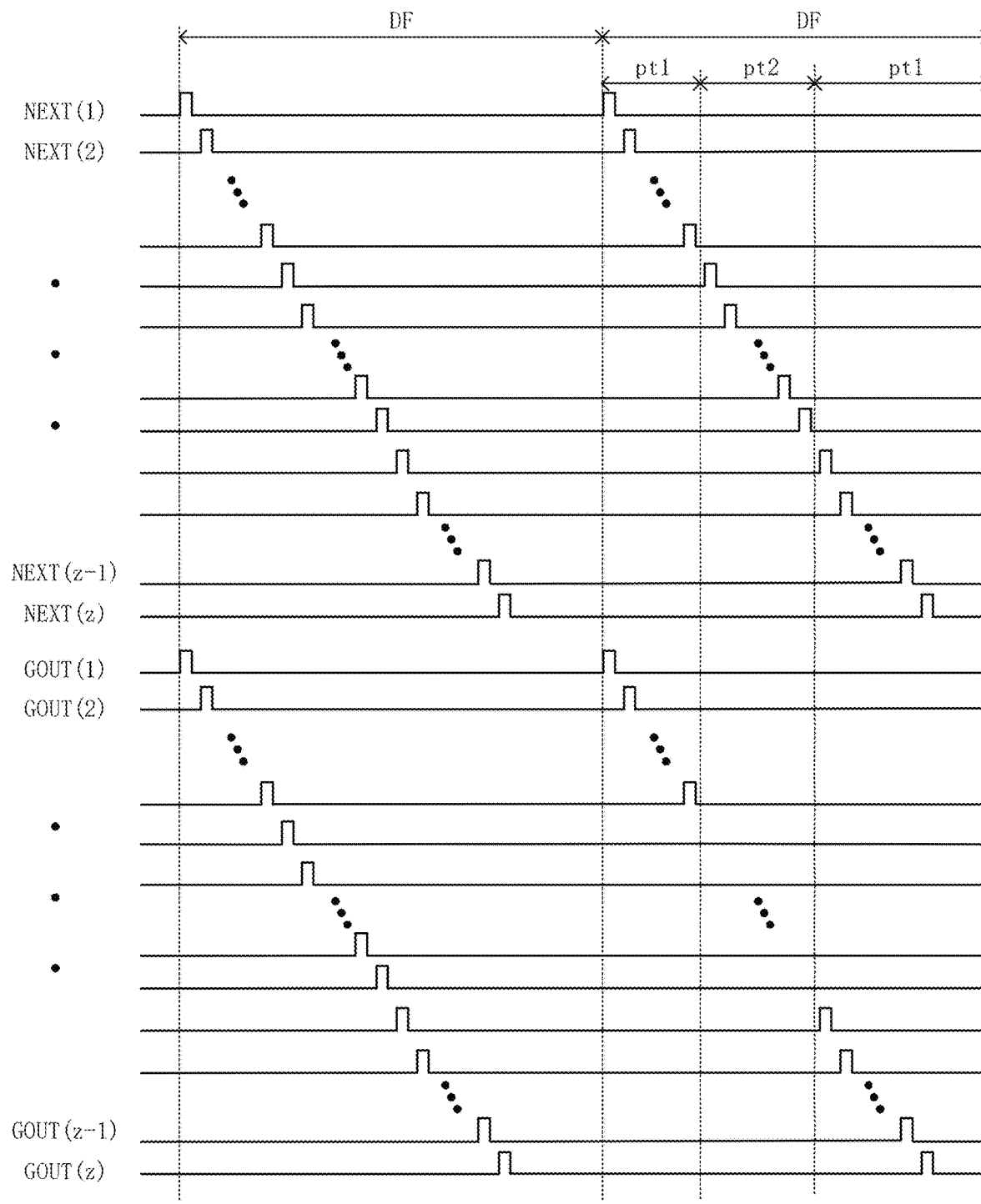
FIG. 5 is a timing sequence diagram of a driving circuit provided in an embodiment of the present application.

Taking an example that the active level of the stage transmission signal and the active level of the scanning signal are both high levels, and the driving circuit includes z cascaded shift register units 20, FIG. 5 is a timing sequence diagram of a driving circuit provided by an embodiment of the present application. Referring to FIG. 4 and FIG. 5, the display panel 001 includes a multi-frequency driving mode, and in the partial refresh time of at least part of the display frames DF in the multi-frequency driving mode, the potentials of the stage transmission signal output by the stage transmission output end NEXT and the scanning signal output by the scanning output end GOUT in the same one of shift register units 20 may be different. In a refresh time of a display frame DF, the stage transmission output end NEXT of each shift register unit 20 can output a valid pulse of the stage transmission signal, and the valid pulses of the stage transmission signals output by the shift register units 20 at the respective stages are shifted in sequence. In a first phase pt1 of part of display frames DF, the stage transmission output ends NEXT and the scanning output ends GOUT of part of the shift register units 20 can output valid pulses, and the valid pulses of the stage transmission signals and the valid pulses of the scanning signals are shifted in sequence, so that the pixels P of part of the display area AA can be refreshed in sequence by row, and the part of the display area AA can be refreshed at a higher frequency; in a second phase pt2 of part of display frames DF, the stage transmission output ends NEXT of part of the shift register units 20 can output valid pulses, but the scanning output ends GOUT of the part of the shift register units 20 stop outputting the valid pulses of the scanning signals, so that pixels P of the part of the display area AA stop refreshing, and the part of the display area AA can be refreshed at a lower frequency, thereby realizing different frequencies in different areas with refreshment of the display panel 001.

During the refresh time of a display frame DF, except for the shift register unit 20 at a last stage, the stage transmission module 220 of shift register unit 20 at each of the stages can output the valid pulse of the stage transmission signal as the starting input signal of the shift register unit 20 at the next stage, and can realize the sequential shifting of the valid pulse of the starting input signal, that is, realize the sequential driving of shift register units 20 at the respective stages. By arranging the stage transmission modules 220 in the shift register units 20, in the multi-frequency driving mode, in the second phase pt2 of a display frame DF, when the scanning modules 230 of part of the shift register units 20 stop outputting the valid pulses of the scanning signals, the stage transmission modules 220 enable the part of the shift register units 20 to achieve the sequential shifting of the starting input signals; thus, in the first phase pt1 after the second phase pt2 of a display frame DF, the shift register units 20 at subsequent stages can still receive the shifted starting input signals in sequence, that is, the shift register units 20 at the subsequent stages can still be driven in sequence, so that the shift register units 20 at the subsequent stages can output the valid pulses of the scanning signals in sequence, thereby realizing different frequencies in different areas with refreshment of the display panel 001.

In the embodiments of the present application, a scanning module is provided in the shift register unit so that the shift register unit can output a scanning signal for controlling pixel refresh. In continuous display frames, when the data signals to be written to the pixels in some areas are continuously the same or similar, the scanning modules of part of the shift register units can also stop outputting the valid pulses of the scanning signals, so as to reduce the refresh frequencies of the pixels in some areas, thereby reducing the power consumption of the display panel; in addition, a stage transmission module is provided in the shift register unit so that the shift register unit can output a stage transmission signal for shifting the starting input signal. When the scanning modules of part of shift register units stops outputting the valid pulses of the scanning signals, it can ensure that the starting input signals of the part of the shift register units can continue to be shifted, so that the shift register units at the subsequent stages can still be driven to output the valid pulses of the scanning signals, and other areas can still be refreshed at a higher frequency. While reducing the refresh frequencies of the pixels in some areas, it can also meet the higher requirements of the refresh frequencies for smooth display in some areas, thereby reducing the power consumption of the display panel under the premise of ensuring display quality.

Optionally, in the same one of shift register units, the stage transmission clock end and the scanning clock end are not connected.

Specifically, in the same one of shift register units, the stage transmission clock signal received by the stage transmission clock end and the scanning clock signal received by the scanning clock end may be different, so that in the same one of shift register units, the stage transmission signal output by the stage transmission output end and the scanning signal output by the scanning output end may be different.

Figure 6:
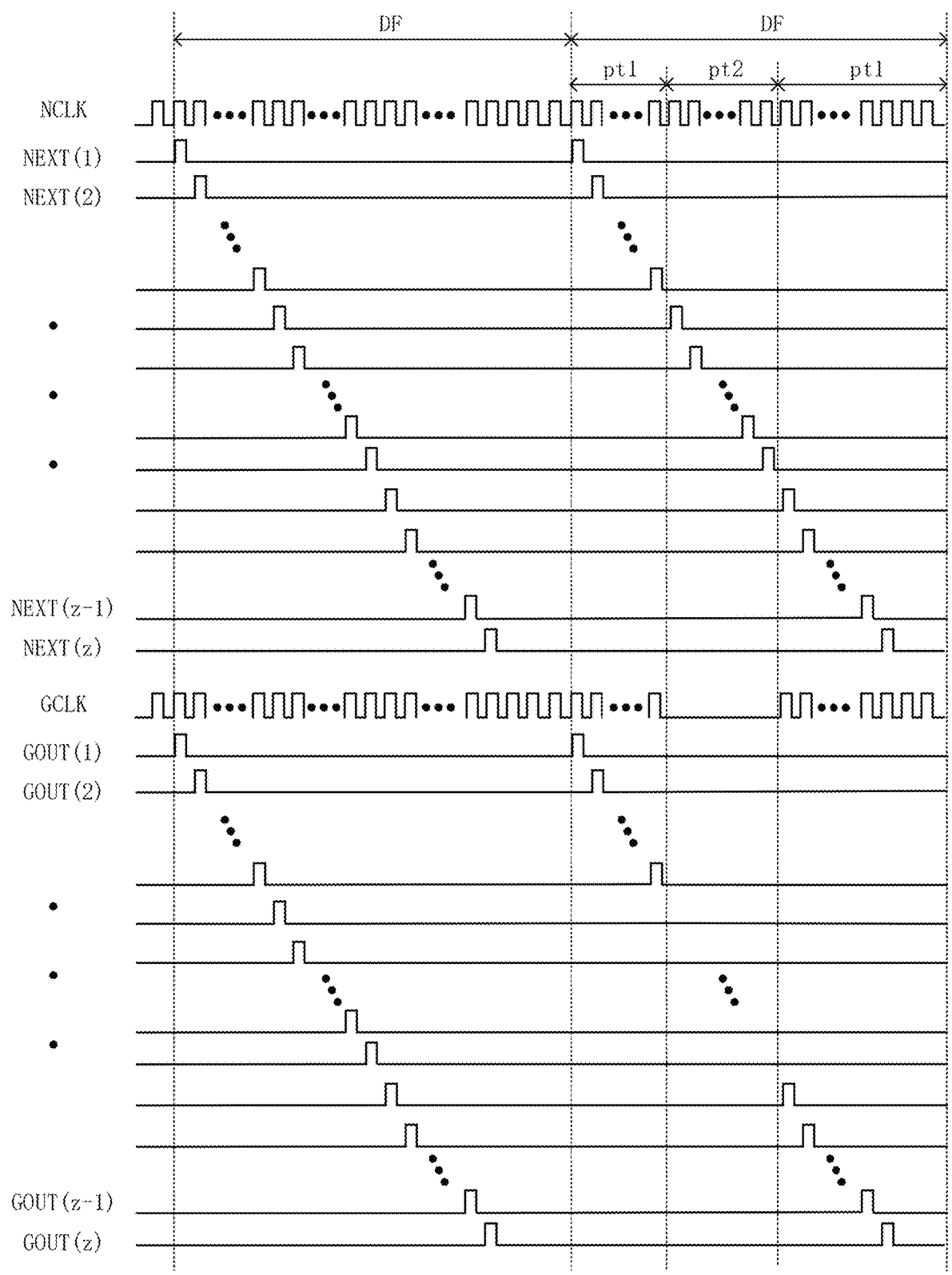
FIG. 6 is a timing sequence diagram of another driving circuit provided in an embodiment of the present application.

Exemplarily, taking an example that the active level is a high level, the inactive level is a low level, and the potential of the first fixed potential end VGL is at a low level, FIG. 6 is a timing sequence diagram of another driving circuit provided by an embodiment of the present application. Referring to FIG. 4 and FIG. 6, the display panel 001 includes a multi-frequency driving mode. In the second phase pt2 of part of display frames DF in the multi-frequency driving mode, the stage transmission clock signal received by the stage transmission clock end NCLK includes valid pulses, and the scanning clock signal received by the scanning clock end GCLK is always at an inactive level. In the second phase pt2, the stage transmission modules 220 of the shift register units 20 can receive high-level stage transmission clock signals and low-level first fixed potential signals. Under the control of the signals of the first nodes N1 and the signals of the second nodes N2, the stage transmission modules 220 of at least part of shift register units 20 can output high-level stage transmission signals; in the second phase pt2, the scanning modules 230 of the shift register units 20 can receive low-level scanning clock signals and low-level first fixed potential signals. Under the control of the signals of the first nodes N1 and the signals of the fourth input ends in04, the scanning modules 230 of the shift register units 20 output low-level scanning signals. In this way, when the scanning module 230 of the same one of shift register units 20 stops outputting the valid pulses of the scanning signal, the stage transmission module 220 can still normally output the valid pulses of the stage transmission signal, ensuring that the starting input signal of the shift register unit 20 can be normally shifted, so that the shift register units 20 at the subsequent stages can still output the valid pulses of the scanning signals, thereby realizing different frequencies in different areas with refreshment of the display panel 001.

In an optional embodiment, in actual application, the stage transmission clock end NCLK and the scanning clock end GCLK of the shift register unit 20 can be electrically connected to a display driver chip (not shown in the figure). By changing the timing sequence design of the display driver chip, in the second phase pt2, the stage transmission clock signal received by the stage transmission clock end NCLK includes valid pulses, and the scanning clock signal received by the scanning clock end GCLK is always at an inactive level.

Figure 7:
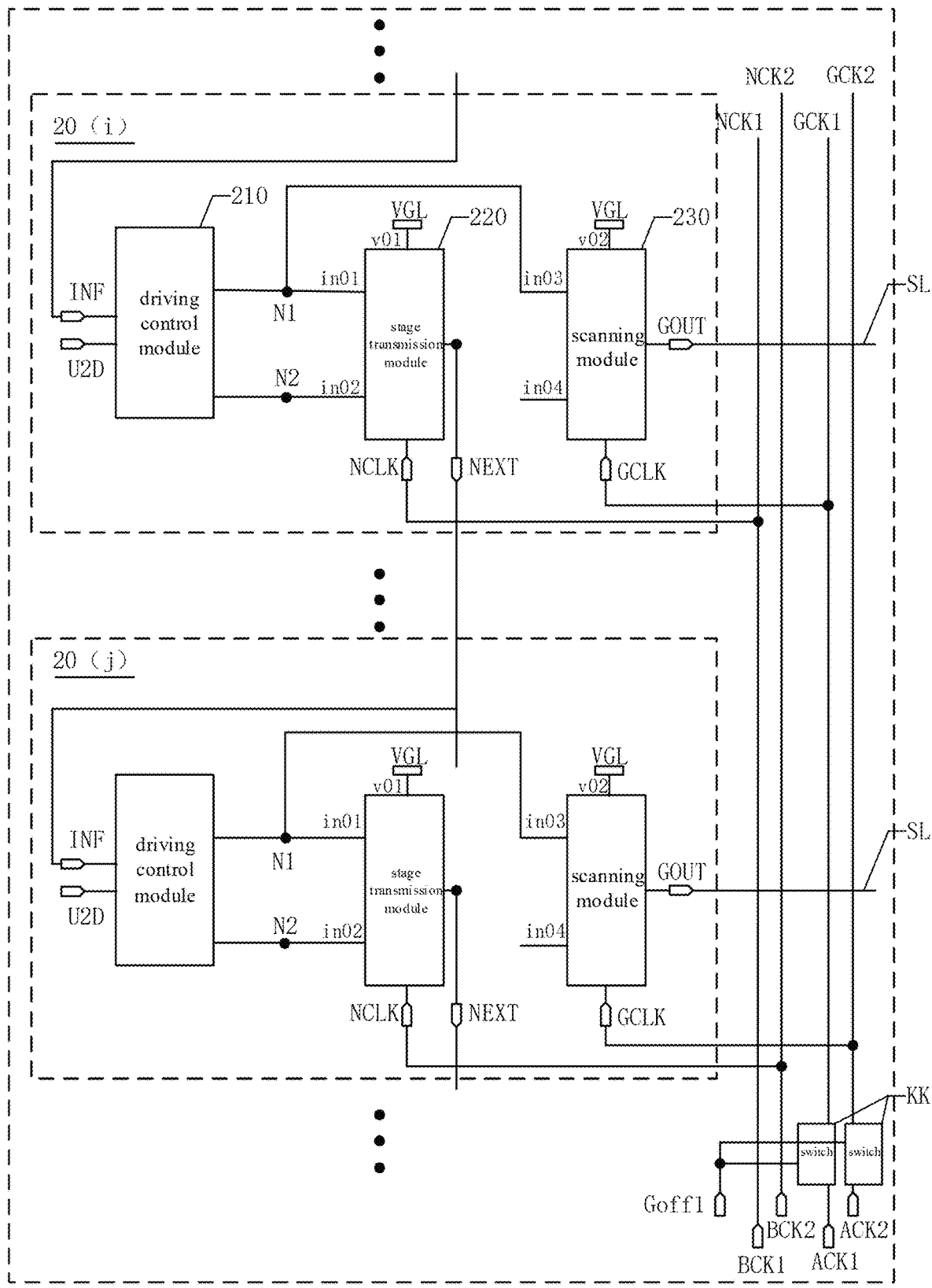
FIG. 7 is a schematic structural diagram of a driving circuit provided in an embodiment of the present application.

In another optional embodiment, FIG. 7 is a schematic structural diagram of a driving circuit provided by an embodiment of the present application. Referring to FIG. 7, the driving circuit 10 includes a plurality of output clock lines (GCK1, GCK2), a plurality of first clock ends (ACK1, ACK2), a plurality of switches KK and a first refresh control end Goff1; an input end of the switch KK is electrically connected to a first clock end (ACK1 or ACK2); an output end of the switch KK is electrically connected to an output clock line (GCK1 or GCK2), and each output clock line may be electrically connected to a scanning clock end GCLK of a plurality of shift register units 20; a control end KK of the switch is electrically connected to the first refresh control end Goff1.

Specifically, the switch KK can control the transmission path of the scanning clock signal to the scanning clock end GCLK under the control of the first refresh control signal of the first refresh control end Goff1. When the switch KK is turned on, the scanning clock end GCLK of the shift register unit 20 can receive the scanning clock signal from the first clock end (ACK1 or ACK2) that periodically jumps, and the scanning modules 230 of at least part of the shift register units 20 can output the valid pulses of the scanning signal; when the switch KK is turned off, the scanning clock end GCLK of the shift register unit 20 cannot receive the scanning clock signal from the first clock end (ACK1 or ACK2) that periodically jumps, and the scanning module 230 of the shift register unit 20 cannot output the valid pulses of the scanning signal, so that the pixels in some areas stop refreshing, and only the refresh frequencies of the some areas can be reduced without changing the refresh frequencies of other areas, thereby realizing different frequencies in different areas with refreshment of the display panel 001.

Exemplarily, the driving circuit 10 further includes a plurality of shift clock lines (NCK1, NCK2) and a plurality of second clock ends (BCK1, BCK2). In actual application, the first refresh control end Goff1, the first clock ends (ACK1, ACK2) and the second clock ends (BCK1, BCK2) are all electrically connected to the display driver chip (not shown in the figure), and the display driver chip (not shown in the figure) can provide the display panel 001 with a first refresh control signal, a scanning clock signal and a stage transmission clock signal. The display driver chip (not shown in the figure) can always provide the display panel 001 with a periodically jumping scanning clock signal and a periodically jumping stage transmission clock signal. By providing the display panel 001 with a first refresh control signal of different potentials, the switch KK can be controlled to be turned on/off, thereby indirectly controlling the signal of the scanning clock end GCLK of the shift register unit 20, so as to realize different frequencies in different areas with refreshment of the display panel 001.

By arranging a switch between the first clock end and the output clock line, on the one hand, the design of the clock part in the display driver chip may be simplified, and the clock part of the driver chip may always jump normally without changing its jumping rules, which is conducive to reducing development costs and shortening development cycles; on the other hand, compared with arranging a refresh control module in each shift register unit, multiple shift register units in the present application can share a switch, which is conducive to the thinness and narrow border of the display panel.

Figure 8:
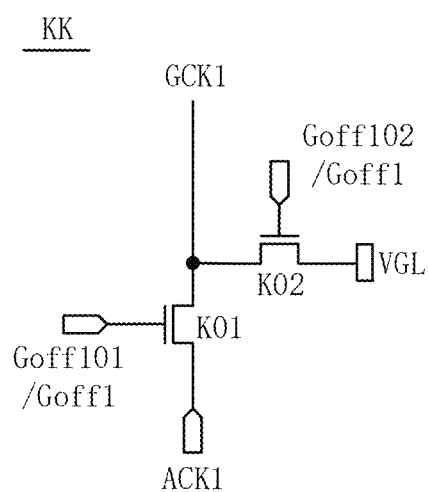
FIG. 8 is a schematic structural diagram of a switch provided in an embodiment of the present application.

In an optional embodiment, FIG. 8 is a schematic structural diagram of a switch provided by an embodiment of the present application. Referring to FIG. 8, the switch KK includes a first switch transistor K01 and a second switch transistor K02; a first electrode of the first switch transistor K01 is electrically connected to the first clock end ACK1; a second electrode of the first switch transistor K01 is electrically connected to the output clock line GCK1; a first electrode of the second switch transistor K02 is electrically connected to the first fixed potential end VGL; a second electrode of the second switch transistor K02 is electrically connected to the output clock line GCK1; a gate of the first switch transistor K01 and a gate of the second switch transistor K02 are both electrically connected to the first refresh control end Goff1.

Exemplarily, taking an example that the active level is a high level, the inactive level is a low level, and the potential of the first fixed potential end VGL is at a low level, referring to FIG. 8, the first switch transistor K01 and the second switch transistor K02 are both N-type transistors, and the first refresh control end Goff1 includes a first sub-control end Goff101 and a second sub-control end Goff102, the first sub-control end Goff101 is electrically connected to the gate of the first switch transistor K01, and the second sub-control end Goff102 is electrically connected to the gate of the second switch transistor K02. When the first sub-control end Goff101 is at a high level and the second sub-control end Goff102 is at a low level, the first switch transistor K01 is turned on and the second switch transistor K02 is turned off, and the scanning clock signal of the first clock end ACK1 can be transmitted to the output clock line GCK1, so that the potential of the scanning clock end GCLK includes a high level, and the scanning modules 230 of at least part of the shift register units 20 can output valid pulses of the scanning signal; when the first sub-control end Goff101 is at a low level and the second sub-control end Goff102 is at a high level, the first switch transistor K01 is turned off and the second switch transistor K02 is turned on, the scanning clock signal of the first clock end ACK1 cannot be transmitted to the output clock line GCK1, and the potential of the output clock line GCK1 is at a low level, so that the potential of the scanning clock end GCLK is at a low level, the scanning module 230 of the shift register unit 20 cannot output valid pulses of the scanning signal, and at least part of the display area stops refreshing. It can be understood that when the channel types of the first switch transistor K01 and the second switch transistor K02 are opposite, the first sub-control end Goff101 and the second sub-control end Goff102 can be reused.

By arranging the first switch transistor and the second switch transistor in the switch, the first switch transistor can control the transmission path of the scanning clock signal from the first clock end to the scanning clock end under the control of the signal of the first sub-control end; when the first switch transistor interrupts the transmission path of the scanning clock signal, the second switch transistor can reset the output clock line to ensure that the scanning clock signal on the output clock line can be maintained at a low level, so that part of the shift register units cannot output the valid pulses of the scanning signals, thereby stopping the refresh of some display areas, and realizing different frequencies in different areas with refreshment of the display panel 001.

Figure 9:
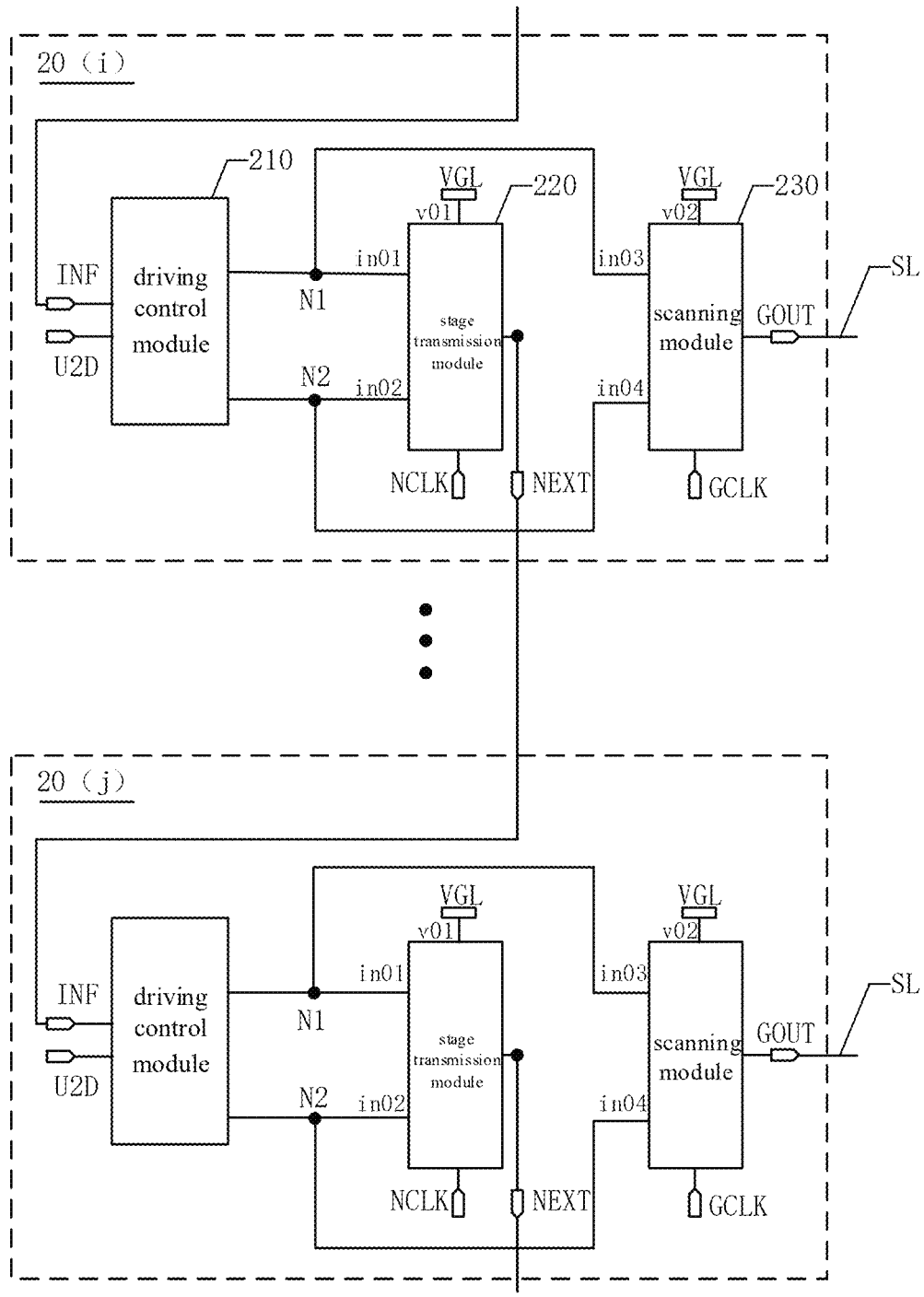
FIG. 9 is a schematic structural diagram of another shift register unit provided in an embodiment of the present application.

Based on the above-mentioned embodiments, FIG. 9 is a schematic structural diagram of another shift register unit provided in an embodiment of the present application. Referring to FIG. 9, in the same one of shift register units 20, the fourth input end in04 is electrically connected to the second node N2.

Specifically, in the same one of shift register units 20, the stage transmission clock signal received by the stage transmission clock end NCLK is different from the scanning clock signal received by the scanning clock end GCLK, so that in the same one of shift register units 20, the stage transmission signal output by the stage transmission output end NEXT and the scanning signal output by the scanning output end GOUT may be different. At this time, the signals received by other signal ends of the stage transmission module 220 and the scanning module 230 may be the same.

Exemplarily, in the same one of shift register units 20, the stage transmission clock signal received by the stage transmission clock end NCLK and the scanning clock signal received by the scanning clock end GCLK may be different. The structures of the stage transmission module 220 and the scanning module 230 may be the same, but are not limited thereto.

Figure 10:
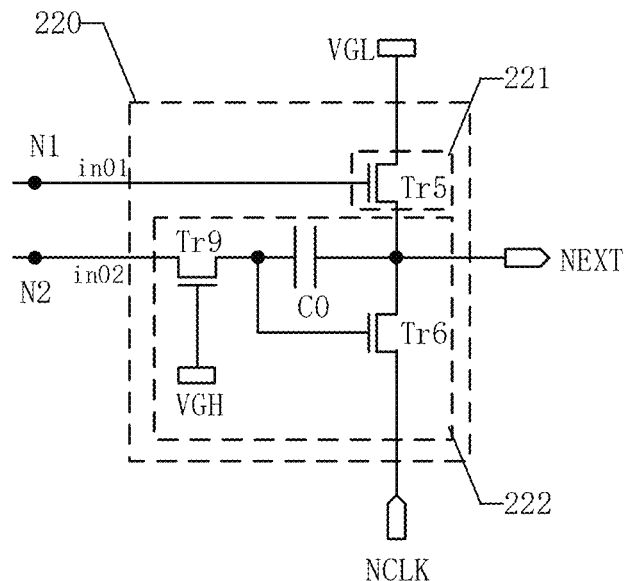
FIG. 10 is a schematic structural diagram of a stage transmission module provided in an embodiment of the present application.

In an optional embodiment, FIG. 10 is a schematic structural diagram of a stage transmission module provided in an embodiment of the present application. Referring to FIG. 10, the stage transmission module 220 includes a first stage transmission unit 221 and a second stage transmission unit 222. An input end of the first stage transmission unit 221 is electrically connected to the first fixed potential end VGL, an output end of the first stage transmission unit 221 is electrically connected to the stage transmission output end NEXT, and a control end of the first stage transmission unit 221 is electrically connected to the first input end in01. An input end of the second stage transmission unit 222 is electrically connected to the stage transmission clock end NCLK, an output end of the second stage transmission unit 222 is electrically connected to the stage transmission output end NEXT, and a control end of the second stage transmission unit 222 is electrically connected to the second input end in02.

Exemplarily, the first stage transmission unit 221 includes a first stage transmission transistor Tr5, a gate of the first stage transmission transistor Tr5 is electrically connected to the first node N1, a first electrode of the first stage transmission transistor Tr5 is electrically connected to the first fixed potential end VGL, and a second electrode of the first stage transmission transistor Tr5 is electrically connected to the stage transmission output end NEXT; the second stage transmission unit 222 includes a second stage transmission transistor Tr6, a gate of the second stage transmission transistor Tr6 is electrically connected to the second node N2, a first electrode of the second stage transmission transistor Tr6 is electrically connected to the stage transmission clock end NCLK, and a second electrode of the second stage transmission transistor Tr6 is electrically connected to the stage transmission output end NEXT.

In addition, the second stage transmission unit 222 may also include a stage transmission bootstrap capacitor C0 and a stage transmission voltage-stabilizing transistor Tr9, a first end of the stage transmission bootstrap capacitor C0 is electrically connected to the gate of the second stage transmission transistor Tr6, a second end of the stage transmission bootstrap capacitor C0 is electrically connected to the stage transmission output end NEXT; a first electrode of the stage transmission voltage-stabilizing transistor Tr9 is electrically connected to the second node N2, a second electrode of the stage transmission voltage-stabilizing transistor Tr9 is electrically connected to the first end of the stage transmission bootstrap capacitor C0, and a gate of the stage transmission voltage-stabilizing transistor Tr9 is electrically connected to the second fixed potential end VGH. Taking an example that all transistors in the stage transmission module 220 are N-type transistors and the potential of the second fixed potential end VGH is at a high level, when the gate of the second stage transmission transistor Tr6 is at a high level, the second stage transmission transistor Tr6 is turned on. When the stage transmission clock signal drives the stage transmission output end NEXT to be pulled up, the stage transmission bootstrap capacitor C0 can couple and pull up the gate of the second stage transmission transistor Tr6, and compensate the threshold voltage of the second stage transmission transistor Tr6, which are conducive to the full opening of the second stage transmission transistor Tr6, reducing the signal delay of the stage transmission signal, and improving the accuracy of the stage transmission signal.

It should be noted that the figure only exemplarily shows the case where all transistors in the stage transmission module are N-type transistors. In other optional embodiments, some or all transistors in the stage transmission module may also be P-type transistors.

Figure 11:
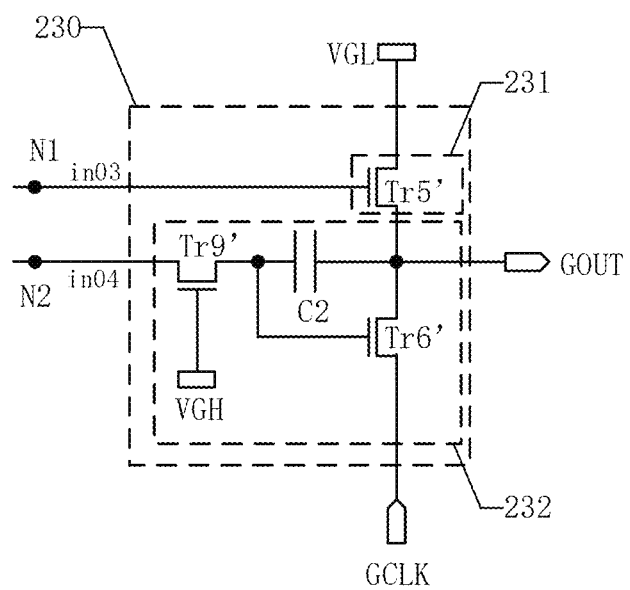
FIG. 11 is a schematic structural diagram of a scanning module provided in an embodiment of the present application.

In another optional embodiment, FIG. 11 is a schematic structural diagram of a scanning module provided in an embodiment of the present application. Referring to FIG. 11, the scanning module 230 includes a first scanning unit 231 and a second scanning unit 232. An input end of the first scanning unit 231 is electrically connected to the first fixed potential end VGL, an output end of the first scanning unit 231 is electrically connected to the scanning output end GOUT, and a control end of the first scanning unit 231 is electrically connected to the third input end in03. An input end of the second scanning unit 232 is electrically connected to the scanning clock end GCLK, an output end of the second scanning unit 232 is electrically connected to the scanning output end GOUT, and a control end of the second scanning unit 232 is electrically connected to the fourth input end in04.

Exemplarily, the first scanning unit 231 includes a first scanning transistor Tr5', a gate of the first scanning transistor Tr5' is electrically connected to the first node N1, a first electrode of the first scanning transistor Tr5' is electrically connected to the first fixed potential end VGL, and a second electrode of the first scanning transistor Tr5' is electrically connected to the scanning output end GOUT; the second scanning unit 232 includes a second scanning transistor Tr6', a gate of the second scanning transistor Tr6' is electrically connected to the second node N2, a first electrode of the second scanning transistor Tr6' is electrically connected to the scanning clock end GCLK, and a second electrode of the second scanning transistor Tr6' is electrically connected to the scanning output end GOUT.

In addition, the second scanning unit 232 may also include a scanning bootstrap capacitor C2 and a scanning voltage-stabilizing transistor Tr9', a first end of the scanning bootstrap capacitor C2 is electrically connected to the gate of the second scanning transistor Tr6', and a second end of the scanning bootstrap capacitor C2 is electrically connected to the scanning output end GOUT; a first electrode of the scanning voltage-stabilizing transistor Tr9' is electrically connected to the second node N2, a second electrode of the scanning voltage-stabilizing transistor Tr9' is electrically connected to the first end of the scanning bootstrap capacitor C2, and a gate of the scanning voltage-stabilizing transistor Tr9' is electrically connected to the second fixed potential end VGH. Taking an example that the transistors in the scanning module 230 are all N-type transistors and the potential of the second fixed potential end VGH is at a high level, when the gate of the second scanning transistor Tr6' is at a high level, the second scanning transistor Tr6' is turned on, and when the scanning clock signal drives the scanning signal of the scanning output end GOUT to be pulled up, the scanning bootstrap capacitor C2 can couple and pull up the gate of the second scanning transistor Tr6', compensate the threshold voltage of the second scanning transistor Tr6', which are conducive to the full opening of the second scanning transistor Tr6', reducing the signal delay of the scanning signal, and improving the accuracy of the scanning signal.

It should be noted that the figure only exemplarily shows the case where all transistors in the scanning module are N-type transistors. In other optional embodiments, some or all transistors in the scanning module may also be P-type transistors.

Figure 12:
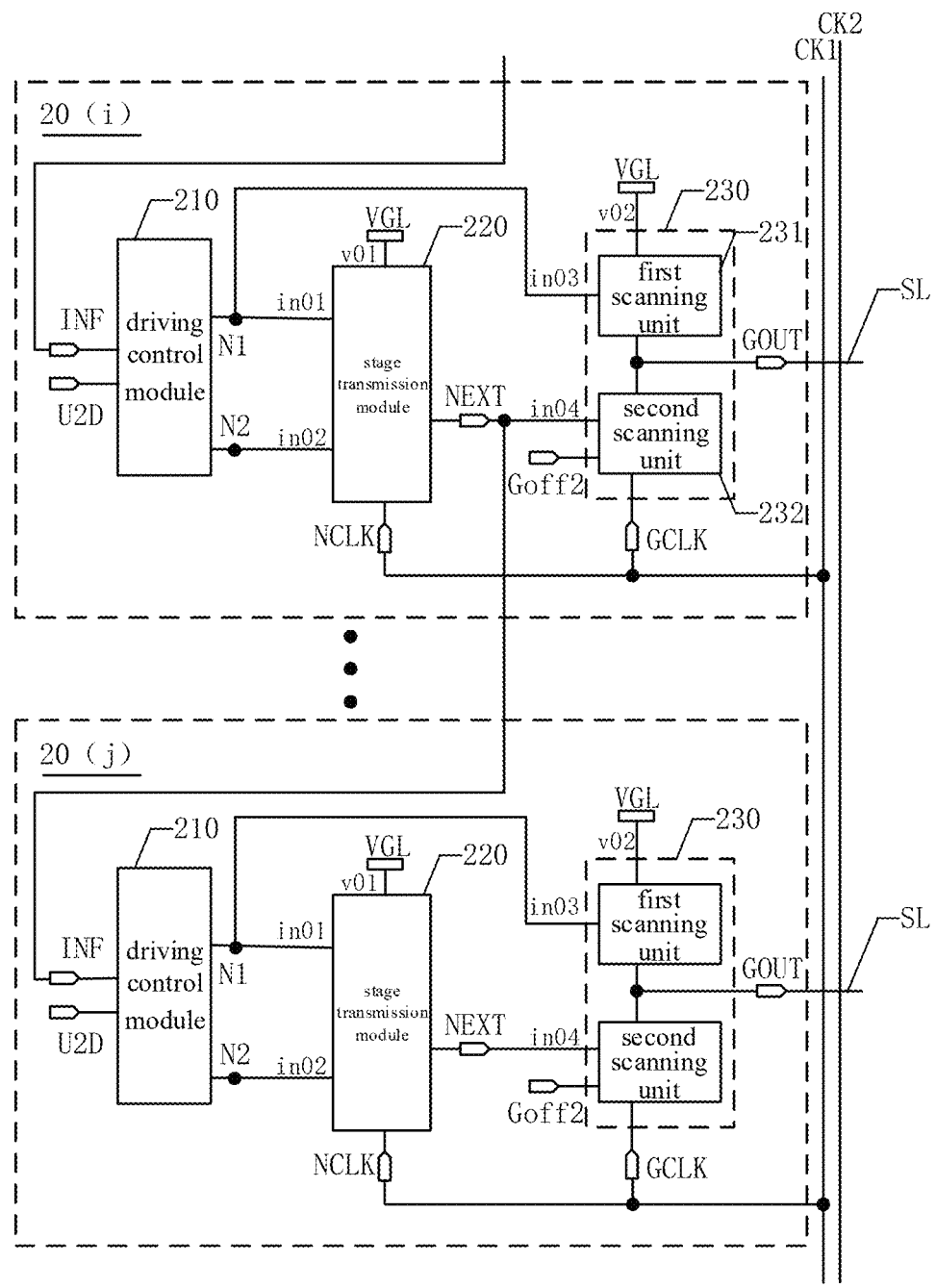
FIG. 12 is a schematic structural diagram of another shift register unit provided in an embodiment of the present application.

Optionally, FIG. 12 is a schematic structural diagram of another shift register unit provided in an embodiment of the present application. Referring to FIG. 12, in the same one of shift register units 20, the fourth input end in04 is electrically connected to the stage transmission output end NEXT, and the scanning module 230 includes a first scanning unit 231, a second scanning unit 232 and a second refresh control end Goff2. An input end of the first scanning unit 231 is electrically connected to the first fixed potential end VGL; an output end of the first scanning unit 231 is electrically connected to the scanning output end GOUT; a control end of the first scanning unit 231 is electrically connected to the third input end in03; an input end of the second scanning unit 232 is electrically connected to the scanning clock end GCLK; an output end of the second scanning unit 232 is electrically connected to the scanning output end GOUT; a first control end of the second scanning unit 232 is electrically connected to the fourth input end in04; a second control end of the second scanning unit 232 is electrically connected to the second refresh control end Goff2.

Exemplarily, taking an example that the active level is a high level, the inactive level is a low level, and the potential of the first fixed potential end VGL is at a low level, in the same one of shift register units 20, the first scanning unit 231 can pull down the potential of the scanning output end GOUT under the control of the signal of the first node N1, so that the scanning signal is at an inactive level; the second scanning unit 232 can output the scanning clock signal of the scanning clock end GCLK as the scanning signal when the stage transmission signal output from the stage transmission output end NEXT is at a high level and the second refresh control signal from the second refresh control end Goff2 is also at a high level, that is, when the stage transmission signal and the second refresh control signal are both at active levels, the second scanning unit 232 can output the valid pulses of the scanning clock signal; when any one or both of the stage transmission signal and the second refresh control signal are at inactive levels, the second scanning unit 232 stops outputting the valid pulses of the scanning clock signal.

The fourth input end in04 is electrically connected to the stage transmission output end NEXT, and the first control end of the second scanning unit 232 is electrically connected to the stage transmission output end NEXT, and the second control end of the second scanning unit 232 is electrically connected to the second refresh control end Goff2, on the one hand, by controlling the potential of the second refresh control end Goff2, it is possible to control whether the shift register unit 20 can output valid pulses of the scanning signal, and then control whether the pixel electrically connected to the shift register unit 20 can be refreshed, thereby realizing different frequencies in different areas with refreshment of the display panel 001; on the other hand, when the stage transmission signal of the stage transmission output end NEXT is at an active level, the stage transmission clock signal of the stage transmission clock end NCLK charges the stage transmission output end NEXT, so that the potential of the stage transmission output end NEXT is stable, and the potential of the first control end of the second scanning unit 232 can also be maintained stable, that is, when the potential of the first control end of the second scanning unit 232 is at an active level, the signal of the first control end is an active signal (provided by the stage transmission clock signal via the stage transmission output end NEXT), which can ensure that the first control end is stable at an active level. At this time, whether the shift register unit 20 can output valid pulses of the scanning signal is only controlled by the second refresh control signal of the second refresh control end Goff2, which is conducive to the accuracy of the scanning signal.

It can be understood that the refresh control ends of multiple shift register units may be electrically connected, that is, the second refresh control ends of the shift register units at the respective stages may be electrically connected to the same signal line (not shown in the figure), and the second refresh control signals received by the second refresh control ends of the shift register units at the respective stages are the same. By controlling the second refresh control signals received by the second refresh control ends of the shift register units at the respective stages to be at active levels in part of time periods of a display frame, when part of shift register units are driven and the stage transmission module can output valid pulses of the stage transmission signal, the part of shift register units can output valid pulses of the scanning signal to achieve the refresh of pixels in some areas; it is also possible to control the second refresh control signals received by the second refresh control ends of the shift register units at the respective stages to be at inactive levels in part of time periods of a display frame. At this time, although part of shift register units are driven and the stage transmission module can output valid pulses of the stage transmission signal, the part of shift register units cannot output valid pulses of the scanning signal, so that the pixels in the some areas stop refreshing, thereby realizing different frequencies in different areas with refreshment of the display panel 001.

It can also be understood that whether the shift register unit can output valid pulses of the scanning signal depends on the stage transmission signal and the second refresh control signal received by the scanning module. Other signals received by the scanning module do not need to be specially designed. For example, during the refresh time of a display frame, the scanning clock signal received by the scanning module can always be periodically jumped, and there is no need to control the scanning clock signal to at an inactive level during a certain period of time, which is conducive to simplifying the design of the clock part in the display driver chip. The clock part of the driver chip can always jump normally without changing its jumping rules, which is conducive to reducing development costs and shortening development cycles.

Figure 13:
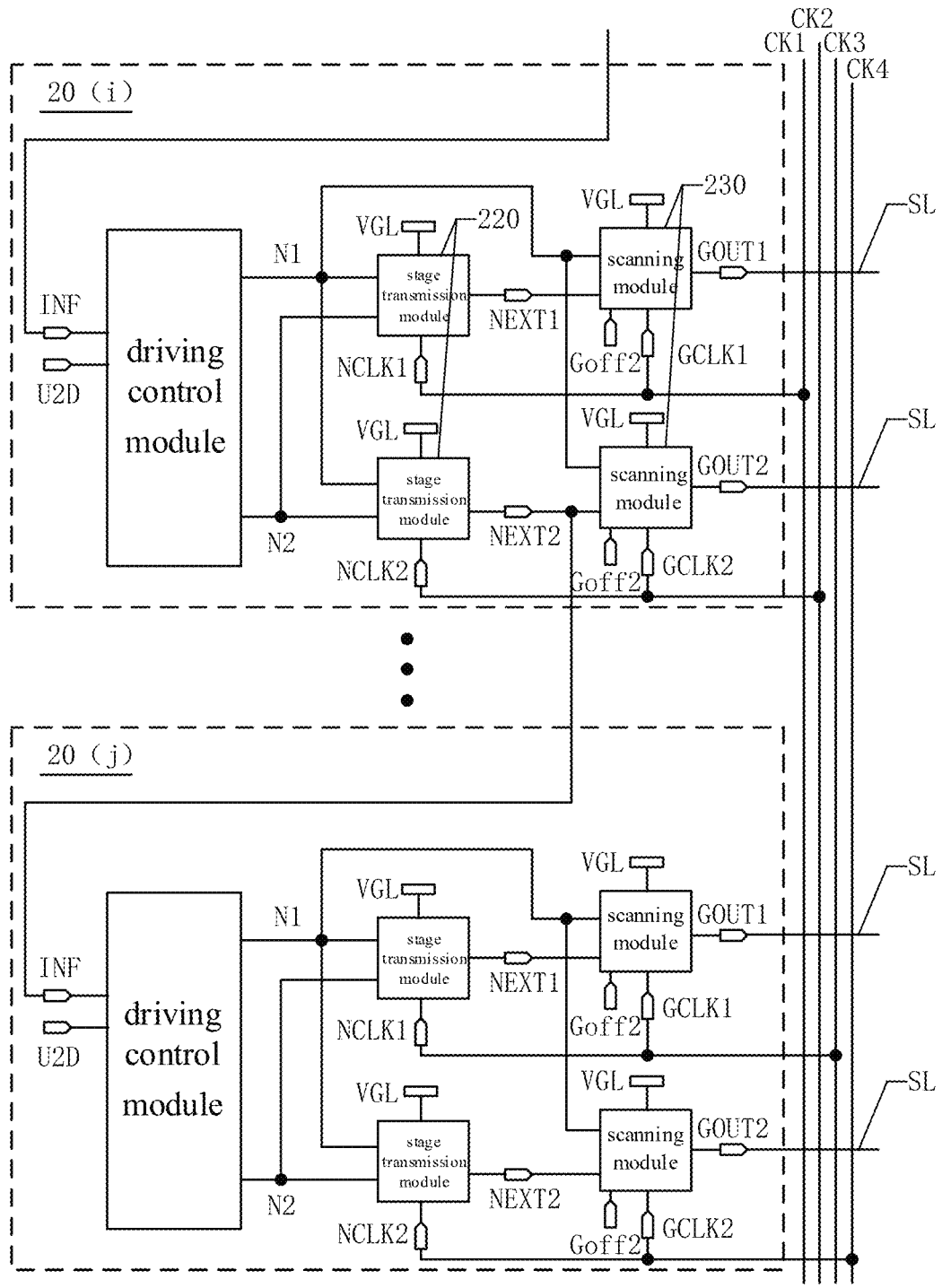
FIG. 13 is a schematic structural diagram of another shift register unit provided in an embodiment of the present application.

In an optional embodiment, FIG. 13 is a schematic structural diagram of another shift register unit provided by an embodiment of the present application. Referring to FIG. 12 and FIG. 13, in the same one of shift register units 20, a number of stage transmission modules 220 is equal to a number of scanning modules 230; one stage transmission module 220 and one scanning module 230 constitute an output group; the scanning clock end GCLK and the stage transmission clock end NCLK in the same output group are electrically connected.

Specifically, the scanning clock signal of the scanning clock end GCLK can always jump normally. When the scanning module 230 needs to stop outputting the valid pulses of the scanning signal, the second refresh control signal of the second refresh control Goff2 can be controlled to be at an inactive level, so that the scanning output end GOUT of the scanning module 230 cannot output the valid pulse. In the refresh time of a display frame, the stage transmission clock signal and the scanning clock signal both include valid pulses that jump normally. For the same output group, the stage transmission clock signal and the scanning clock signal can be completely the same and reused. In this way, the clock line and clock signal can be reduced, which is conducive to simplifying the circuit and timing sequence design.

Exemplarily, referring to FIG. 13, the shift register unit 20 includes two stage transmission modules 220 and two scanning modules 230, that is, two output groups. The stage transmission clock end NCLK1 and the scanning clock end GCLK1 of the first output group may be electrically connected to the same clock line (CK1 or CK3), and the stage transmission clock end NCLK2 and the scanning clock end GCLK2 of the second output group may be electrically connected to the same clock line (CK2 or CK4).

Figure 14:
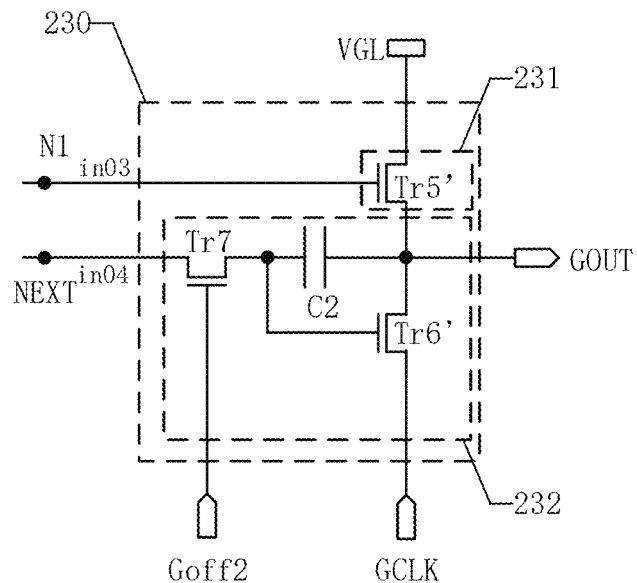
FIG. 14 is a schematic structural diagram of another scanning module provided in an embodiment of the present application.

In another optional embodiment, FIG. 14 is a schematic structural diagram of another scanning module provided by an embodiment of the present application. Referring to FIG. 14, the second scanning unit 232 includes a refresh control transistor Tr7 and a second scanning transistor Tr6'. A gate of the second scanning transistor Tr6' is electrically connected to a second electrode of the refresh control transistor Tr7; a first electrode of the second scanning transistor Tr6' is electrically connected to the scanning clock end GCLK; a second electrode of the second scanning transistor Tr6' is electrically connected to the scanning output end GOUT; a first electrode of the refresh control transistor Tr7 is electrically connected to the stage transmission output end NEXT; a gate of the refresh control transistor Tr7 is electrically connected to the second refresh control end Goff2.

Exemplarily, taking an example that all transistors in the scanning module 230 are N-type transistors, when the second refresh control end Goff2 is at a high level, the refresh control transistor Tr7 is turned on, and when the stage transmission signal of the stage transmission output end NEXT is at a high level, the gate of the second scanning transistor Tr6' is also at a high level, and the second scanning transistor Tr6' is turned on. When the scanning clock signal of the scanning clock end GCLK jumps to a high level, the potential of the scanning output end GOUT may be driven to be pulled high, so that the scanning signal is at an active level; when the second refresh control end Goff2 is at a low level, the refresh control transistor Tr7 is turned off, when the stage transmission signal of the stage transmission output end NEXT is at a high level, the gate of the second scanning transistor Tr6' is still at a low level, the second scanning transistor Tr6' is turned off, and the scanning output end GOUT cannot output an active level.

In addition, the second scanning unit 232 may also include a scanning bootstrap capacitor C2, a first end of the scanning bootstrap capacitor C2 is electrically connected to the gate of the second scanning transistor Tr6', and a second end of the scanning bootstrap capacitor C2 is electrically connected to the scanning output end GOUT. When the scanning clock signal drives the scanning output end GOUT to pull up, the scanning bootstrap capacitor C2 can couple and pull up the gate of the second scanning transistor Tr6', and compensate for the threshold voltage of the second scanning transistor Tr6', which are conducive to the full opening of the second scanning transistor Tr6', reducing the signal delay of the scanning signal, and improving the accuracy of the scanning signal.

It should be noted that the figure only exemplarily shows the case where the transistors in the scanning module are all N-type transistors. In other optional embodiments, some or all of the transistors in the scanning module may also be P-type transistors.

Figure 15:
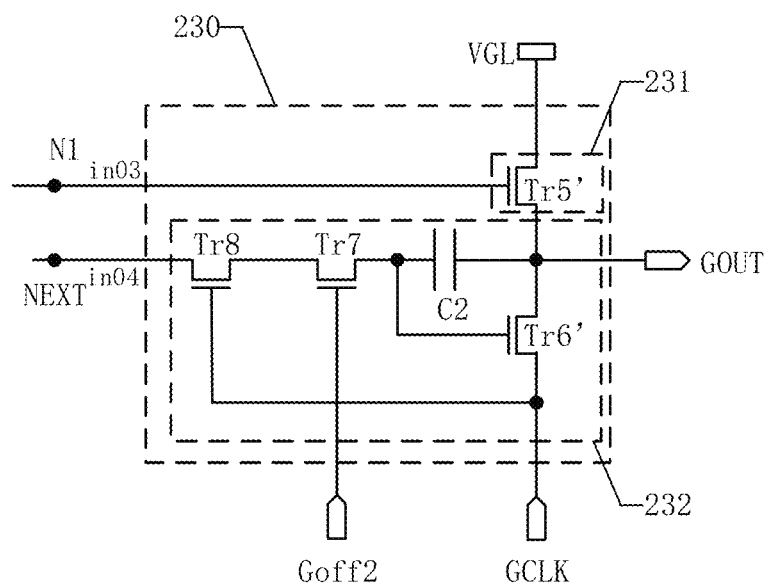
FIG. 15 is a schematic structural diagram of another scanning module provided in an embodiment of the present application.

Based on the above-mentioned embodiments, FIG. 15 is a schematic structural diagram of another scanning module provided by an embodiment of the present application. Referring to FIG. 15, the second scanning unit 232 also includes an auxiliary transistor Tr8; a first electrode of the auxiliary transistor Tr8 is electrically connected to the stage transmission output end NEXT of the same one of shift register units 20; a second electrode of the auxiliary transistor Tr8 is electrically connected to the first electrode of the refresh control transistor Tr7; a gate of the auxiliary transistor Tr8 is electrically connected to the scanning clock end GCLK.

Exemplarily, taking the case where all transistors in the scanning module 230 are N-type transistors, when the second refresh control end Goff2 is at a high level, the refresh control transistor Tr7 is turned on. At the same time, when the stage transmission signal of the stage transmission output end NEXT is at a high level and the scanning clock signal of the scanning clock end GCLK is also at a high level, the auxiliary transistor Tr8 and the second scanning transistor Tr6' are both turned on. When the scanning clock signal of the scanning clock end GCLK jumps from a high level to a low level, the parasitic capacitance coupling of the second scanning transistor Tr6' may pull down the gate potential of the second scanning transistor Tr6'. At the same time, if the stage transmission output end NEXT is directly electrically connected to the first electrode of the refresh control transistor Tr7, and the stage transmission signal of the stage transmission output end NEXT also jumps from a high level to a low level, the gate potential of the second scanning transistor Tr6' may be further pulled down, so that the second scanning transistor Tr6' is turned off in advance, and the potential of the scanning output end GOUT cannot be pulled down. It is possible that the scanning signals transmitted by multiple scanning lines SL are at high levels at the same time, and multiple rows of pixels are refreshed at the same time, resulting in abnormal display. An auxiliary transistor Tr8 is arranged between the stage transmission output end NEXT and the first electrode of the refresh control transistor Tr7, and the gate of the auxiliary transistor Tr8 is electrically connected to the scanning clock end GCLK, the auxiliary transistor Tr8 can be controlled to be turned off in advance when the scanning clock signal of the scanning clock end GCLK jumps from a high level to a low level, thereby avoiding affecting the gate potential of the second scanning transistor Tr6' when the stage transmission signal of the stage transmission output end NEXT jumps from a high level to a low level.

In addition, when the second scanning unit 232 includes the scanning bootstrap capacitor C2, the second refresh control end Goff2 is at a high level, the refresh control transistor Tr7 is turned on, and at the same time, when the stage transmission signal of the stage transmission output end NEXT is at a high level, and the scanning clock signal of the scanning clock end GCLK is also at a high level, the auxiliary transistor Tr8 and the second scanning transistor Tr6' are both turned on; when the scanning clock signal drives the scanning signal of the scanning output end GOUT to be pulled up, the scanning bootstrap capacitor C2 can couple and pull up the gate of the second scanning transistor Tr6'. In this way, after the scanning clock signal of the scanning clock end GCLK jumps from a high level to a low level, the parasitic capacitance coupling of the second scanning transistor Tr6' pulls down the gate potential of the second scanning transistor Tr6', and the gate potential of the second scanning transistor Tr6' is still relatively high, so as to ensure that the second scanning transistor Tr6' is fully turned on, and the potential of the scanning output end GOUT can be pulled down in time.

Figure 16:
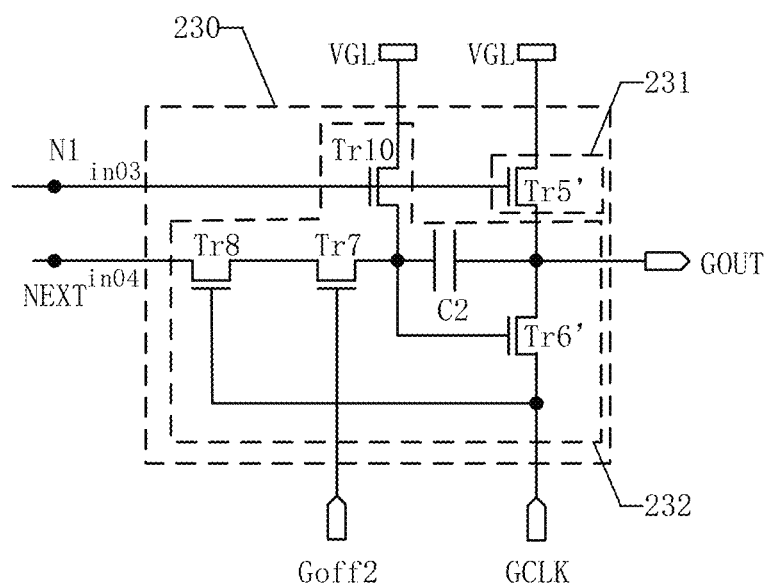
FIG. 16 is a schematic structural diagram of another scanning module provided in an embodiment of the present application.

Based on the above-mentioned embodiments, FIG. 16 is a schematic structural diagram of another scanning module provided by an embodiment of the present application. Referring to FIG. 16, the second scanning unit 232 further includes a pull-down transistor Tr10; a gate of the pull-down transistor Tr10 is electrically connected to the first node N1; a first electrode of the pull-down transistor Tr10 is electrically connected to the first fixed potential end VGL; a second electrode of the pull-down transistor Tr10 is electrically connected to the gate of the second scanning transistor Tr6'.

Exemplarily, taking an example that the active level is a high level, the inactive level is a low level, and the potential of the first fixed potential end VGL is at a low level, referring to FIG. 16, when the signal of the first node N1 is at a high level, the first scanning transistor Tr5' and the pull-down transistor Tr10 are turned on, and the scanning output end GOUT and the gate of the second scanning transistor Tr6' are at low levels. By arranging the pull-down transistor Tr10, the pull-down transistor Tr10 can be turned on when the signal of the first node N1 is at a high level, pull down the gate potential of the second scanning transistor Tr6', and turn off the second scanning transistor Tr6', so as to avoid that the gate potential of the second scanning transistor Tr6' is always at a high level, and the first scanning transistor Tr5' and the second scanning transistor Tr6' are turned on at the same time, resulting in signal collision and damage to the circuit.

Figure 17:
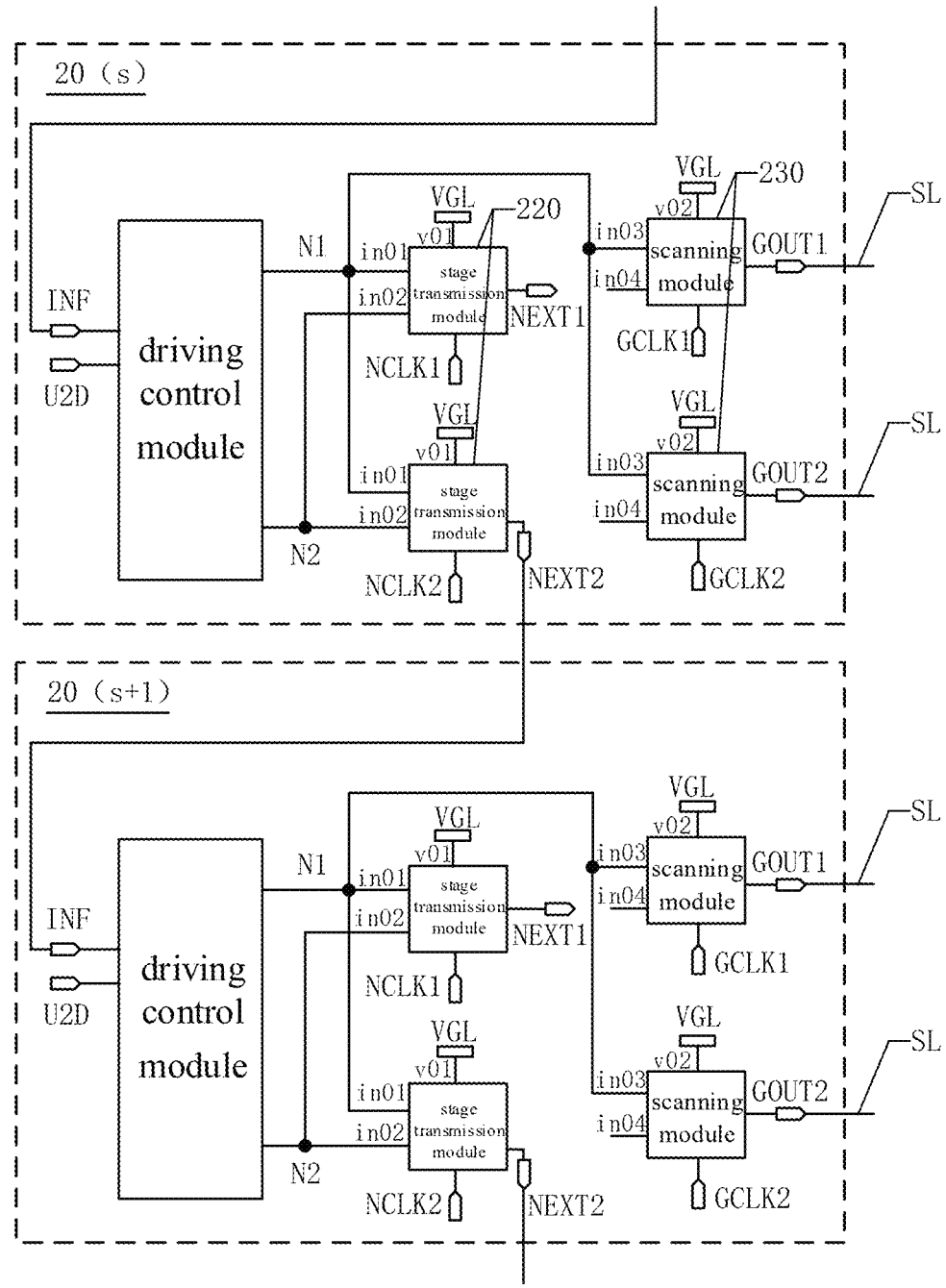
FIG. 17 is a schematic structural diagram of another shift register unit provided in an embodiment of the present application.

Optionally, FIG. 17 is a schematic structural diagram of another shift register unit provided by an embodiment of the present application. Referring to FIG. 17, the shift register unit 20 includes n stage transmission modules 220, where n is an integer greater than or equal to 2. In the same one of shift register units 20, the valid pulses of the stage transmission clock signals received by the stage transmission clock ends NCLK1 and NCLK2 of each stage transmission module 220 do not overlap, and within a clock cycle, the k-th one of stage transmission clock signals that jumps to the valid pulse is a k-th stage transmission clock signal; the stage transmission module 220 that receives the k-th stage transmission clock signal is a k-th stage transmission module, k is a positive integer less than or equal to n. The stage transmission output end NEXT of the n-th stage transmission module 220 of the shift register unit 20 (*s*) at an s-th stage is electrically connected to the starting input end INF of the shift register unit 20 (s+1) at an s+1-th stage, and s is a positive integer.

The clock cycle refers to a jump cycle of multiple stage transmission clock signals received in a shift register unit 20, that is, a time period during which multiple stage transmission clock signals received in a shift register unit 20 jump to valid pulses in sequence. The valid pulses of multiple stage transmission clock signals received by the same one of shift register units 20 do not overlap, and the valid pulses of multiple stage transmission clock signals received by adjacent two of the shift register units 20 do not overlap.

Figure 18:
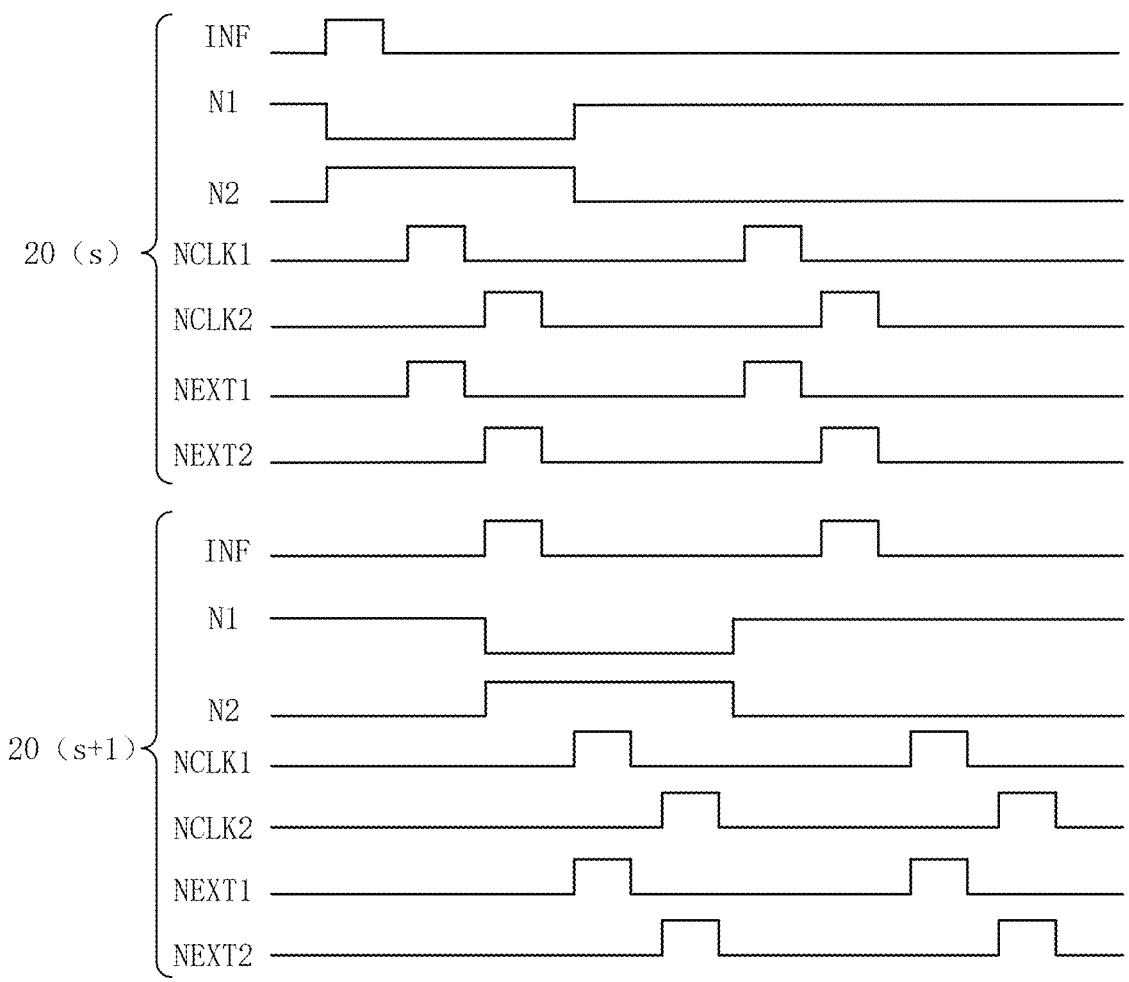
FIG. 18 is a timing sequence diagram of another shift register unit provided in an embodiment of the present application.

Exemplarily, taking an example that n=2, the shift register unit 20 includes two stage transmission modules 220 and two scanning modules 230. FIG. 18 is a timing sequence diagram of another shift register unit provided by an embodiment of the present application. Referring to FIG. 17 and FIG. 18, the shift register units 20 are cascaded in sequence, and the starting input signals of the starting input ends INF are shifted in sequence. The first and second stage transmission modules 220 of the shift register unit 20 (*s*) at the s-th stage receive the valid pulses of the first and second stage transmission clock signals in sequence, so that the stage transmission output ends NEXT1 and NEXT2 of the first and second stage transmission modules 220 output valid pulses in sequence. The last stage transmission clock signal that jumps to a valid pulse output by the shift register unit 20 (*s*) at the s-th stage is used as the starting input signal of the starting input end INF of the shift register unit 20 (s+1) at the s+1-th stage, so that the starting input signals can be shifted in sequence, that is, the shift register units 20 at the respective stages are driven in sequence.

Similarly, the last stage transmission clock signal that jumps to a valid pulse output by the shift register unit 20 (s+1) at the s+1-th stage can be used as the starting input signal of the starting input end INF of the shift register unit 20 (s+2) at the s+2-th stage, that is, the stage transmission output end NEXT of the n-th stage transmission module 220 of the shift register unit 20 (s+1) at the s+1-th stage is electrically connected to the starting input end INF of the shift register unit 20 (s+2) at the s+2-th stage (not shown in the figure).

It should be noted that the display panel can be scanned in a forward direction or in a reverse direction. During forward scanning, the shift register units 20 at the respective stages are sequentially at the first stage, the second stage, . . . , and the last stage from top to bottom, and the shift register units 20 at the respective stages sequentially output valid pulses of the stage transmission signals from top to bottom; during reverse scanning, the shift register units 20 at the respective stages are sequentially at the first stage, the second stage, . . . , and the last stage from bottom to top, and the shift register units 20 at the respective stages sequentially output valid pulses of the stage transmission signals from bottom to top. Regardless of whether the shift register units 20 at the respective stages are scanned in a forward direction or in a reverse direction, the stage transmission output end NEXT of the last stage transmission module 220 of the shift register unit 20 at a front stage that receives the valid pulses of the stage transmission clock signal is electrically connected to the starting input end INF of the shift register unit 20 at a next stage, so as to realize the sequential driving of the shift register units 20 at the respective stages.

Figure 19:
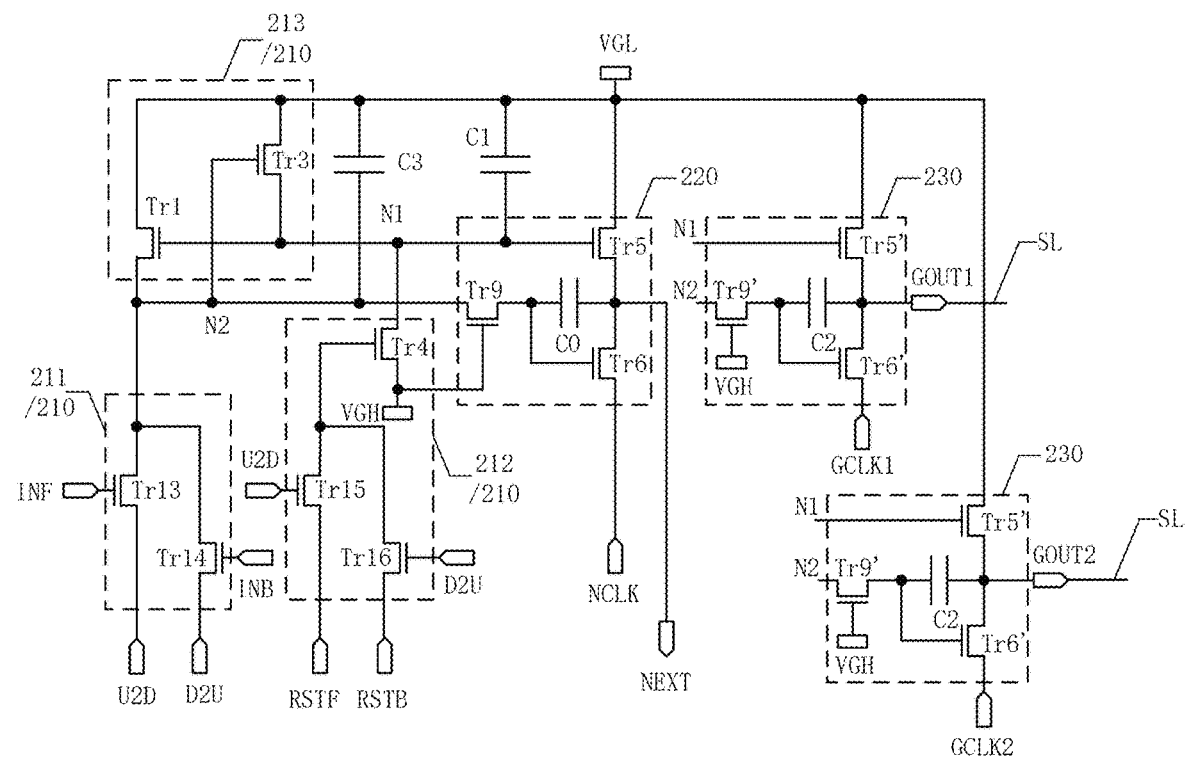
FIG. 19 is a schematic structural diagram of another shift register unit provided in an embodiment of the present application.

Optionally, FIG. 19 is a schematic structural diagram of another shift register unit provided by an embodiment of the present application. Referring to FIG. 19, the driving control module 210 includes an input unit 211, a reset unit 212 and an interlock unit 213. The driving control module 210 also includes a reset clock end RSTF; the input unit 211 is electrically connected to the starting input end INF, the scanning control end U2D and the second node N2 each; the reset unit 212 is electrically connected to the scanning control end U2D, the reset clock end RSTF, the first node N1 and the second fixed potential end VGH each; the interlock unit 213 is electrically connected to the first node N1, the second node N2 and the first fixed potential end VGL each.

Specifically, the input unit 211 can control the signal of the second node N2 to be at an active level when the potentials of the starting input end INF and the scanning control end U2D are both at active levels; the reset unit 212 can control the first node N1 to be at an active level when the potentials of the scanning control end U2D and the reset clock end RSTF are both at active levels; the interlocking unit 213 is configured to control the second node N2 to be at an inactive level when the first node N1 is at an active level, and to control the first node N1 to be at an inactive level when the second node N2 is at an active level.

Exemplarily, the input unit 211 includes a first input transistor Tr13, a first electrode of the first input transistor Tr13 may be electrically connected to the scanning control end U2D, a second electrode of the first input transistor Tr13 is electrically connected to the second node N2, and a gate of the first input transistor Tr13 may be electrically connected to the starting input end INF. The reset unit 212 includes a first reset transistor Tr15 and a reset control transistor Tr4, a gate of the first reset transistor Tr15 is electrically connected to the scanning control end U2D, a first electrode of the first reset transistor Tr15 is electrically connected to the reset clock end RSTF, a second electrode of the first reset transistor Tr15 is electrically connected to the gate of the reset control transistor Tr4, a first electrode of the reset control transistor Tr4 is electrically connected to the second fixed potential end VGH, and a second electrode of the reset control transistor Tr4 is electrically connected to the first node N1. The interlocking unit 213 includes a first interlocking transistor Tr1 and a second interlocking transistor Tr3, a first electrode of the first interlocking transistor Tr1 is electrically connected to the second node N2, a gate of the first interlocking transistor Tr1 is electrically connected to the first node N1, and a second electrode of the first interlocking transistor Tr1 is electrically connected to the first fixed potential end VGL; a gate of the second interlocking transistor Tr3 is electrically connected to the second node N2, a first electrode of the second interlocking transistor Tr3 is electrically connected to the first node N1, and a second electrode of the second interlocking transistor Tr3 is electrically connected to the first fixed potential end VGL.

In an optional embodiment, still referring to FIG. 19, the driving control module 210 may further include a reverse scanning control end D2U, a reverse input end INB, and a reverse reset clock end RSTB; the input unit 211 is also electrically connected to the reverse scanning control end D2U and the reverse input end INB; the reset unit 212 is also electrically connected to the reverse scanning control end D2U and the reverse reset clock end RSTB. The input unit 211 can also control the second node N2 to be at an active level when the potentials of the reverse scanning control end D2U and the reverse input end INB are both at active levels;

the reset unit 212 can also control the first node N1 to be at an active level when the potentials of the reverse scanning control end D2U and the reverse reset clock end RSTB are both at active levels.

Exemplarily, still referring to FIG. 19, the input unit 211 further includes a second input transistor Tr14, a first electrode of the second input transistor Tr14 may be electrically connected to the reverse scanning control end D2U, a second electrode of the second input transistor Tr14 is electrically connected to the second node N2, and a gate of the second input transistor Tr14 may be electrically connected to the reverse starting input end INB. The reset unit 212 further includes a second reset transistor Tr16, a gate of the second reset transistor Tr16 is electrically connected to the reverse scanning control end D2U, a first electrode of the second reset transistor Tr16 is electrically connected to the reverse reset clock end RSTB, and a second electrode of the second reset transistor Tr16 is electrically connected to the gate of the reset control transistor Tr4. In this way, the display panel can realize forward scanning and reverse scanning to meet various application scenarios.

It should be noted that the figure only exemplarily shows the case where the transistors in the driving control module are all N-type transistors. In other optional embodiments, some or all of the transistors in the driving control module may also be P-type transistors.

In another optional embodiment, still referring to FIG. 19, the driving control module 210 may also include a first storage capacitor C1 and a second storage capacitor C3, a first end of the first storage capacitor C1 is electrically connected to the first fixed potential end VGL, and a second end of the first storage capacitor C1 is electrically connected to the first node N1; a first end of the second storage capacitor C3 is electrically connected to the first fixed potential end VGL, and a second end of the second storage capacitor C3 is electrically connected to the second node N2. The first storage capacitor C1 and the second storage capacitor C3 can store the signal of the first node N1 and the signal of the second node N2 respectively. When no new signal is written into the driving control module 210, the first storage capacitor C1 and the second storage capacitor C3 can maintain the stability of the signal of the second node N2 and the signal of the first node N1.

In another optional embodiment, still referring to FIG. 19, the number of the stage transmission modules 220 and the number of the scanning modules 230 in the shift register unit 20 may be different. In one embodiment, the shift register unit 20 may include one stage transmission module 220 and two scanning modules 230. The number of the stage transmission modules 220 is less than the number of the scanning modules 230, which does not affect the shift register unit 20 outputting multiple scanning signals. In this way, the circuit structure of the shift register unit 20 can be simplified, and the number of transistors can be reduced, which are conducive to the narrow border and thinness of the display panel.

Figure 20:
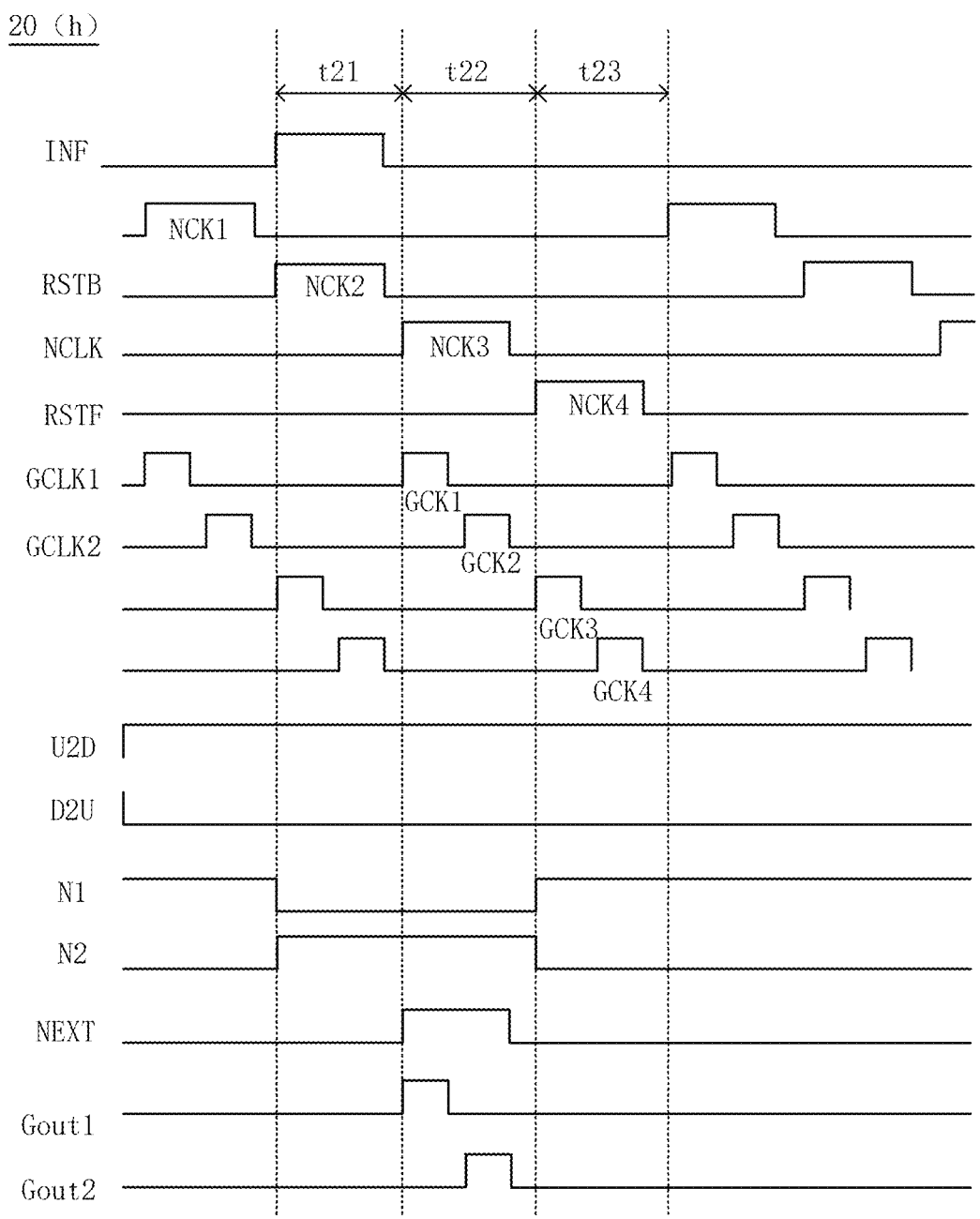
FIG. 20 is a timing sequence diagram of another shift register unit provided in an embodiment of the present application.

Exemplarily, taking an example that all transistors in the shift register unit 20 are N-type transistors, the potential of the first fixed potential end VGL is at a low level, and the potential of the second fixed potential end VGH is at a high level, FIG. 20 is a timing sequence diagram of another shift register unit provided in an embodiment of the present application. Referring to FIG. 19 and FIG. 20, during phase t21, the starting input end INF and the scanning control end U2D are both at high levels, the first input transistor Tr13 is turned on, the signal of the second node N2 is at a high level, and the interlock unit 213 can control the signal of the first node N1 to be at a low level under the control of the signal of the second node N2; at the same time, the reset clock end RSTF is at a low level, the reset unit 212 cannot output a high level signal, and the signal of the first node N1 is maintained at a low level. The first stage transmission transistor Tr5 and the first scanning transistor Tr5' are turned off, the second stage transmission transistor Tr6 and the second scanning transistor Tr6' are turned on, the stage transmission output end NEXT outputs the low level of the stage transmission clock end NCLK, the scanning output end GOUT1 outputs the low level of the scanning clock end GCLK1, and the scanning output end GOUT2 outputs the low level of the scanning clock end GCLK2.

During phase t22, the starting input end INF and the reset clock end RSTF are both at low levels, the signal of the second node N2 continues to be maintained at a high level, and the signal of the first node N1 continues to be maintained at a low level; the first stage transmission transistor Tr5 and the first scanning transistor Tr5' continue to be turned off, the second stage transmission transistor Tr6 and the second scanning transistor Tr6' continue to be turned on, the stage transmission output end NEXT can output the high level of the stage transmission clock end NCLK, the scanning output end GOUT1 can output the high level of the scanning clock end GCLK1, and the scanning output end GOUT2 can output the high level of the scanning clock end GCLK2.

During phase t23, the reset clock end RSTF and the scanning control end U2D are both at high levels, the reset unit 212 can output a high level signal, so that the signal of the first node N1 is at a high level, and the interlock unit 213 can control the signal of the second node N2 to be at a low level under the control of the signal of the first node N1; at the same time, the starting input end INF is at a low level, the input unit 211 cannot output a high level signal, and the signal of the second node N2 is at a low level. The first stage transmission transistor Tr5 and the first scanning transistor Tr5' are turned on, the second stage transmission transistor Tr6 and the second scanning transistor Tr6' are turned off, and the stage transmission output end NEXT, the scanning output end GOUT1 and the scanning output end GOUT2 output the low level of the first fixed potential end VGL.

After phase t23, the starting input end INF may continue to be maintained at a low level, and the signal of the reset clock end RSTF may alternately jump between a high level and a low level, so that the signal of the first node N1 continues to be maintained at a high level, and the signal of the second node N2 continues to be maintained at a low level, and the stage transmission output end NEXT, the scanning output end GOUT1 and the scanning output end GOUT2 may continue to be maintained at low levels until the signal of the starting input end INF jumps to a high level again, and the signal of the second node N2 may jump to a high level. At the same time, under an action of the reset unit 212 and the interlock unit 213, the stage transmission output end NEXT, the scanning output end GOUT1 or the scanning output end GOUT2 may output a high level again.

Figure 21:
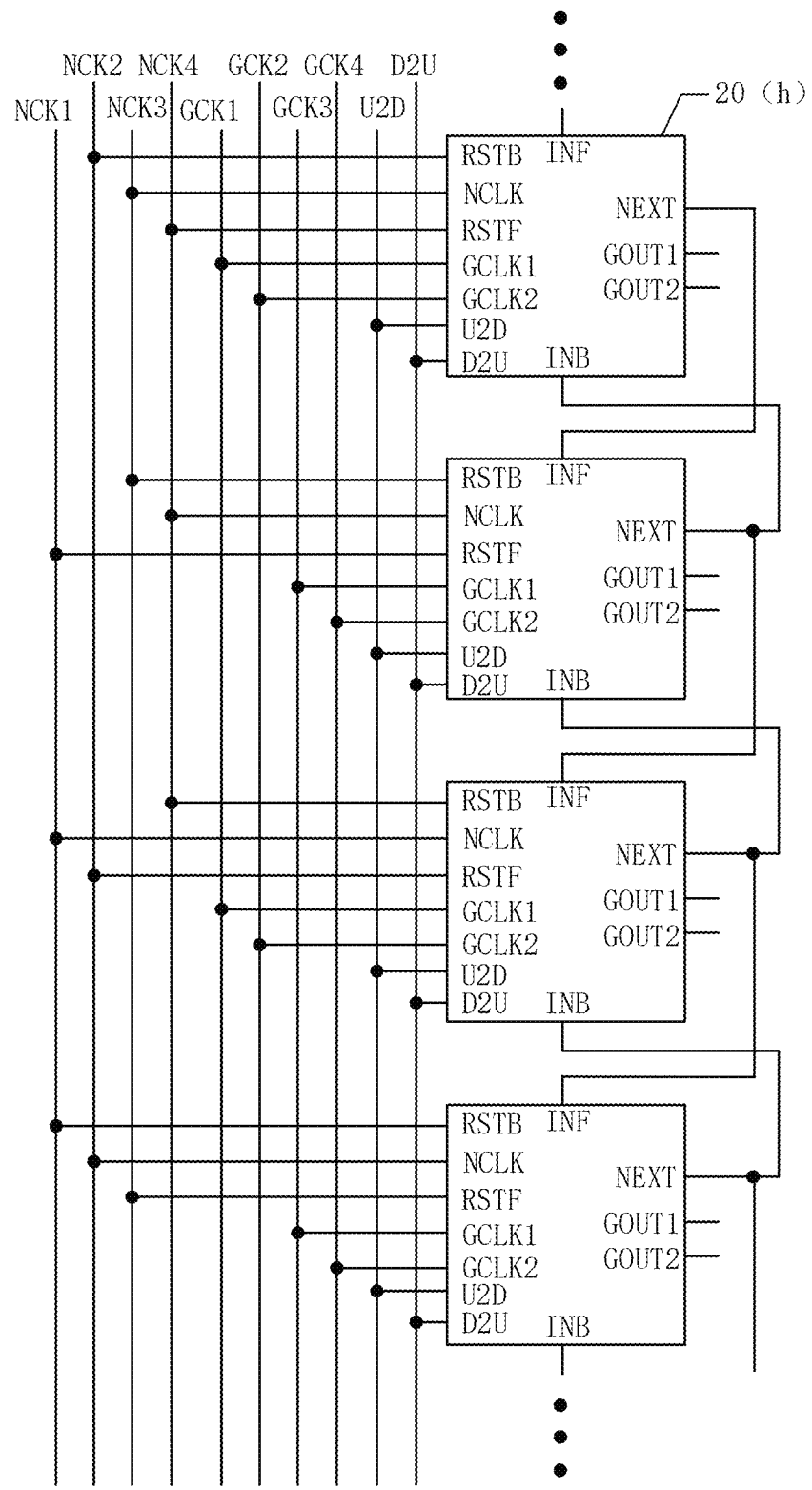
FIG. 21 is a schematic structural diagram of another driving circuit provided in an embodiment of the present application.

Exemplarily, FIG. 21 is a schematic structural diagram of another driving circuit provided by an embodiment of the present application. Referring to FIG. 21, when a plurality of shift register units 20 are cascaded, the starting input end INF of the shift driving unit 01 at a first stage can receive a first starting signal as a starting input signal, and the reverse input end INB of the shift driving unit 20 at a last stage can receive a second starting signal as a reverse input signal; except for the shift driving unit 20 at the first stage and the shift driving unit 20 at the last stage, the starting input end INF of the shift driving units 20 at each of the other stages is electrically connected to the stage transmission output end NEXT of the shift register unit 20 at one stage in front, and the stage transmission output end NEXT of the shift register unit 20 at a current stage may be electrically connected to the starting input end INF of the shift register unit 20 at a next stage. The reverse input end INB of the shift register unit 20 at the current stage is electrically connected to the stage transmission output end NEXT of the shift register unit 20 at the next stage, and the stage transmission output end NEXT of the shift register unit 20 at the current stage may be electrically connected to the reverse input end INB of the shift register unit 20 at one stage in front.

The scanning control end U2D of the shift register unit 20 at each of the stages is electrically connected, and the reverse scanning control end D2U of the shift register unit 20 at each of the stages is electrically connected. When the shift register units 20 perform a driving process of a forward scanning, the potential of the scanning control end U2D of the shift register unit 20 at each of the stages may be at an active level, and the potential of the reverse scanning control end D2U of the shift register unit 20 at each of the stages may be at an inactive level. In this way, the signal of the second node N2 in the shift driving unit 20 at the current stage may be unaffected by the stage transmission signal of the stage transmission output end NEXT of the shift driving unit 20 at the next stage. When the shift register units 20 perform a driving process of a reverse scanning, the potential of the scanning control end U2D of the shift register unit 20 at each of the stages may be at an inactive level, and the potential of the reverse scanning control end D2U of the shift register unit 20 at each of the stages may be at an active level. In this way, the signal of the second node N2 in the shift driving unit 20 at the current stage may be unaffected by the stage transmission signal of the stage transmission output end NEXT of the shift driving unit 20 at one stage in front.

The signals of the reverse reset clock end RSTB, the stage transmission clock end NCLK, and the reset clock end RSTF of the same one of shift register units 20 are different clock signals respectively. For example, for the shift register unit 20 at a h-th stage, the reverse reset clock end RSTB, the stage transmission clock end NCLK, and the reset clock end RSTF may be electrically connected to the shift clock lines NCK2, NCK3, and NCK4 respectively; for the shift register unit 20 at a h+1-th stage, the reverse reset clock end RSTB, the stage transmission clock end NCLK, and the reset clock end RSTF may be electrically connected to the shift clock lines NCK3, NCK4, and NCK1 respectively; for the shift register unit 20 at a h+2-th stage, the reverse reset clock end RSTB, the stage transmission clock end NCLK, and the reset clock end RSTF may be electrically connected to the shift clock lines NCK4, NCK1, and NCK2 respectively; for the shift register unit 20 at a h+3-th stage, the reverse reset clock end RSTB, the stage transmission clock end NCLK, and the reset clock end RSTF may be electrically connected to the shift clock lines NCK1, NCK2, and NCK3 respectively, where the valid pulses of the shift clock lines NCK1, NCK2, NCK3, and NCK4 are shifted in sequence, and h is a positive integer. In addition, the reverse reset clock end RSTB of the shift register unit 20 at the h-th stage may be electrically connected to the reverse reset clock end RSTB of the shift register unit 20 at a h+4-th stage; the stage transmission clock end NCLK of the shift register unit 20 at the h-th stage may be electrically connected to the stage transmission clock end NCLK of the shift register unit 20 at the h+4-th stage; the reset clock end RSTF of the shift register unit 20 at the h-th stage may be electrically connected to the reset clock end RSTF of the shift register unit 20 at the h+4-th stage.

The signals of the scanning clock ends GCLK1 and GCLK2 of the same one of shift register units 20 are also different clock signals. For example, for the shift register unit 20 at the h-th stage, the scanning clock ends GCLK1 and GCLK2 may be electrically connected to the output clock lines GCK1 and GCK2 respectively; for the shift register unit 20 at the h+1-th stage, the scanning clock ends GCLK1 and GCLK2 may be electrically connected to the output clock lines GCK3 and GCK4 respectively, where the valid pulses of the output clock lines GCK1, GCK2, GCK3, and GCK4 are shifted in sequence, and h is a positive integer. In addition, the scanning clock end GCLK1 of the shift register unit 20 at the h-th stage may be electrically connected to the scanning clock end GCLK1 of the shift register unit 20 at the h+2-th stage; the scanning clock end GCLK2 of the shift register unit 20 at the h-th stage may be electrically connected to the scanning clock end GCLK2 of the shift register unit 20 at the h+2-th stage.

Figure 22:
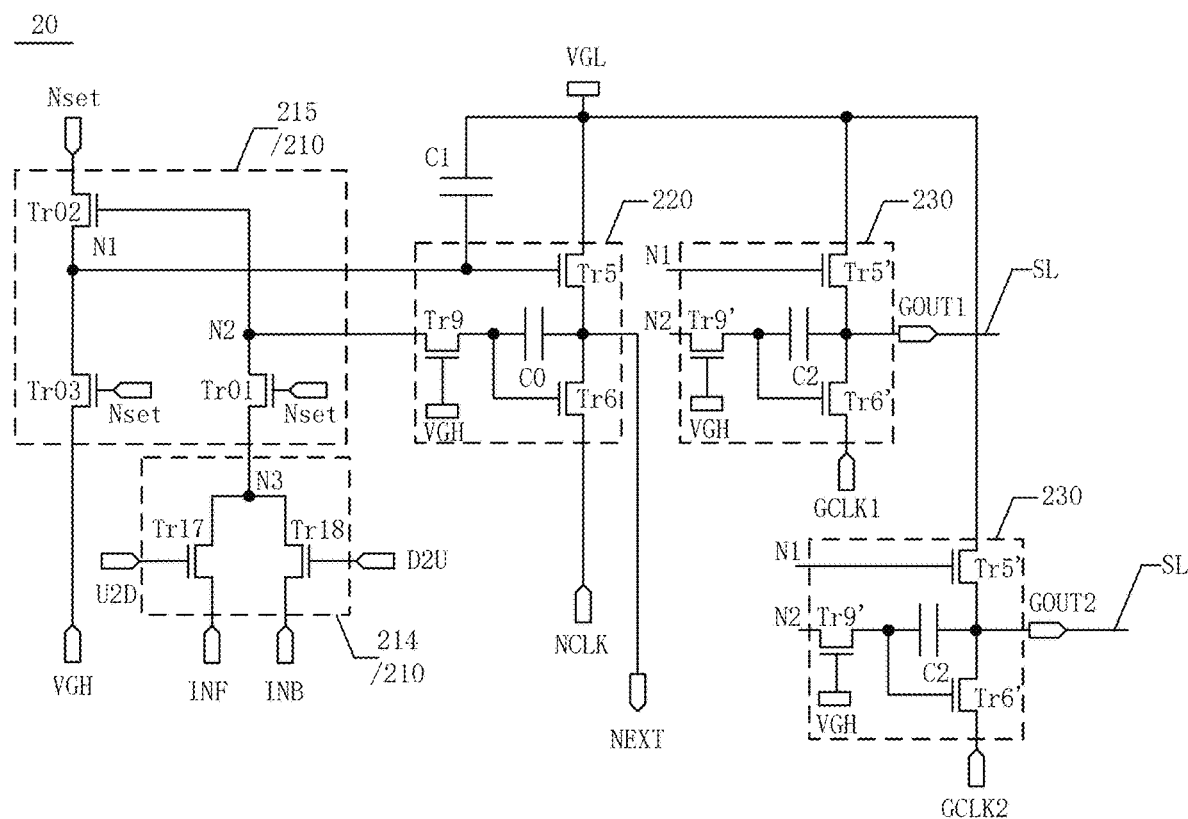
FIG. 22 is a schematic structural diagram of another driving circuit provided in an embodiment of the present application.

Optionally, FIG. 22 is a schematic structural diagram of another driving circuit provided by an embodiment of the present application. Referring to FIG. 22, the driving control module 210 includes a scanning control unit 214 and an enable control unit 215; the driving control module 210 also includes an enable clock end Nset and a third node N3; the scanning control unit 214 is electrically connected to the starting input end INF, the scanning control end U2D and the third node N3 each, and the scanning control unit 214 is configured to receive the starting input signal of the starting input end INF and the scanning control signal of the scanning control end U2D, and control the signal of the third node N3; the enable control unit 215 is electrically connected to the enable clock end Nset, the third node N3, the second fixed potential end VGH, the first node N1 and the second node N2 each, and the enable control unit 215 is configured to receive the enable clock signal of the enable clock end Nset, the signal of the third node N3 and the second fixed potential signal of the second fixed potential end VGH, and control the signal of the first node N1 and the signal of the second node N2.

Specifically, the scanning control unit 214 can control the signal of the third node N3 to be at an active level when the potentials of the starting input end INF and the scanning control end U2D are both at active levels; the scanning control unit 214 can also control the signal of the third node N3 to be at an inactive level when the potential of the scanning control end U2D is at an active level and the potential of starting input end INF is at an inactive level. The enable control unit 215 can control the signal of the first node N1 to be at an inactive level or an active level, and control the signal of the second node N2 to be at an inactive level or an active level under the control of the signal of the third node N3 and the enable clock signal of the enable clock end Nset.

In an optional embodiment, still referring to FIG. 22, the scanning control unit 214 includes a first scanning control transistor Tr17; a gate of the first scanning control transistor Tr17 is electrically connected to the scanning control end U2D, a first electrode of the first scanning control transistor Tr17 is electrically connected to the starting input end INF, and a second electrode of the first scanning control transistor Tr17 is electrically connected to the third node N3.

Specifically, when the potential of the scanning control end U2D is at an active level, the first scanning control transistor Tr17 is turned on, and the potential of the third node N3 is the same as the that of the starting input end INF, so that forward scanning driving can be achieved. By connecting the gate of the first scanning control transistor Tr17 to the scanning control end U2D, and connecting the first electrode of the first scanning control transistor Tr17 to the starting input end INF, the potential of the third node N3 can follow the change of the starting input signal of the starting input end INF, so as to avoid the potential of the third node N3 floating and being always at an active level, which affects the driving process of the shift register units 20.

In addition, the driving control module 210 may further include a reverse scanning control end D2U and a reverse input end INB; the scanning control unit 214 may further include a second scanning control transistor Tr18; a gate of the second scanning control transistor Tr18 is electrically connected to the reverse scanning control end D2U, a first electrode of the second scanning control transistor Tr18 is electrically connected to the reverse input end INB, and a second electrode of the second scanning control transistor Tr18 is electrically connected to the third node N3. When the potential of the reverse scanning control end D2U is at an active level, the potentials of the second scanning control transistor Tr18 and the third node N3 are the same as the potential of the reverse input end INB, so that reverse scanning driving can be achieved.

In another optional embodiment, still referring to FIG. 22, the enable control unit includes a first enable transistor Tr01, a second enable transistor Tr02, and a third enable transistor Tr03; a gate of the first enable transistor Tr01 is electrically connected to the enable clock end Nset, a first electrode of the first enable transistor Tr01 is electrically connected to the third node N3, a second electrode of the first enable transistor Tr01 and a gate of the second enable transistor Tr02 are electrically connected to the second node N2; a first electrode of the second enable transistor Tr02 is electrically connected to the enable clock end Nset, a second electrode of the second enable transistor Tr02 and a second electrode of the third enable transistor Tr03 are electrically connected to the first node N1; a gate of the third enable transistor Tr03 is electrically connected to the enable clock end Nset, and a first electrode of the third enable transistor Tr03 is electrically connected to the second fixed potential end VGH.

Specifically, when the signal of the third node N3 and the potential of the enable clock end Nset are both at active levels, the signal of the second node N2 is at an active level; when the signal of the second node N2 is at an active level, the potential of the first node N1 is the same as the potential of the enable clock end Nset; when the signal of the second node N2 is at an inactive level, the signal of the first node N1 is at an active level. By arranging a scanning control unit 214 and an enable control unit 215 in the driving control module 210, and only arranging the first enable transistor Tr01, the second enable transistor Tr02 and the third enable transistor Tr03 in the scanning control unit 215, the control of the first node N1 and the second node N2 can be realized, and the number of transistors is reduced, which are conducive to the narrow border and thinness of the display panel.

Figure 23:
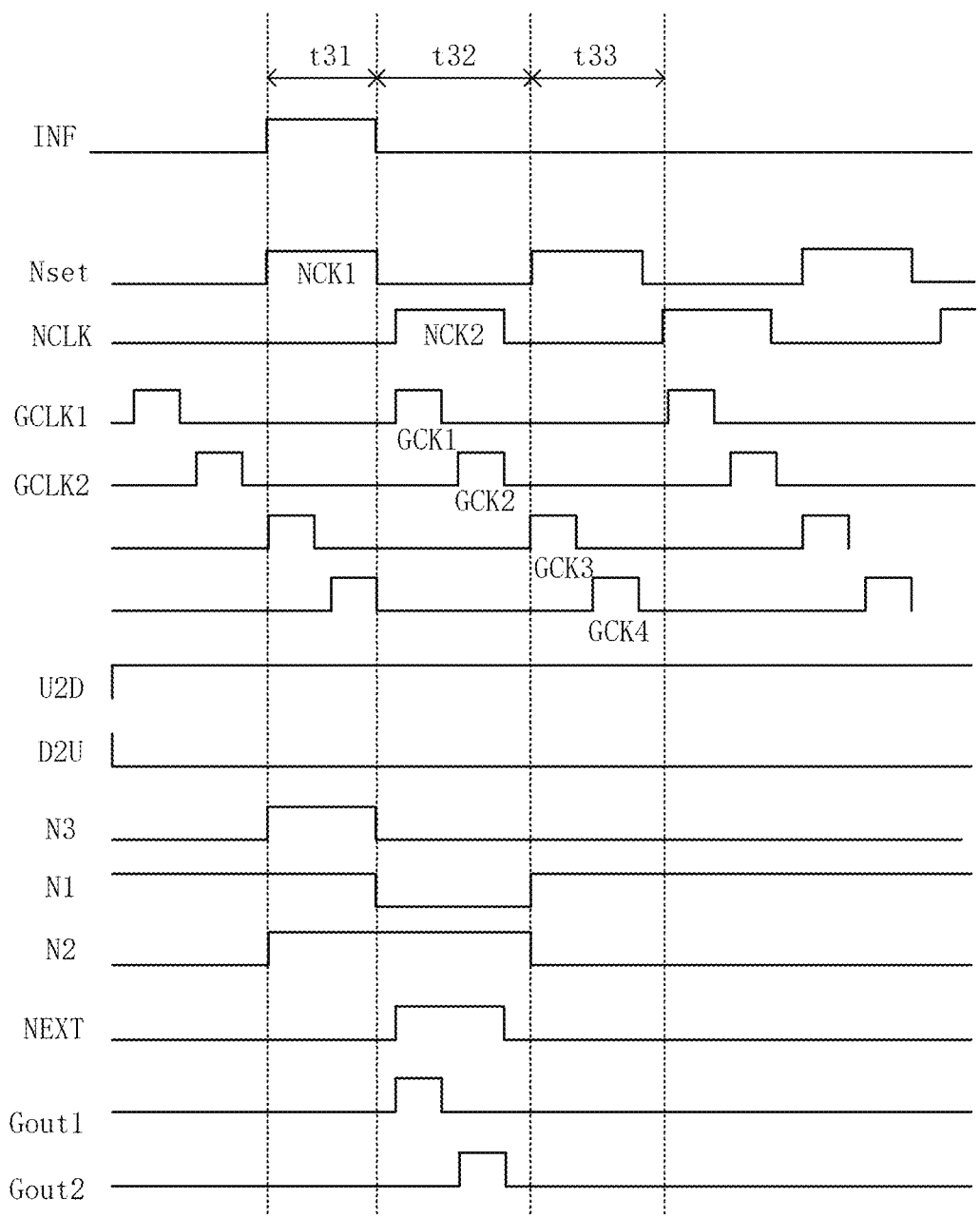
FIG. 23 is a timing sequence diagram of another shift register unit provided in an embodiment of the present application.

Exemplarily, taking an example that transistors in the shift register unit 20 are all N-type transistors, the potential of the first fixed potential end VGL is at a low level, and the potential of the second fixed potential end VGH is at a high level, FIG. 23 is a timing sequence diagram of another shift register unit provided by an embodiment of the present application. Referring to FIG. 22 and FIG. 23, during phase t31, the starting input end INF and the scanning control end U2D are both at high levels, the first scanning control transistor Tr17 is turned on, and the signal of the third node N3 is at a high level; at the same time, the enable clock signal of the enable clock end Nset is also at a high level, the first enable transistor Tr01, the second enable transistor Tr02 and the third enable transistor Tr03 are all turned on, the signals of the first node N1 and the second node N2 are all at high levels, the first stage transmission transistor Tr5, the first scanning transistor Tr5', the second stage transmission transistor Tr6 and the second scanning transistor Tr6' are all turned on, at this time, the stage transmission clock end NCLK is at a low level, the stage transmission output end NEXT outputs a low level, the scanning clock ends GCLK1 and GCLK2 are at low levels, and the scanning output ends GOUT1 and GOUT2 output low levels.

During phase t32, the starting input signal of the start input end INF becomes a low level, the potential of the scanning control end U2D is still at a high level, the first scanning control transistor Tr17 is turned on, and the signal of the third node N3 is at a low level; at the same time, the enable clock signal of the enable clock end Nset is at a low level, the first enable transistor Tr01 and the third enable transistor Tr03 are turned off, so that the second node N2 is still at a high level, the second enable transistor Tr02 is turned on, the first node N1 is at a low level, the first stage transmission transistor Tr5 and the first scanning transistor Tr5' are turned off, the second stage transmission transistor Tr6 and the second scanning transistor Tr6' are turned on, at this time, the stage transmission clock end NCLK is at a high level, the stage transmission output end NEXT can output the high level of the stage transmission clock end NCLK, the scanning clock ends GCLK1 and GCLK2 are at high levels in sequence, and the scanning output ends GOUT1 and GOUT2 can output valid pulses in sequence.

During phase t33, the potentials of the starting input end INF and the scanning control end U2D do not change, the signal of the third node N3 is still at a low level, the enable clock signal of the enable clock end Nset becomes a high level, the first enable transistor Tr01 and the third enable transistor Tr03 are turned on, the first node N1 becomes a high level, and the second node N2 becomes a low level; the first stage transmission transistor Tr5 and the first scanning transistor Tr5' are turned on, the second stage transmission transistor Tr6 and the second scanning transistor Tr6' are turned off, and the stage transmission output end NEXT, the scanning output end GOUT1 and the scanning output end GOUT2 output the low level of the first fixed potential end VGL.

After phase t33, the starting input end INF may continue to be maintained at a low level, the signal of the third node N3 may continue to be maintained at a low level, and the enable clock signal of the enable clock end Nset may alternately jump between a high level and a low level, so that the signal of the first node N1 continues to be maintained at a high level, the signal of the second node N2 continues to be maintained at a low level, and the stage transmission output end NEXT, the scanning output end GOUT1 and the scanning output end GOUT2 may continue to be maintained at low levels until the signal of the starting input end INF jumps to a high level again, and the signal of the third node N3 may jump to a high level. At the same time, under the action of the first enable transistor Tr01, the second enable transistor Tr02 and the third enable transistor Tr03, the stage transmission output end NEXT, the scanning output end GOUT1 or the scanning output end GOUT2 may output high levels.

It should be noted that the figure only exemplarily shows the case where the transistors in the driving control module are all N-type transistors. In other optional embodiments, some or all of the transistors in the driving control module may also be P-type transistors.

In one embodiment, in the same one of shift register units 20, the valid pulses of the starting input signal received by the starting input end INF overlap the valid pulses of the enable clock signal received by the enable clock end Nset, and the valid pulses of the enable clock signal received by the enable clock end Nset does not overlap the valid pulses of the stage transmission clock signal of the stage transmission clock end NCLK.

By setting the valid pulses of the starting input signal received by the starting input end INF to overlap the valid pulses of the enable clock signal received by the enable clock end Nset, the starting input end INF may be enabled to be at an active level. When the third node N3 is also controlled to be at an active level (phase t31), the active level of the third node N3 may be transmitted to the second node N2, ensuring that the potential of the starting input end INF can affect the potential of the second node N2, thereby realizing the driving of the shift register unit 20. By setting the valid pulses of the enable clock signal received by the enable clock end Nset to not overlap the valid pulses of the stage transmission clock signal of the stage transmission clock end NCLK, it can be ensured that when the first node N1 and the second node N2 are both at active levels (phase t31), the stage transmission clock signal of the stage transmission clock end NCLK is at an inactive level, thereby avoiding signal collision at the stage transmission output end NEXT and damaging the circuit.

In another embodiment, in the same one of shift register units 20, the valid pulses of the enable clock signal received by the enable clock end Nset and the valid pulses of the stage transmission clock signal of the scanning clock end GCLK do not overlap, thereby ensuring that when the first node N1 and the second node N2 are both at active levels (phase t31), the scanning clock signal of the scanning clock end GCLK is at an inactive level, thereby avoiding signal collision at the scanning output end GOUT and damaging the circuit.

Based on the above-mentioned embodiments, the stage transmission clock end NCLK of the shift register unit 20 (s) at the s-th stage is electrically connected to the enable clock end Nset of the shift register unit 20 (p) at a p-th stage, s≠p, and s and p are both positive integers.

Figure 24:
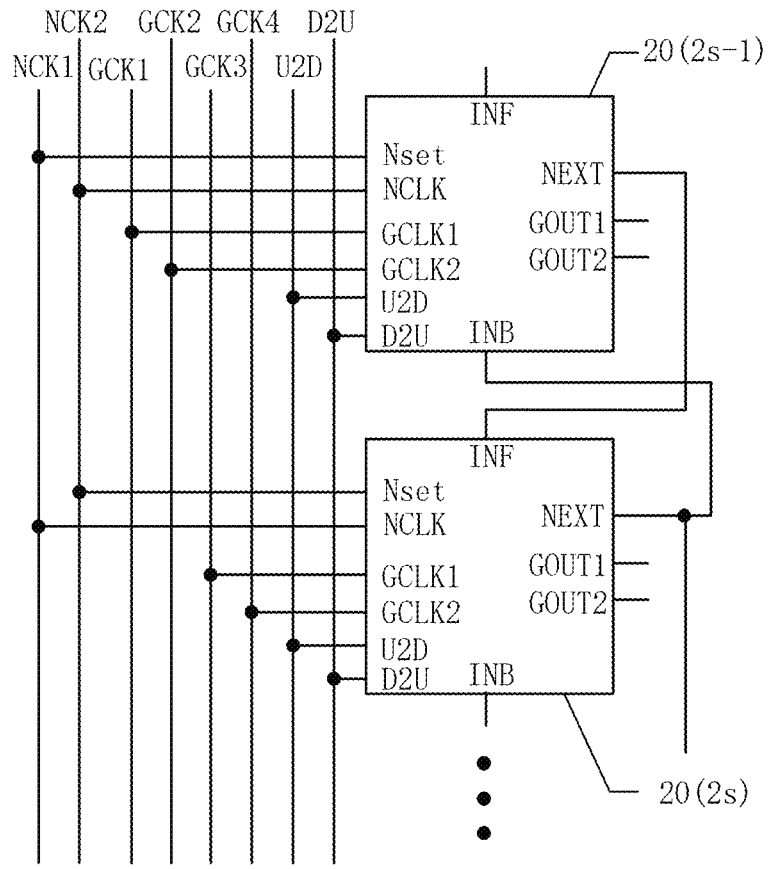
FIG. 24 is a schematic structural diagram of another driving circuit provided in an embodiment of the present application.

Exemplarily, FIG. 24 is a schematic structural diagram of another driving circuit provided by an embodiment of the present application. Referring to FIG. 22-FIG. 24, the stage transmission output ends NEXT of the shift register units 20 at the respective stages sequentially output the valid pulses of the stage transmission signals, and the valid pulses of the stage transmission clock signals received by the stage transmission clock ends NCLK of the adjacent shift register units 20 are shifted in sequence. The enable clock end Nset of the shift register unit 20 at the current stage and the stage transmission clock end NCLK of the shift register unit 20 at one stage in front may be electrically connected to the same clock line, and the stage transmission clock signal of the shift register unit 20 at one stage in front can be used as the enable clock signal of the shift register unit 20 at the current stage, which are conducive to reducing the number of clock lines in the driving circuit 10 and the narrow border and thinness of the display panel.

In another optional embodiment, the shift register unit 20 includes n stage transmission modules 220 and m scanning modules 230, where n<m.

Specifically, the m scanning modules 230 of the shift register unit 20 may be electrically connected to the m scanning lines, which is conducive to reducing the number of shift register units 20 in the driving circuit 10 and reducing the space occupied by the driving circuit 10; by arranging n stage transmission modules 220, n<m, it is also conducive to reducing the space occupied by the shift register units 20, and reducing the number of clock lines, further reducing the space occupied by the driving circuit 10; in addition, combined with the circuit structure of the driving control module 210 shown in FIG. 22, the driving control module 210 requires fewer clock signals, which is conducive to further reducing the number of clock lines.

Referring to FIG. 22-FIG. 24, n=1, the display panel includes a first shift clock line NCK1 and a second shift clock line NCK2; the enable clock end Nset of the shift register unit 20 (2s-1) at a 2s-1-th stage is electrically connected to the first shift clock line NCK1, and the stage transmission clock end NCLK is electrically connected to the second shift clock line NCK2; the enable clock end Nset of the shift register unit 20 (2s) at a 2s-th stage is electrically connected to the second shift clock line NCK2, and the stage transmission clock end NCLK is electrically connected to the first shift clock line NCK1, where s is a positive integer.

Specifically, the driving control module 210 of the shift register unit 20 is only electrically connected to one clock end (enable clock end Nset), and only needs to receive one clock signal (enable clock signal), and the enable clock end Nset may be electrically connected to the stage transmission clock ends NCLK of shift register units 20 at the other stages, and the stage transmission clock signals of the shift register units 20 at the other stages can be used as the enable clock signal. When the shift register unit 20 includes only one stage transmission module 220, the shift register unit 20 includes only one stage transmission clock end NCLK. At this time, combined with the stage transmission clock signals of shift register units 20 at the other stages used as the enable clock signal, and the shift register unit 20 only needs to receive two stage transmission clock signals. Therefore, only two shift clock lines for transmitting the stage transmission clock signals are arranged in the display panel, and the enable clock ends Nset of shift register units 20 at the adjacent stages are electrically connected to different shift clock lines, the stage transmission clock ends NCLK of the shift register units 20 at the adjacent stages are electrically connected to different shift clock lines, and the enable clock end Nset and the stage transmission clock end NCLK of the shift register unit 20 at the same stage are also electrically connected to different shift clock lines.

It can be understood that when the shift register unit 20 includes a stage transmission module 220, no matter how many scanning modules 230 the shift register unit includes, only two shift clock lines for transmitting the stage transmission clock signals may be arranging in the display panel, and there is no need to additionally arrange an enable clock line for transmitting the enable clock signal, so as to realize the driving of the driving control modules 210 and the stage transmission modules 220 in the shift register units 20 at the multi-stage, which is conducive to simplifying the line connection of the driving circuit.

In another optional embodiment, still referring to FIG. 22-FIG. 24, the display panel further includes m first output clock lines (GCK1, GCK2) and m second output clock lines (GCK3, GCK4); the m scanning modules of the shift register unit at the 2s-1 stage are electrically connected to the m first output clock lines (GCK1, GCK2) in one-to-one correspondence respectively; the m scanning modules of the shift register unit at the 2s-th stage are electrically connected to the m second output clock lines (GCK3, GCK4) in one-to-one correspondence respectively.

Specifically, the display panel may include two shift clock lines for transmitting the stage transmission clock signals and 2m output clock lines for transmitting the scanning clock signals, where the valid pulses of the stage transmission clock signal on the first shift clock line and the valid pulses of the stage transmission clock signal on the second shift clock line appear alternately in sequence; in one cycle of all scanning clock signals, the valid pulses of the 2m scanning clock signals on the 2m output clock lines are shifted in sequence and do not overlap. The shift register unit 20 is electrically connected to m scanning lines SL. When the shift register unit 20 is capable of outputting m scanning signals and the m scanning signals all include valid pulses, the valid pulses of the m scanning signals output by the shift register unit 20 are shifted in sequence, and the last valid pulse of the m scanning signals output by the shift register unit at the 2s-1-th stage is located before the first valid pulse of the m scanning signals output by the shift register unit at the 2s-th stage.

Optionally, the driving circuit further includes a global scanning unit, which is configured to control the first node of each shift register unit to be at an inactive level, and to control the signals at the stage transmission output end and the scanning output end of each shift register unit to be at active levels under the control of a first global control signal.

Specifically, when the first global control signal is at an active level, the global scanning unit transmits an inactive level to the first node of each shift register unit, and transmits active levels to the stage transmission output end and the scanning output end of each shift register unit, so that the switch devices in all pixels are turned on, and all pixels can receive the data signals transmitted on the data lines. In this way, all pixels can be controlled to reach the same state, and global refresh is achieved.

Exemplarily, when the display panel is actually used, if the display panel is abnormally powered off or enters a low-power sleep mode, the active level of the first global control signal can be provided to the global scanning unit of the driving circuit, so that all pixels are written with a zero-grayscale data signal, and all pixels are not illuminated, which can reduce power consumption and save electricity; when the display panel is a liquid crystal display, the active level of the first global control signal can be provided to the global scanning unit of the driving circuit, so that all pixels are written with a zero-grayscale data signal, and the liquid crystal is controlled to be in an undeflected state, which can avoid liquid crystal polarization and improve display quality.

Figure 25:
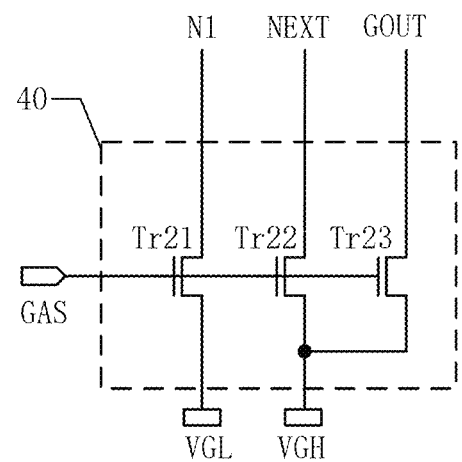
FIG. 25 is a schematic structural diagram of a global scanning unit provided in an embodiment of the present application.

In an optional embodiment, FIG. 25 is a schematic structural diagram of a global scanning unit provided by an embodiment of the present application. Referring to FIG. 25, the global scanning unit 40 includes a first scanning transistor Tr21, a second scanning transistor Tr22 and a third scanning transistor Tr23; the gates of the first scanning transistor Tr21, the second scanning transistor Tr22 and the third scanning transistor Tr23 are all electrically connected to the first global control end GAS to receive a first global control signal; a first electrode of the first scanning transistor Tr21 is electrically connected to the first fixed potential end VGL, and a second electrode of the first scanning transistor Tr21 is electrically connected to the first node N1 of each shift register unit 20; a first electrode of the second scanning transistor Tr22 is electrically connected to the second fixed potential end VGH, and a second electrode of the second scanning transistor Tr22 is electrically connected to the stage transmission output end NEXT of each shift register unit 20; a first electrode of the third scanning transistor Tr23 is electrically connected to the second fixed potential end VGH, and a second electrode of the third scanning transistor Tr23 is electrically connected to the scanning output end GOUT of each shift register unit 20.

Exemplarily, taking an example that the active levels are all high levels, the inactive levels are all low levels, and the potential of the first fixed potential end VGL is at a low level, and the potential of the second fixed potential end VGH is at a high level. When the first global control signal of the first global control end GAS is at a high level, the first scanning transistor Tr21, the second scanning transistor Tr22 and the third scanning transistor Tr23 are turned on, so that the potential of the first node N1 of each shift register unit 20 is the low level of the first fixed potential end VGL, and the stage transmission output end NEXT and the scanning output end GOUT of each shift register unit 20 are controlled to be unable to output the low level of the first fixed potential end VGL; and the stage transmission output end NEXT and the scanning output end GOUT of each shift register unit 20 are both at high levels, in this way, the switch devices in all pixels can be controlled to be turned on and written with the same data signal.

It can be understood that when a shift register unit 20 includes multiple stage transmission modules 220, the global scanning unit 40 may include multiple second scanning transistors Tr22; when a shift register unit 20 includes multiple scanning modules 230, the global scanning unit 40 may include multiple third scanning transistors Tr23.

In one embodiment, the second scanning transistor Tr22 may be used as the third scanning transistor Tr23.

Optionally, the driving circuit also includes a global reset unit; the global reset unit is configured to control the signals of the stage transmission output end and the scanning output end of each shift register unit to be at inactive levels under the control of the second global control signal.

Specifically, when the second global control signal is at an active level, the global reset unit transmits inactive levels to the stage transmission output end and the scanning output end of each shift register unit, so that the switch devices in all pixels are turned off, and all pixels stop receiving the data signals transmitted on the data line. In this way, the scanning signals output by all shift register units can be controlled to be reset to an inactive level at the same time, thereby achieving global reset.

Exemplarily, in actual application, before and/or after the driving circuit works, the display panel can provide the active level of the second global control signal to the global reset unit of the driving circuit, so that all pixels stop being written with data signals, which can avoid the abnormal signals of part of the stage transmission output ends and the scanning output ends that affect the display effect; in addition, the display panel can also include detection units such as gesture detection units and touch detection units. When the detection units are working, in order to avoid signal interference, all clock signals need to jump to inactive levels, which may make the signals of the stage transmission output ends and scanning output ends of part of the shift register units unable to reset. By providing the active level of the second global control signal to the global reset unit of the driving circuit, the signals of the stage transmission output ends and scanning output ends of all shift register units can be reset, that is, the driving circuit is controlled not to work, so as to avoid the driving circuit interfering with the stage transmission signal, scanning signal and data signal when the detection units work, which would otherwise cause abnormal pixel refresh and abnormal data signal writing that affect the display and driving functions of the display panel.

In an optional embodiment, FIG. 26 is a schematic structural diagram of a global reset unit provided by an embodiment of the present application. Referring to FIG. 26, the global reset unit 50 includes a fourth scanning transistor Tr24 and a fifth scanning transistor Tr25; gates of the fourth scanning transistor Tr24 and the fifth scanning transistor Tr25 are both electrically connected to the second global control end Greset to receive the second global control signal; first electrodes of the fourth scanning transistor Tr24 and the fifth scanning transistor Tr25 are both electrically connected to the first fixed potential end VGL; a second electrode of the fourth scanning transistor Tr24 is electrically connected to the stage transmission output end NEXT of each shift register unit 20; a second electrode of the fifth scanning transistor Tr25 is electrically connected to the scanning output end GOUT of each shift register unit 20.

Exemplarily, taking an example that the active levels are all high levels, the inactive levels are all low levels, and the potential of the first fixed potential end VGL is at a low level. When the second global control signal of the second global control end Greset is at a high level, the fourth scanning transistor Tr24 and the fifth scanning transistor Tr25 are turned on, so that the stage transmission output end NEXT and the scanning output end GOUT of each shift register unit 20 are at a low level, and all pixels are controlled to be turned off and stop being written with data signals.

It can be understood that when a shift register unit 20 includes multiple stage transmission modules 220, the global reset unit 50 may include multiple fourth scanning transistors Tr24; when a shift register unit 20 includes multiple scanning modules 230, the global reset unit 50 may include multiple fifth scanning transistors Tr25.

In one embodiment, the fourth scanning transistor Tr24 may be used as the fifth scanning transistor Tr25.

Based on the same inventive concept, an embodiment of the present application also provides a display panel driving method, which can be used to drive the display panel provided by any embodiment of the present application. FIG. 27 is a flowchart of a method for driving a display panel provided by an embodiment of the present application. Referring to FIG. 27, the driving method includes S1001 and S1002.

In S1001, in a refresh phase, the stage transmission output ends and the scanning output ends of part of the shift register units are controlled to output valid pulses.

In S1002, in a holding phase, the stage transmission output ends of part of the shift register units are controlled to output valid pulses, and the scanning output ends of the part of the shift register units are controlled to output inactive levels.

The display panel includes a multi-frequency driving mode. In the multi-frequency driving mode, different areas of the display panel have different refresh frequencies. For example, the display area includes a low-frequency display area and a high-frequency display area. The refresh frequency of the pixels located in the low-frequency display area is less than the refresh frequency of the pixels located in the high-frequency display area. At least a part of display frames of the multi-frequency driving mode are a first display frame. In the first display frame, the pixels located in the low-frequency display area are not refreshed, and the grayscale of the previous display frame is maintained. The pixels located in the high-frequency display area are refreshed to the grayscale of the current display frame. The first display frame includes a refresh phase and a holding phase, where the refresh phase refers to a phase in which the driving circuit can output a valid pulse of a scanning signal and control at least a part of pixels to refresh; the holding phase refers to a phase in which the driving circuit cannot output the valid pulse of the scanning signal and can control at least a part of pixels to stop refreshing and maintain the grayscale of the previous display frame. In both the refresh phase and the holding phase, the shift register units are driven.

Figure 28:
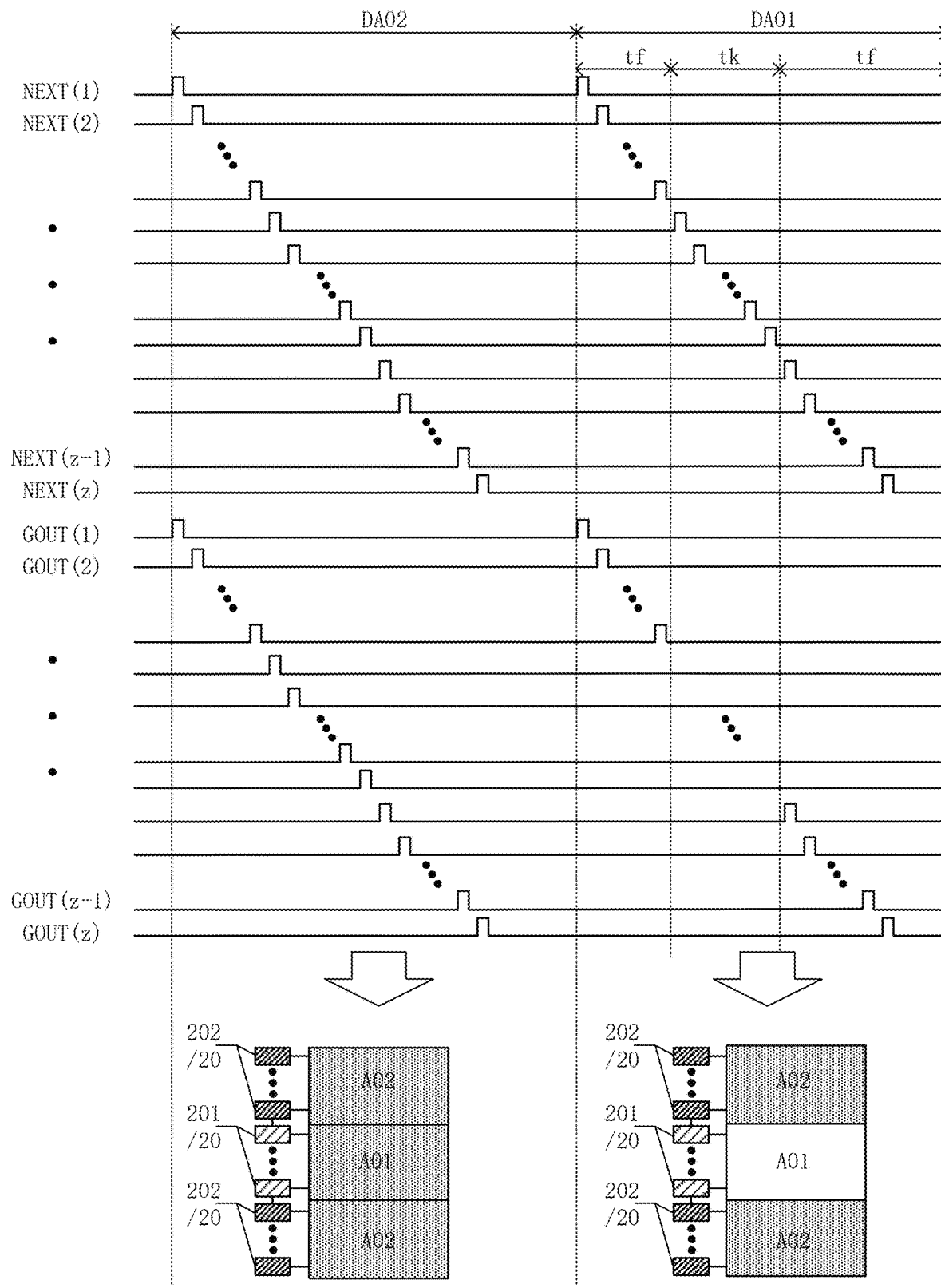
FIG. 28 is a timing sequence diagram of a display panel in a multi-frequency driving mode provided in an embodiment of the present application.

Exemplarily, taking an example that the active levels are all high levels, the inactive levels are all low levels, FIG. 28 is a timing sequence diagram of a display panel in a multi-frequency driving mode provided by an embodiment of the present application. Referring to FIG. 28, in a refresh phase tf of a first display frame DA01, by controlling the stage transmission output ends NEXT and the scanning output ends GOUT of part of the shift register units 20 to output valid pulses, the part of the shift register units 20 can control the refresh of part of the pixels, so that the part of the pixels P can be refreshed at a higher frequency. At the same time, the part of the shift register units 20 can sequentially output the valid pulses of the stage transmission signals to achieve the sequential shifting of the valid pulses of the starting input signals, that is, to achieve the sequential driving of the part of the shift register units 20, so that the part of the shift register units 20 can sequentially output the valid pulses of the scanning signals to achieve progressive scanning.

In a holding phase tk of the first display frame DA01, by controlling the stage transmission output ends of part of the shift register units to output valid pulses and the scanning output ends of the part of the shift register units to output inactive levels, the part of the shift register units 20 can control part of the pixels to stop refreshing, so that the part of the pixels P can be refreshed at a lower frequency to achieve multi-frequency driving; at the same time, the part of the shift register units 20 can still sequentially output the valid pulses of the stage transmission signals to achieve the sequential shifting of the valid pulses of the starting input signals, so that the shift register units 20 at subsequent stages can still receive the shifted starting input signals in sequence, that is, the shift register units 20 at the subsequent stages can still be driven in sequence, so that the shift register units 20 at the subsequent stages can be driven in sequence and output the valid pulses of the scanning signals in sequence to realize different frequencies in different areas with refreshment of the display panel 001.

In the embodiments of the present application, in the refresh phase, the stage transmission output ends and the scanning output ends of part of the shift register units are controlled to output valid pulses, so that part of the pixels can be refreshed at a higher frequency, meeting the higher refresh frequencies requirements of the smooth display of some areas; in the holding phase, the stage transmission output ends of part of the shift register units are controlled to output valid pulses, and the scanning output ends of the part of the shift register units are controlled to output inactive levels, so that the scanning output ends of the part of the shift register units can be controlled to stop outputting the valid pulses of the scanning signals, thereby reducing the refresh frequencies of the pixels in some areas, and reducing the power consumption of the display panel; at the same time, when the scanning output ends of the part of the shift register units stop outputting the valid pulses of the scanning signals, the stage transmission modules of the part of the shift register units can still output valid pulses, ensuring that the starting input signals of the part of the shift register units can continue to be shifted, so that the shift register units at the subsequent stages can still be driven in sequence and output the valid pulses of the scanning signals in sequence, while reducing the refresh frequencies of the pixels in some areas, it can also meet the higher requirements of the refresh frequencies for smooth display in some areas, thereby reducing the power consumption of the display panel under the premise of ensuring the display quality.

In an optional embodiment, in the first display frame, part of the shift register units are a first shift register unit, and part of the shift register units are a second shift register unit; in the refresh phase, the controlling the stage transmission output ends and the scanning output ends of part of the shift register units to output valid pulses includes: in the refresh phase, controlling the stage transmission output ends and the scanning output ends of the first shift register units to be at inactive levels, and controlling the stage transmission output ends and the scanning output ends of the second shift register units to output valid pulses; in the holding phase, the controlling the stage transmission output ends of part of the shift register units to output valid pulses, and the scanning output ends of the part of the shift register units to be at inactive levels includes: in the holding phase, controlling the stage transmission output ends of the first shift register units to output valid pulses, the scanning output ends of the first shift register units to be at inactive levels, and the stage transmission output ends and scanning output ends of the second shift register units to be at inactive levels.

Specifically, referring to FIG. 28, the first shift register unit 201 refers to the shift register unit 20 electrically connected to the pixels located in the low-frequency display area A01, and the second shift register unit 202 refers to the shift register unit 20 electrically connected to the pixels located in the high-frequency display area A02. The refresh phase tf is a phase in which the second shift register unit 202 is driven. In the refresh phase tf, the second shift register unit 202 receives the valid pulse of the starting input signal, and controls the stage transmission output end NEXT and the scanning output end GOUT of the second shift register unit 202 to output valid pulse, so that the pixels located in the high-frequency display area A02 can be written with data signals and refreshed; in the refresh phase tf, the first shift register unit 201 does not receive the valid pulse of the starting input signal, the first shift register unit 201 is not driven, and the stage transmission output end NEXT and the scanning output end GOUT of the first shift register unit 201 are both at inactive levels.

The holding phase tk is a phase in which the first shift register unit 201 is driven. In the holding phase tk, the first shift register unit 201 receives the valid pulse of the starting input signal, and controls the stage transmission output end NEXT of the first shift register unit 201 to output the valid pulse and the scanning output end GOUT to be at an inactive level, so that the pixels located in the low-frequency display area A01 cannot be written with data signals, and the pixels located in the low-frequency display area A02 maintain the grayscale of the previous display frame; in the holding phase tk, the second shift register unit 202 does not receive the valid pulse of the starting input signal, the second shift register unit 202 is not driven, the stage transmission output end NEXT and the scanning output end GOUT of the second shift register unit 202 are both at inactive levels, and the pixels located in the high-frequency display area A02 can be written with data signals for refreshment before the holding phase tk and/or after the refresh phase tf of the same first display frame DA01.

In this way, no matter in the refresh phase tf or the holding phase tk, the stage transmission output end NEXT of the shift register unit 20 at each of stages can output a valid pulse of the stage transmission signal. Although in the first display frame DA01, the scanning output end GOUT of the first shift register unit 201 is always at an inactive level and the scanning output end GOUT of the second shift register unit 202 can output a valid pulse, the stage transmission output ends NEXT of the first shift register unit 201 and the second shift register unit 202 can output valid pulses of the stage transmission signals, so that the starting input signals of the first shift register unit 201 and the second shift register unit 202 can be shifted normally, without affecting the sequential shifting of the starting input signals between the first shift register unit 201 and the second shift register unit 202. The shift register units 20 at the respective stages can be driven in sequence, so that the scanning output ends GOUT of the shift register units 20 at the respective stages can selectively output valid pulses according to the driving method. According to the driving method of the display panel, in the first display frame DA01, the first shift register unit 201 may be any shift register unit 20, and the second shift register unit 202 may also be any shift register unit 20. According to actual needs, it can be selected in the first display frame DA01 which shift register units 20 can be the first shift register units 201 whose scanning signals are always at inactive levels, and which shift register units 20 can be the second shift register units 202 that can output valid pulses of the scanning signals, that is, according to actual needs, which areas are selected as high-frequency display areas A02, and the pixels of the high-frequency display areas A02 can be refreshed at a high frequency, and which areas are selected as low-frequency display areas A01, and the pixels of the low-frequency display areas A01 can be refreshed at a low frequency, so as to realize the different frequencies in different areas with refreshment of the display panel, thereby reducing the power consumption of the display panel while ensuring the display quality.

On the basis of the above-mentioned embodiments, still referring to FIG. 28, part of the display frames of the multi-frequency driving mode are a second display frame DA02; the multi-frequency driving mode includes a plurality of driving cycles; the driving cycle includes the second display frame DA02 and the first display frame DA01; in the same driving cycle, the second display frame DA02 is located before the first display frame DA01; the driving method also includes: in the second display frame DA02, controlling the stage transmission output ends NEXT and the scanning output ends GOUT of the first shift register units 201 to output valid pulses, and controlling the stage transmission output ends NEXT and the scanning output ends GOUT of the second shift register units 202 to output valid pulses.

Specifically, in the same display cycle, in the second display frame DA02, the scanning output ends GOUT of the first shift register units 201 and the second shift register units 202 can output valid pulses, and the pixels in the high-frequency display area A02 and the pixels in the low-frequency display area A01 can receive valid pulses of the scanning signals, so that the pixels in the high-frequency display area A02 and the pixels in the low-frequency display area A01 can be rewritten with the data signals; in the first display frame DA01, only the scanning output end GOUT of the second shift register unit 202 can output valid pulses, and the pixels in the high-frequency display area A02 can be rewritten with the data signals, while the pixels in the low-frequency display area A01 cannot be rewritten with the data signals, so that the pixels in the low-frequency display area A01 continue to maintain the grayscale of the second display frame DA02.

Exemplarily, taking an example that the display cycle includes a second display frame DA02 and a first display frame DA01, still referring to FIG. 28, the pixels located in the high-frequency display area A02 can be rewritten with the data signals in each display frame, and the pixels located in the low-frequency display area A01 can be rewritten with the data signals only in the second display frame DA02. The refresh frequency of the pixels located in the high-frequency display area A02 is twice the refresh frequency of the pixels located in the low-frequency display area A01, and the refresh frequency of the pixels located in the low-frequency display area A01 is reduced to ½ of the refresh frequency of the pixels located in the high-frequency display area A02.

It can be understood that when the display cycle includes a second display frame DA02 and d first display frames DA01, the refresh frequency of the pixels located in the low-frequency display area A01 is reduced to 1/(d+1) of the refresh frequency of the pixels located in the high-frequency display area A02; where d is a positive integer.

Figure 29:
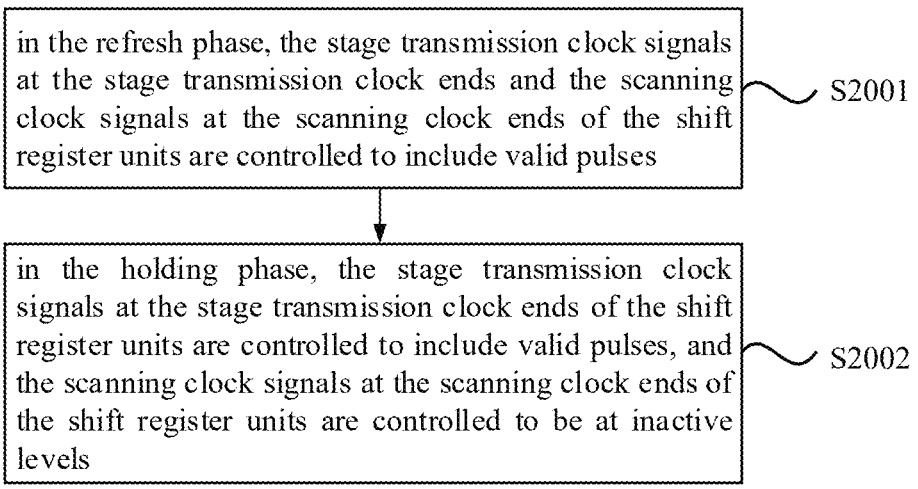
FIG. 29 is a flowchart of another method for driving the display panel provided in an embodiment of the present application.

Optionally, FIG. 29 is a flowchart of another method for driving a display panel provided by an embodiment of the present application. Referring to FIG. 29, the driving method includes S2001 and S2002.

In S2001, in the refresh phase, the stage transmission clock signals at the stage transmission clock ends and the scanning clock signals at the scanning clock ends of the shift register units are controlled to include valid pulses.

In S2002, in the holding phase, the stage transmission clock signals at the stage transmission clock ends of the shift register units are controlled to include valid pulses, and the scanning clock signals at the scanning clock ends of the shift register units are controlled to be at inactive levels.

Figure 30:
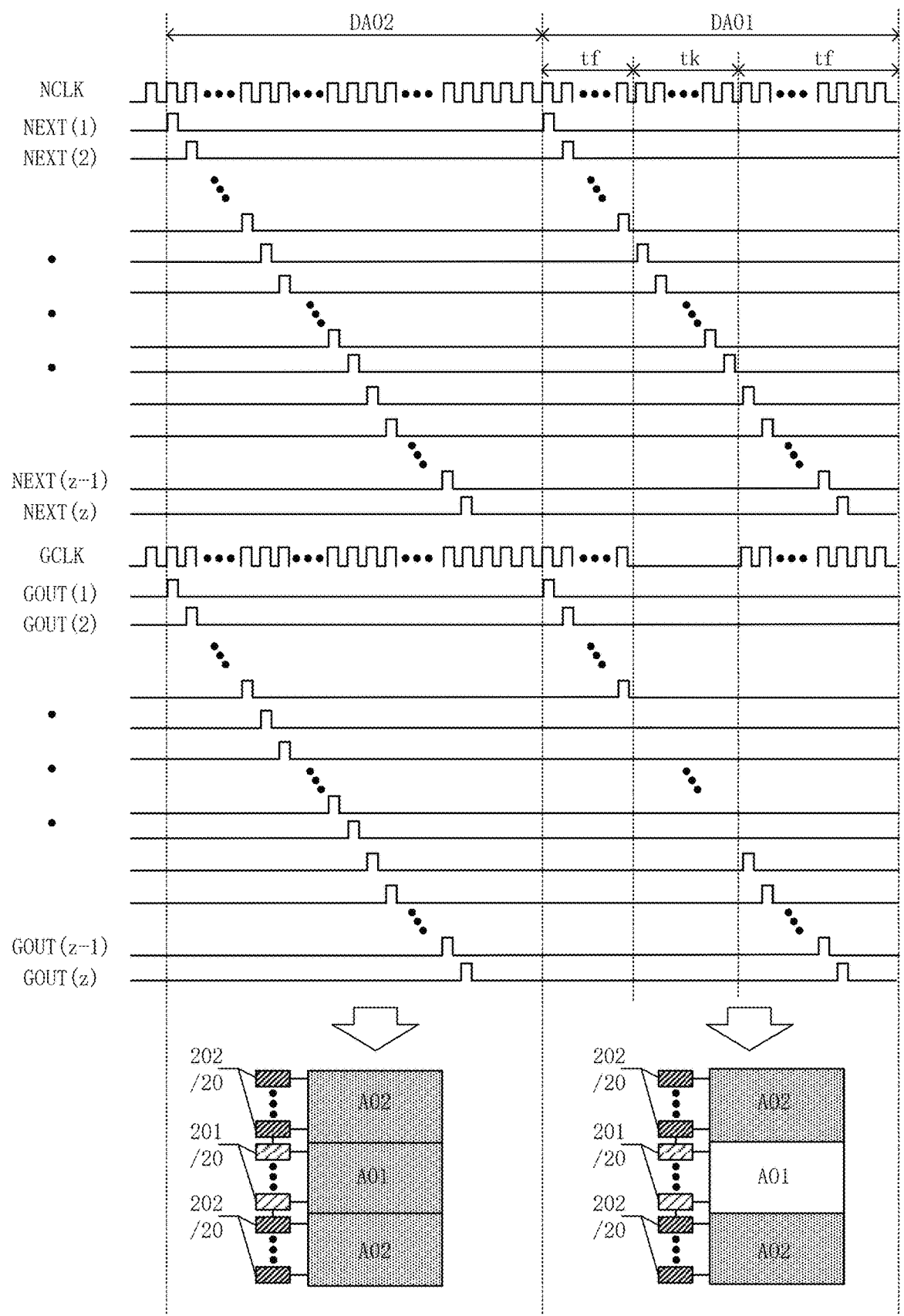
FIG. 30 is a timing sequence diagram of another display panel in the multi-frequency driving mode provided in an embodiment of the present application.

Exemplarily, taking an example that the active levels are high levels, and the inactive level are low levels, FIG. 30 is a timing sequence diagram of another display panel in a multi-frequency driving mode provided by an embodiment of the present application. Referring to FIG. 30, in the refresh phase tf, the stage transmission clock end NCLK of the shift register unit 20 at each of the stages can receive the valid pulse of the stage transmission clock signal, the scanning clock end GLK can receive the valid pulse of the scanning clock signal, and the stage transmission output end NEXT and the scanning output end GOUT of the driven second shift register unit 202 can output the valid pulses, so that part of the pixels can be refreshed; in the holding phase tk, the stage transmission clock end NCLK of the shift register unit 20 at each of the stages can receive the valid pulse of the stage transmission clock signal, the scanning clock end GLK can receive the inactive level of the scanning clock signal, the stage transmission output end NEXT of the driven first shift register unit 201 can output the valid pulse, and the scanning output end GOUT outputs the inactive level, so that part of the pixels stop refreshing and maintain the grayscale of the previous display frame. In this way, only by controlling the scanning clock signal of the scanning clock end GCLK of the shift register unit 20 at each of the stages, the potential of the scanning signal of the scanning output end GOUT of the shift register unit 20 can be controlled, thereby realizing the different frequencies in different areas with refreshment of display panel, which is conducive to reducing the signals required by the display panel and the corresponding signal connection, and is conducive to simplifying the timing sequence and circuit.

Exemplarily, in actual application, the stage transmission clock end NCLK and the scanning clock end GCLK of the shift register unit 20 can be electrically connected to the display driver chip (not shown in the figure), and the stage transmission clock signal of the stage transmission clock end NCLK and the scanning clock signal of the scanning clock end GCLK of the shift register unit 20 at each of the stages can be controlled by the display driver chip.

Figure 31:
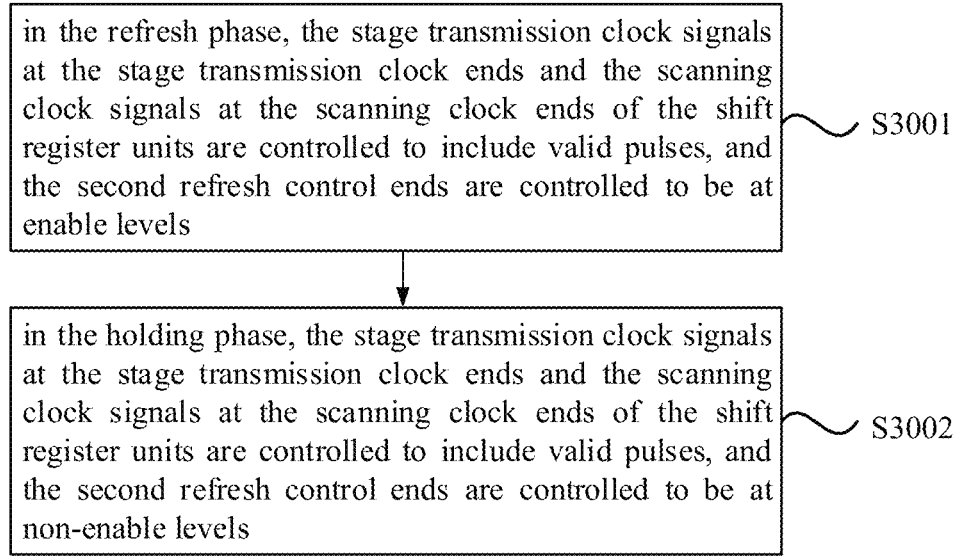
FIG. 31 is a flowchart of another method for driving the display panel provided in an embodiment of the present application.

Optionally, the scanning module 230 includes a second refresh control end Goff2. FIG. 31 is a flowchart of another method for driving a display panel provided by an embodiment of the present application. Referring to FIG. 31, the driving method includes S3001 and S3002.

In S3001, in the refresh phase, the stage transmission clock signals at the stage transmission clock ends and the scanning clock signals at the scanning clock ends of the shift register units are controlled to include valid pulses, and the second refresh control ends are controlled to be at enable levels.

In S3002, in the holding phase, the stage transmission clock signals at the stage transmission clock ends and the scanning clock signals at the scanning clock ends of the shift register units are controlled to include valid pulses, and the second refresh control ends are controlled to be at non-enable levels.

Specifically, the second refresh control end Goff2 is an enable end of the scanning module 230. When the signals received by other ports of the scanning module 230 are the same, the potential of the scanning output end GOUT can be controlled by controlling the potential of the second refresh control end Goff2.

Figure 32:
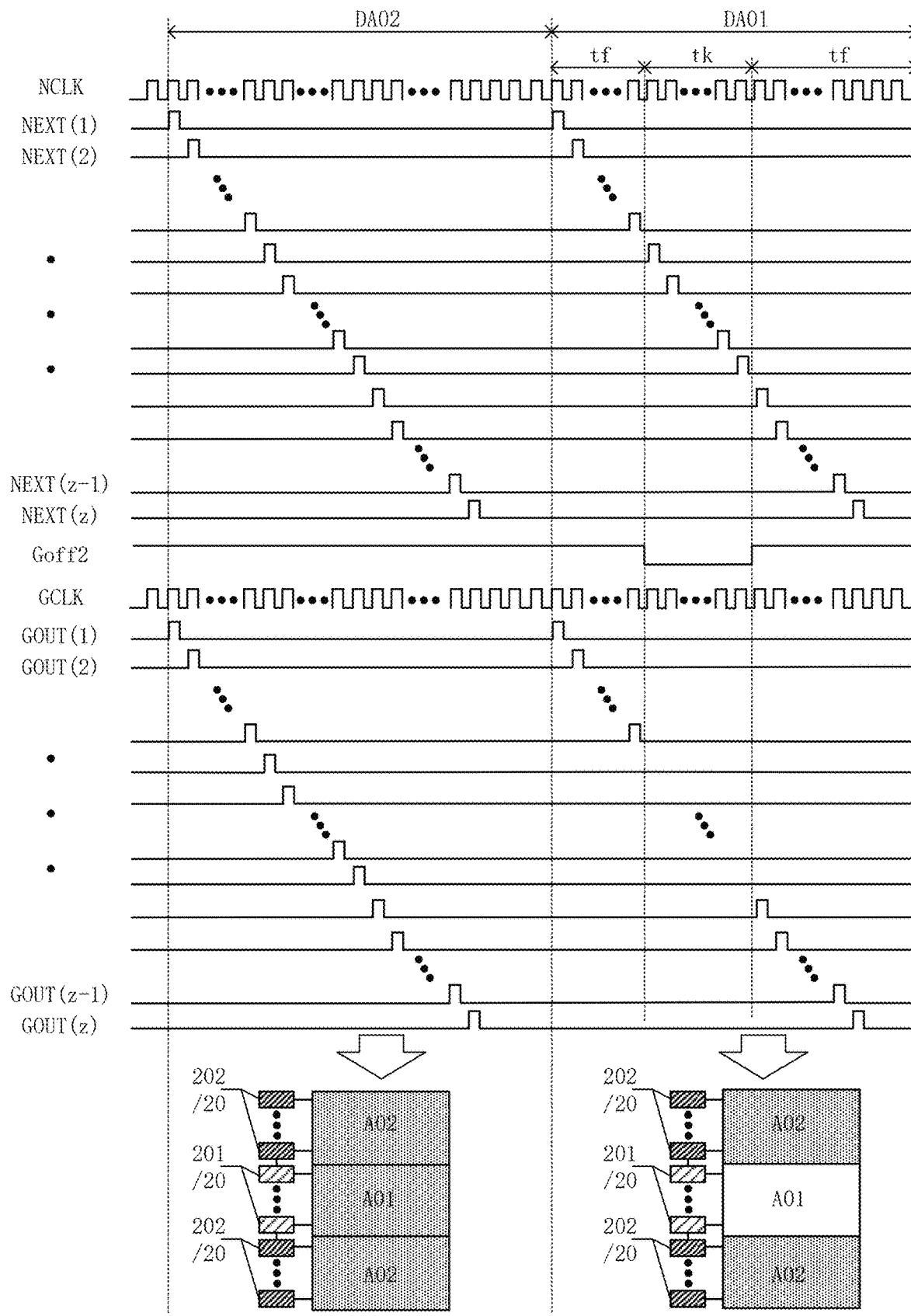
FIG. 32 is a timing sequence diagram of another display panel in the multi-frequency driving mode provided in an embodiment of the present application.

Exemplarily, taking an example that the active level and the enable level are high levels, the inactive level and the non-enable level are low levels, and the potential of the first fixed potential end VGL is at a low level, FIG. 32 is a timing sequence diagram of another display panel in a multi-frequency driving mode provided by an embodiment of the present application. Referring to FIG. 32, in the refresh phase tf, the second refresh control end Goff2 of shift register unit 20 at each of the stages is at an enabled high level, and the scanning module 230 of the driven second shift register unit 202 can output the scanning clock signal of the scanning clock end GCLK as a scanning signal, so that the pixels electrically connected to the second shift register unit 202 can be refreshed; in the holding phase tk, the second refresh control end Goff2 of shift register unit 20 at each of the stages is at a non-enabled low level, and the scanning module 230 of the driven first shift register unit 201 can output the low level of the first fixed potential end VGL as a scanning signal, so that part of the pixels electrically connected to the first shift register unit 201 stop refreshing and maintain the grayscale of the previous display frame.

In this way, the potential of the scanning signal at the scanning output end GOUT of the shift register unit 20 can be controlled by controlling the potential of the second refresh control end Goff2, thereby realizing the different frequencies in different areas with refreshment, and no special design is required for other signals. For example, the scanning clock signal received by the scanning module 230 can be periodically jumped all the time, and there is no need to control the scanning clock signal to be an inactive level during a certain period of time, which is conducive to simplifying the design of the clock part in the display driver chip. The clock part of the driver chip can jump normally all the time without changing its jumping rules, which is conducive to reducing development costs and shortening development cycles.

Exemplarily, the second refresh control ends Goff2 of all scanning modules 230 of all shift register units 20 can be electrically connected to the same signal line, and the signal line can be electrically connected to the display driver chip (not shown in the figure), and the potential of the second refresh control end Goff2 of each scanning module 230 in the shift register unit 20 at each of the stages can be controlled by the display driver chip.

Optionally, the shift register unit includes m scanning modules; m is an integer greater than or equal to 2; in the refresh phase, the controlling the stage transmission output ends and the scanning output ends of part of the shift register units to output valid pulses includes: in the refresh phase, providing stage transmission clock signal to the stage transmission clock end of the shift register unit, and providing m scanning clock signals to the m scanning clock ends of the shift register unit; where in the refresh phase, the valid pulses of the multiple scanning clock signals provided to the same one of the shift register units do not overlap; in the same one of the shift register units, the valid pulses of the stage transmission clock signal provided to the stage transmission clock end overlap the valid pulses of at least one scanning clock signal.

Exemplarily, taking an example that m=2, and the active levels are high levels, FIG. 33 is a timing sequence diagram of a shift register unit in a refresh phase provided by an embodiment of the present application. Referring to FIG. 33, in the refresh phase, the valid pulses of the stage transmission clock signal of the stage transmission clock end NCLK at the stage transmission module 220 may overlap the valid pulses of the scanning clock signals of the scanning clock ends GCLK1, GCLK2. When the stage transmission output end NEXT of the stage transmission module 220 outputs the valid pulses of the stage transmission clock end NCLK, the scanning output ends GOUT1, GOUT2 of the scanning module 230 may also output the valid pulses of the scanning clock ends GCLK1, GCLK2. By setting the valid pulses of the stage transmission clock signal to overlap the valid pulses of at least one scanning clock signal, in the refresh phase, a time period of the stage transmission clock signal of the stage transmission clock end NCLK output by the stage transmission module 220 and a time period of the scanning clock signal of the scanning clock end GCLK1 or GCLK2 output by the scanning module 230 can overlap. In this way, when the stage transmission module 220 stops outputting the stage transmission clock signal of the stage transmission clock end NCLK, the scanning module 230 can output a complete valid pulse, and when the scanning module 230 stops outputting the scanning clock signal of the scanning clock end GCLK1 or GCLK2, the stage transmission module 220 can output a complete valid pulse, thereby avoiding a large difference between the valid time periods of the valid pulses of the stage transmission clock signal and the valid pulses of the scanning clock signal, resulting in the stage transmission module 220 or the scanning module 230 being unable to output a complete valid pulse.

Optionally, the driving circuit further includes a global reset unit; the global reset unit is configured to control the signals of the stage transmission output end and the scanning output end of each shift register unit to be at inactive levels under the control of the second global control signal. FIG. 34 is a flowchart of another method for driving a display panel provided by an embodiment of the present application. Referring to FIG. 34, the driving method includes S4001, S4002 and S4003.

In S4001, in the refresh phase, the stage transmission output ends and the scanning output ends of part of the shift register units are controlled to output valid pulses.

In S4002, in the holding phase, the stage transmission output ends of part of the shift register units are controlled to output valid pulses, and the scanning output ends of part of the shift register units are controlled to be at inactive levels.

In S4003, in a phase between the refresh phase and the holding phase, the second global control signals are controlled to jump to active levels.

Exemplarily, in the holding phase, in order to control the scanning output ends of part of the shift register units to stop outputting valid pulses, it is necessary to change the potentials of part of the signals provided to the shift register units, which may affect the working processes of the shift register units, such as affecting the process of resetting the potentials of the scanning output ends of part of the shift register units from active levels to inactive levels, so that the potentials of the scanning output ends of part of the shift register units cannot be restored to inactive levels, resulting in multiple rows of pixels to be written with data signals at the same time, and abnormal display. By controlling the second global control signals to jump to active levels in the phase between the refresh phase and the holding phase, the potentials of the stage transmission output ends and the scanning output ends of the shift register units at the respective stages can be reset to inactive levels, thereby preventing the potentials of the scanning output ends of the shift register units at the respective stages from being unable to be restored to inactive levels and display abnormality.

Furthermore, the display panel also includes a gesture detection circuit (not shown in the figure); the first display frame also includes a detection phase, the detection phase is located between the refresh phase and the holding phase; in a phase between the refresh phase and the holding phase, the controlling the second global control signals to jump to active levels includes: in the detection phase, controlling the gesture detection circuit to work, and controlling the stage transmission clock ends and the scanning clock ends of all the shift register units to be at inactive levels, and the second global control signals jump to active levels.

Exemplarily, in the detection phase, the gesture detection circuit may output a gesture detection signal. The gesture detection signal needs to continuously jump rapidly to detect gestures. To avoid signal interference, all clock signals need to be pulled low, which may cause the stage transmission signals at the stage transmission output ends and the scanning signals at the scanning output ends of the shift register units to be unable to be pulled low. By jumping the second global control signals to active levels, the stage transmission signals at the stage transmission output ends and the scanning signals at the scanning output ends of the shift register units can be reset to inactive levels to avoid abnormal display.

In one embodiment, the driving method further includes: in the phase between the refresh phase and the holding phase, and before the detection phase, controlling the stage transmission clock ends and the scanning clock ends of all shift register units to be at inactive levels, and the second global control signals to jump to active levels. In this way, after the refresh phase or the holding phase ends, the stage transmission signals at the stage transmission output ends and the scanning signals at the scanning output ends can be quickly reset to improve the display effect.

The display panel driving method provided in the embodiments of the present application and the display panel provided in any embodiment of the present application have the corresponding technical features and beneficial effects of the display panel. For the contents not described in detail in the embodiments of the display panel driving method, referring to the descriptions of the display panel above, which are not be repeated here; similarly, the display panel in the embodiments of the present application also has the functional modules and beneficial effects capable of executing the display panel driving method provided in the embodiments of the present application. For the contents not described in detail in the embodiments of the display panel, referring to the descriptions of the display panel driving method above, which are not be repeated here.

Figure 35:
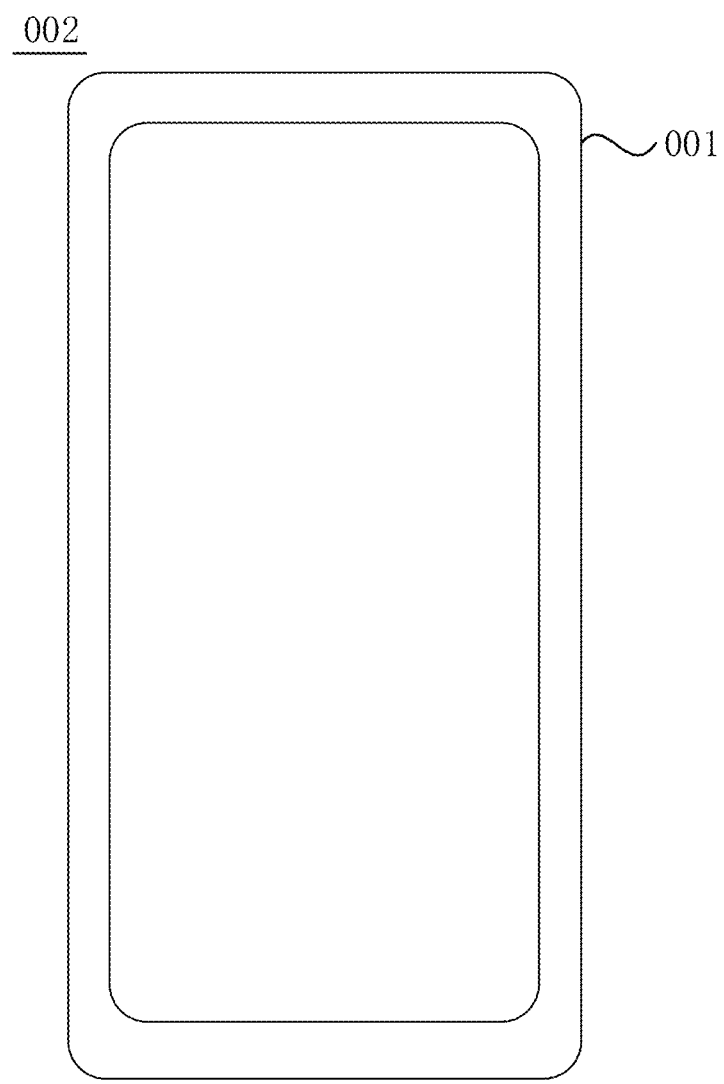
FIG. 35 is a schematic structural diagram of a display device provided in an embodiment of the present application.

Based on the same inventive concept, the embodiments of the present application also provides a display device. FIG. 35 is a schematic structural diagram of a display device provided in the embodiments of the present application. As shown in FIG. 35, the display device 002 includes a display panel 001 provided in any embodiment of the present application. The display device 002 provided in the embodiments of the present application may be a mobile phone as shown in FIG. 35, or may be any electronic product with a display function, including but not limited to the following categories: televisions, laptops, desktop displays, tablet computers, digital cameras, smart bracelets, smart glasses, vehicle displays, medical equipment, industrial control equipment, touch interactive ends, etc., which is not specially limited in the embodiments of the present application.

Note that the above are only preferred embodiments of the present application and the technical principles used. Those skilled in the art may understand that the present application is not limited to the specific embodiments herein, and that various obvious changes, readjustments and substitutions can be made by those skilled in the art without departing from the scope of protection of the present application. Therefore, although the present application is described in detail through the above embodiments, the present application is not limited to the above embodiments, and may include more other equivalent embodiments without departing from the concept of the present application, and the scope of the present application is determined by the scope of the appended claims.

What is claimed is:

1. A display panel, comprising a driving circuit including a plurality of cascaded shift register units, each of which comprises a driving control module, at least one stage transmission module and at least one scanning module;

the driving control module comprising at least a starting input end, a scanning control end, a first node and a second node;

the stage transmission module comprising a first input end, a second input end, a first level end, a stage transmission clock end and a stage transmission output end; the first input end being electrically connected to the first node, the second input end being electrically connected to the second node; the first level end being electrically connected to a first fixed potential end; wherein the stage transmission output end of the shift register unit at an i-th stage is electrically connected to the starting input end of the shift register unit at a j-th stage, i≠j, and i and j are both positive integers; and the scanning module comprising a third input end, a fourth input end, a second level end, a scanning clock end and a scanning output end; the third input end being electrically connected to the first node; the second level end being electrically connected to the first fixed potential end.

2. The display panel according to claim 1, wherein in the same one of shift register units, the stage transmission clock end is not connected to the scanning clock end.

3. The display panel according to claim 2, wherein the driving circuit comprises a plurality of output clock lines, a plurality of first clock ends, a plurality of switches and a first refresh control end;

an input end of the switch is electrically connected to the first clock end; an output end of the switch is electrically connected to the output clock line electrically connected to the scanning clock ends of at least two of the shift register units; a control end of the switch is electrically connected to the first refresh control end.

4. The display panel according to claim 3, wherein the switch comprises a first switch transistor and a second switch transistor;

a first electrode of the first switch transistor is electrically connected to the first clock end; a second electrode of the first switch transistor is electrically connected to the output clock line;

a first electrode of the second switch transistor is electrically connected to the first fixed potential end; a second electrode of the second switch transistor is electrically connected to the output clock line;

a gate of the first switch transistor and a gate of the second switch transistor are both electrically connected to the first refresh control end.

5. The display panel according to claim 2, wherein in the same one of shift register units, the fourth input end is electrically connected to the second node;

the scanning module comprises a first scanning unit and a second scanning unit;

an input end of the first scanning unit is electrically connected to the first fixed potential end; an output end of the first scanning unit is electrically connected to the scanning output end; a control end of the first scanning unit is electrically connected to the third input end;

an input end of the second scanning unit is electrically connected to the scanning clock end; an output end of the second scanning unit is electrically connected to the scanning output end; a control end of the second scanning unit is electrically connected to the fourth input end.

6. The display panel according to claim 1, wherein in the same one of shift register units, the fourth input end is electrically connected to the stage transmission output end;

the scanning module comprises a first scanning unit, a second scanning unit and a second refresh control end;

an input end of the first scanning unit is electrically connected to the first fixed potential end; an output end of the first scanning unit is electrically connected to the scanning output end; a control end of the first scanning unit is electrically connected to the third input end;

an input end of the second scanning unit is electrically connected to the scanning clock end; an output end of the second scanning unit is electrically connected to the scanning output end; a first control end of the second scanning unit is electrically connected to the fourth input end; a second control end of the second scanning unit is electrically connected to the second refresh control end.

7. The display panel according to claim 6, wherein in the same one of shift register units, a number of the stage transmission modules is equal to a number of the scanning modules; one of the stage transmission modules and one of the scanning modules constitute an output group;

a scanning clock end of the same one of output groups is electrically connected to the stage transmission clock end.

8. The display panel according to claim 5, wherein the first scanning unit comprises a first scanning transistor;
a gate of the first scanning transistor is electrically connected to the first node; a first electrode of the first scanning transistor is electrically connected to the first fixed potential end; a second electrode of the first scanning transistor is electrically connected to the scanning output end.

9. The display panel according to claim 6, wherein the second scanning unit comprises a refresh control transistor and a second scanning transistor;
a gate of the second scanning transistor is electrically connected to a second electrode of the refresh control transistor; a first electrode of the second scanning transistor is electrically connected to the scanning clock end; a second electrode of the second scanning transistor is electrically connected to the scanning output end; and
a first electrode of the refresh control transistor is electrically connected to the stage transmission output end; a gate of the refresh control transistor is electrically connected to the second refresh control end.

10. The display panel according to claim 9, wherein the second scanning unit further comprises an auxiliary transistor;
a first electrode of the auxiliary transistor is electrically connected to the stage transmission output end; a second electrode of the auxiliary transistor is electrically connected to a first electrode of the refresh control transistor; a gate of the auxiliary transistor is electrically connected to the scanning clock end.

11. The display panel according to claim 9, wherein the second scanning unit further comprises a pull-down transistor;
a gate of the pull-down transistor is electrically connected to the first node; a first electrode of the pull-down transistor is electrically connected to the first fixed potential end; a second electrode of the pull-down transistor is electrically connected to the gate of the second scanning transistor.

12. The display panel according to claim 1, wherein the stage transmission module comprises a first stage transmission unit and a second stage transmission unit;
an input end of the first stage transmission unit is electrically connected to the first fixed potential end; an output end of the first stage transmission unit is electrically connected to the stage transmission output end; a control end of the first stage transmission unit is electrically connected to the first input end; and
an input end of the second stage transmission unit is electrically connected to the stage transmission clock end; an output end of the second stage transmission unit is electrically connected to the stage transmission output end; a control end of the second stage transmission unit is electrically connected to the second input end.

13. The display panel according to claim 1, wherein the shift register unit comprises the stage transmission modules, a number of which is n, n is an integer greater than or equal to 2;
in the same one of shift register units, valid pulses of stage transmission clock signals received by the stage transmission clock ends of the respective stage transmission modules do not overlap, and within a clock cycle, the k-th one of stage transmission clock signals that jumps to the valid pulse is a k-th stage transmission clock signal; the stage transmission module that receives the k-th stage transmission clock signal is a k-th stage transmission module; k is a positive integer less than or equal to n;
the stage transmission output end of the n-th stage transmission module of the shift register unit at an s-th stage is electrically connected to the starting input end of the shift register unit at an s+1-th stage; s is a positive integer.

14. The display panel according to claim 1, wherein the driving control module comprises an input unit, a reset unit and an interlocking unit; the driving control module further comprises a reset clock end;
the input unit is electrically connected to the starting input end, the scanning control end and the second node each;
the reset unit is electrically connected to the scanning control end, the reset clock end, the first node and a second fixed potential end each;
the interlocking unit is electrically connected to the first node, the second node and the first fixed potential end each.

15. The display panel according to claim 1, wherein the driving control module comprises a scanning control unit and an enable control unit; the driving control module further comprises an enable clock end and a third node;
the scanning control unit is electrically connected to the starting input end, the scanning control end and the third node each; the scanning control unit is configured to receive a starting input signal of the starting input end and a scanning control signal of the scanning control end, and control a signal of the third node;
the enable control unit is electrically connected to the enable clock end, the third node, the second fixed potential end, the first node and the second node each; the enable control unit is configured to receive an enable clock signal of the enable clock end, a signal of the third node and a second fixed potential signal of the second fixed potential end, and control a signal of the first node and a signal of the second node.

16. The display panel according to claim 15, wherein the scanning control unit comprises a first scanning control transistor;
a gate of the first scanning control transistor is electrically connected to the scanning control end; a first electrode of the first scanning control transistor is electrically connected to the starting input end; a second electrode of the first scanning control transistor is electrically connected to the third node.

17. The display panel according to claim 15, wherein the enable control unit comprises a first enable transistor, a second enable transistor and a third enable transistor;
a gate of the first enable transistor is electrically connected to the enable clock end; a first electrode of the first enable transistor is electrically connected to the third node; a second electrode of the first enable transistor and a gate of the second enable transistor are electrically connected to the second node;
a first electrode of the second enable transistor is electrically connected to the enable clock end; a second electrode of the second enable transistor and a second electrode of the third enable transistor are electrically connected to the first node;

a gate of the third enable transistor is electrically connected to the enable clock end; a first electrode of the third enable transistor is electrically connected to the second fixed potential end.

18. The display panel according to claim 15, wherein the shift register unit comprises:
   the stage transmission modules, a number of which is n; and
   the scanning modules, a number of which is m;
   wherein n≤m;
   the stage transmission clock end of the shift register unit at an s-th stage is electrically connected to the enable clock end of the shift register unit at a p-th stage, s/p, and s and p are both positive integers.

19. The display panel according to claim 18, wherein n=1;
   the display panel further comprises a first shift clock line and a second shift clock line;
   the enable clock end of the shift register unit at a 2s-1-th stage is electrically connected to the first shift clock line, and the stage transmission clock end is electrically connected to the second shift clock line;
   the enable clock end of the shift register unit at a 2s-th stage is electrically connected to the second shift clock line, and the stage transmission clock end is electrically connected to the first shift clock line;
   wherein s is a positive integer.

20. The display panel according to claim 19, wherein the display panel further comprises m first output clock lines and m second output clock lines;
   the m scanning modules of the shift register unit at a 2s-1-th stage are electrically connected to the m first output clock lines respectively in a one-to-one correspondence;
   the m scanning modules of the shift register unit at a 2s-th stage are electrically connected to the m second output clock lines respectively in a one-to-one correspondence.

21. The display panel according to claim 1, wherein the driving circuit further comprises a global scanning unit;
   the global scanning unit is configured to control the first node of each of the shift register units to be at an inactive level, and to control signals of the stage transmission output end and the scanning output end of each of the shift register units to be at active levels under a control of a first global control signal.

22. The display panel according to claim 21, wherein the global scanning unit comprises a first scanning transistor, a second scanning transistor and a third scanning transistor;
   gates of the first scanning transistor, the second scanning transistor and the third scanning transistor all receive the first global control signal;
   a first electrode of the first scanning transistor is electrically connected to the first fixed potential end, and a second electrode of the first scanning transistor is electrically connected to the first node of each of the shift register units;
   a first electrode of the second scanning transistor is electrically connected to a second fixed potential end, and a second electrode of the second scanning transistor is electrically connected to the stage transmission output end of each of the shift register units;
   a first electrode of the third scanning transistor is electrically connected to the second fixed potential end, and a second electrode of the third scanning transistor is electrically connected to the scanning output end of each of the shift register units.

23. The display panel according to claim 1, wherein the driving circuit further comprises a global reset unit;
   the global reset unit is configured to control signals of the stage transmission output end and the scanning output end of each of the shift register units to be at inactive levels under a control of a second global control signal.

24. The display panel according to claim 23, wherein the global reset unit comprises a fourth scanning transistor and a fifth scanning transistor;
   gates of the fourth scanning transistor and the fifth scanning transistor both receive the second global control signal; first electrodes of the fourth scanning transistor and the fifth scanning transistor are both electrically connected to the first fixed potential end;
   a second electrode of the fourth scanning transistor is electrically connected to the stage transmission output end of each of the shift register units;
   a second electrode of the fifth scanning transistor is electrically connected to the scanning output end of each of the shift register units.

25. A method for driving a display panel, wherein the display panel comprises a driving circuit including a plurality of cascaded shift register units, each of which comprises a driving control module, at least one stage transmission module and at least one scanning module;
   the driving control module comprising at least a starting input end, a scanning control end, a first node and a second node;
   the stage transmission module comprising a first input end, a second input end, a first level end, a stage transmission clock end and a stage transmission output end; the first input end being electrically connected to the first node, the second input end being electrically connected to the second node; the first level end being electrically connected to a first fixed potential end; wherein the stage transmission output end of the shift register unit at an i-th stage is electrically connected to the starting input end of the shift register unit at a j-th stage, i≠j, and i and j are both positive integers; and
   the scanning module comprising a third input end, a fourth input end, a second level end, a scanning clock end and a scanning output end; the third input end being electrically connected to the first node; the second level end being electrically connected to the first fixed potential end;
   the display panel comprising a multi-frequency driving mode; at least a part of display frames of the multi-frequency driving mode being a first display frame including a refresh phase and a holding phase;
   the driving method comprising:
   in the refresh phase, controlling the stage transmission output ends and the scanning output ends of part of the shift register units to output valid pulses;
   in the holding phase, controlling the stage transmission output ends of part of the shift register units to output valid pulses, and the scanning output ends of the part of the shift register units to be at an inactive level.

26. The method according to claim 25, wherein in the first display frame, part of the shift register units are a first shift register unit, and part of the shift register units are a second shift register unit;
   in the refresh phase, the controlling the stage transmission output ends and the scanning output ends of part of the shift register units to output valid pulses comprises:
   in the refresh phase, controlling the stage transmission output ends and the scanning output ends of the first shift register units to be at inactive levels, and the stage transmission output ends and the scanning output ends of the second shift register units to output valid pulses;

in the holding phase, the controlling the stage transmission output ends of part of the shift register units to output valid pulses, and the scanning output ends of the part of the shift register units to be at inactive levels comprises:

in the holding phase, controlling the stage transmission output ends of the first shift register units to output valid pulses, the scanning output ends of the first shift register units to be at inactive levels, and the stage transmission output ends and the scanning output ends of the second shift register units to be at inactive levels.

27. The method according to claim 26, wherein part of the display frames of the multi-frequency driving mode is a second display frame; the multi-frequency driving mode comprises a plurality of driving cycles, each of which comprises the second display frame and the first display frame; in the same one of driving cycles, the second display frame is located before the first display frame;

the driving method further comprises:

in the second display frame, controlling the stage transmission output ends and the scanning output ends of the first shift register units to output valid pulses, and the stage transmission output ends and the scanning output ends of the second shift register units to output valid pulses.

28. The method according to claim 25, wherein in the refresh phase, the controlling the stage transmission output ends and the scanning output ends of part of the shift register units to output valid pulses comprises:

in the refresh phase, controlling the stage transmission clock signals at the stage transmission clock ends and scanning clock signals at the scanning clock ends of the shift register units to include valid pulses;

in the holding phase, the controlling the stage transmission output ends of part of the shift register units to output valid pulses, and the scanning output ends of the part of the shift register units to be at inactive levels comprises:

in the holding phase, controlling the stage transmission clock signals at the stage transmission clock ends of the shift register units to include valid pulses, and controlling the scanning clock signals at the scanning clock ends to be at inactive levels.

29. The method according to claim 25, wherein the scanning module comprises a second refresh control end;

in the refresh phase, the controlling the stage transmission output ends and the scanning output ends of part of the shift register units to output valid pulses comprises:

in the refresh phase, controlling the stage transmission clock signals at the stage transmission clock ends and the scanning clock signals at the scanning clock ends of the shift register units to include valid pulses, and the second refresh control ends to be at enable levels;

in the holding phase, the controlling the stage transmission output ends of part of the shift register units to output valid pulses, and the scanning output ends of part of the shift register units to be at inactive levels comprises:

in the holding phase, controlling the stage transmission clock signals at the stage transmission clock ends and the scanning clock signals at the scanning clock ends of the shift register units to include valid pulses, and the second refresh control ends to be at non-enable levels.

30. The method according to claim 25, wherein the shift register unit comprises the m scanning modules; m is an integer greater than or equal to 2;

in the refresh phase, the controlling the stage transmission output ends and the scanning output ends of part of the shift register units to output valid pulses comprises:

in the refresh phase, providing the stage transmission clock signal to the stage transmission clock end of the shift register unit, and providing m scanning clock signals to the m scanning clock ends of the shift register unit;

wherein in the refresh phase, valid pulses of a plurality of the scanning clock signals provided to the same one of shift register units do not overlap; in the same one of shift register units, valid pulses of the stage transmission clock signal provided to the stage transmission clock end overlaps valid pulses of at least one of the scanning clock signal.

31. The method according to claim 25, wherein the driving circuit further comprises a global reset unit;

the global reset unit is configured to control the signals of the stage transmission output end and the scanning output end of each of the shift register units to be at inactive levels under a control of the second global control signal;

the driving method further comprises:

in a phase between the refresh phase and the holding phase, controlling the second global control signal to jump to the active level.

32. The method according to claim 31, wherein the display panel further comprises a gesture detection circuit;

the first display frame further comprises a detection phase located between the refresh phase and the holding phase;

in a phase between the refresh phase and the holding phase, the controlling the second global control signal to jump to the active level comprises:

in the detection phase, controlling the gesture detection circuit to work, and controlling the stage transmission clock ends and the scanning clock ends of all shift register units to be at inactive levels, and the second global control signals to jump to the active level.

33. A display device, comprising the display panel comprising a driving circuit including a plurality of cascaded shift register units, each of which comprises a driving control module, at least one stage transmission module and at least one scanning module;

the driving control module comprising at least a starting input end, a scanning control end, a first node and a second node;

the stage transmission module comprising a first input end, a second input end, a first level end, a stage transmission clock end and a stage transmission output end; the first input end being electrically connected to the first node, the second input end being electrically connected to the second node; the first level end being electrically connected to a first fixed potential end; wherein the stage transmission output end of the shift register unit at an i-th stage is electrically connected to the starting input end of the shift register unit at a j-th stage, i≠j, and i and j are both positive integers; and the scanning module comprising a third input end, a fourth input end, a second level end, a scanning clock end and a scanning output end; the third input end being electrically connected to the first node; the second level end being electrically connected to the first fixed potential end.

* * * * *